(12) United States Patent
Magia et al.

(10) Patent No.: US 9,934,872 B2
(45) Date of Patent: Apr. 3, 2018

(54) ERASE STRESS AND DELTA ERASE LOOP COUNT METHODS FOR VARIOUS FAIL MODES IN NON-VOLATILE MEMORY

(71) Applicant: SANDISK TECHNOLOGIES LLC, Plano, TX (US)

(72) Inventors: Sagar Magia, Milpitas, CA (US); Jagdish Sabde, Fremont, CA (US); Jayavel Pachamuthu, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 716 days.

(21) Appl. No.: 14/528,711

(22) Filed: Oct. 30, 2014

(65) Prior Publication Data

US 2016/0125956 A1    May 5, 2016

(51) Int. Cl.
| | |
|---|---|
| G11C 29/00 | (2006.01) |
| G11C 29/52 | (2006.01) |
| G06F 3/06 | (2006.01) |
| G11C 16/34 | (2006.01) |
| G11C 29/06 | (2006.01) |

(Continued)

(52) U.S. Cl.
CPC .......... G11C 29/52 (2013.01); G06F 3/0619 (2013.01); G06F 3/0652 (2013.01); G06F 3/0679 (2013.01); G11C 16/349 (2013.01); G11C 29/06 (2013.01); G11C 29/42 (2013.01); G11C 29/50004 (2013.01); G11C 2029/0409 (2013.01)

(58) Field of Classification Search
CPC .... G06F 3/0652; G06F 3/0619; G06F 3/0679; G11C 29/52; G11C 29/06; G11C 29/42; G11C 29/50004; G11C 16/349; G11C 2029/0409

USPC .............. 714/718, 719, 721, 763, 773
See application file for complete search history.

(56) References Cited

U.S. PATENT DOCUMENTS

| | | |
|---|---|---|
| 3,710,348 A | 1/1973 | Craft |
| 3,895,364 A | 7/1975 | Cricchi et al. |

(Continued)

FOREIGN PATENT DOCUMENTS

| | | |
|---|---|---|
| CN | 1549133 | 11/2004 |
| CN | 101421797 A | 4/2009 |

(Continued)

OTHER PUBLICATIONS

"Numonyx Sector-Based Compact File System (SCFS) Software is a Feature-Rich Flash Solution," *Numonyx*, Nov. 3, 2009, 2 pages.

(Continued)

*Primary Examiner* — Albert Decady
*Assistant Examiner* — Osman M Alshack
(74) *Attorney, Agent, or Firm* — Foley & Lardner LLP

(57) ABSTRACT

Techniques are presented for using erase stress and variations in the loop count (number of cycles) for various fail modes in non-volatile memories, including erase disturb and shallow erase. For detection of shallow erase, cells are programmed and then erased, where the variation (delta) in the number of erase loop counts can be used to determine defective blocks. To determine blocks prone to erase disturb, an erase stress is applied to unselected blocks, after which they are programmed: after then erasing one block, the next block can then be read to determine whether it has suffered erase disturb.

26 Claims, 47 Drawing Sheets

(51) Int. Cl.
*G11C 29/42* (2006.01)
*G11C 29/50* (2006.01)
*G11C 29/04* (2006.01)

(56) References Cited

U.S. PATENT DOCUMENTS

| | | | |
|---|---|---|---|
| 4,357,685 A | 11/1982 | Daniele et al. | |
| 4,426,688 A | 1/1984 | Moxley | |
| 4,720,815 A | 1/1988 | Ogawa | |
| 4,757,477 A | 7/1988 | Nagayama et al. | |
| 5,070,032 A | 12/1991 | Yuan et al. | |
| 5,095,344 A | 3/1992 | Harari | |
| 5,172,338 A | 12/1992 | Mehrotra et al. | |
| 5,200,959 A | 4/1993 | Gross et al. | |
| 5,270,979 A | 12/1993 | Harari et al. | |
| 5,313,421 A | 5/1994 | Guterman et al. | |
| 5,315,541 A | 5/1994 | Harari et al. | |
| 5,343,063 A | 8/1994 | Yuan et al. | |
| 5,380,672 A | 1/1995 | Yuan et al. | |
| 5,386,390 A | 1/1995 | Okitaka | |
| 5,418,752 A | 5/1995 | Harari et al. | |
| 5,428,621 A | 6/1995 | Mehrotra et al. | |
| 5,430,679 A | 7/1995 | Hiltebeitel et al. | |
| 5,430,859 A | 7/1995 | Norman et al. | |
| 5,442,748 A | 8/1995 | Chang et al. | |
| 5,479,370 A | 12/1995 | Furuyama et al. | |
| 5,485,425 A | 1/1996 | Iwai et al. | |
| 5,570,315 A | 10/1996 | Tanaka et al. | |
| 5,595,924 A | 1/1997 | Yuan et al. | |
| 5,602,987 A | 2/1997 | Harari et al. | |
| 5,642,312 A | 6/1997 | Harari | |
| 5,657,332 A | 8/1997 | Auclair et al. | |
| 5,661,053 A | 8/1997 | Yuan | |
| 5,663,901 A | 9/1997 | Wallace et al. | |
| 5,699,300 A | 12/1997 | Akamatsu et al. | |
| 5,712,180 A | 1/1998 | Guterman et al. | |
| 5,768,192 A | 6/1998 | Eitan | |
| 5,774,397 A | 6/1998 | Endoh et al. | |
| 5,783,958 A | 7/1998 | Lysinger | |
| 5,822,245 A | 10/1998 | Gupta et al. | |
| 5,848,009 A | 12/1998 | Lee et al. | |
| 5,862,080 A | 1/1999 | Harari et al. | |
| 5,890,192 A | 3/1999 | Lee et al. | |
| 5,903,495 A | 5/1999 | Takeuchi et al. | |
| 5,930,167 A | 7/1999 | Lee | |
| 5,936,971 A | 8/1999 | Harari et al. | |
| 6,011,725 A | 1/2000 | Eitan | |
| 6,021,463 A | 2/2000 | Belser | |
| 6,038,167 A | 3/2000 | Miwa et al. | |
| 6,038,184 A | 3/2000 | Naritake | |
| 6,046,935 A | 4/2000 | Takeuchi et al. | |
| 6,064,596 A * | 5/2000 | Choi | G11C 16/3445 365/185.22 |
| 6,091,666 A | 7/2000 | Arase et al. | |
| 6,134,148 A | 10/2000 | Kawahara et al. | |
| 6,151,248 A | 11/2000 | Harari et al. | |
| 6,222,762 B1 | 4/2001 | Guterman et al. | |
| 6,230,233 B1 | 5/2001 | Lofgren et al. | |
| 6,252,800 B1 | 6/2001 | Chida | |
| 6,266,273 B1 | 7/2001 | Conley et al. | |
| 6,282,624 B1 | 8/2001 | Kimura et al. | |
| 6,353,553 B1 | 3/2002 | Tamada et al. | |
| 6,426,893 B1 | 7/2002 | Conley et al. | |
| 6,456,528 B1 | 9/2002 | Chen | |
| 6,480,423 B2 | 11/2002 | Toda et al. | |
| 6,510,488 B2 | 1/2003 | Lasser | |
| 6,512,263 B1 | 1/2003 | Yuan et al. | |
| 6,522,580 B2 | 2/2003 | Chen et al. | |
| 6,523,132 B1 | 2/2003 | Harari et al. | |
| 6,560,146 B2 | 5/2003 | Cernea | |
| 6,581,142 B1 | 6/2003 | Jacobs | |
| 6,594,177 B2 | 7/2003 | Matarrese et al. | |
| 6,657,891 B1 | 12/2003 | Shibata et al. | |
| 6,771,536 B2 | 8/2004 | Li et al. | |
| 6,813,184 B2 | 11/2004 | Lee | |
| 6,850,439 B1 * | 2/2005 | Tanaka | G11C 16/16 365/185.11 |
| 6,853,596 B2 | 2/2005 | Cheung | |
| 6,870,768 B2 | 3/2005 | Cernea et al. | |
| 6,967,873 B2 | 11/2005 | Hamilton et al. | |
| 6,990,018 B2 | 1/2006 | Tanaka et al. | |
| 6,996,017 B2 | 2/2006 | Scheuerlein et al. | |
| 7,027,330 B2 | 4/2006 | Park | |
| 7,039,781 B2 | 5/2006 | Iwata et al. | |
| 7,057,939 B2 | 6/2006 | Li et al. | |
| 7,058,818 B2 | 6/2006 | Daniel | |
| 7,076,611 B2 | 7/2006 | Steere et al. | |
| 7,110,294 B2 | 9/2006 | Kawai | |
| 7,158,421 B2 | 1/2007 | Li et al. | |
| 7,170,802 B2 | 1/2007 | Cernea et al. | |
| 7,206,230 B2 | 4/2007 | Li et al. | |
| 7,224,605 B1 | 5/2007 | Moogat | |
| 7,257,689 B1 | 8/2007 | Baird | |
| 7,299,314 B2 | 11/2007 | Lin et al. | |
| 7,310,347 B2 | 12/2007 | Lasser | |
| 7,345,928 B2 | 3/2008 | Li | |
| 7,405,985 B2 | 7/2008 | Cernea et al. | |
| 7,411,846 B2 | 8/2008 | Terzioglu | |
| 7,420,847 B2 | 9/2008 | Li | |
| 7,426,623 B2 | 9/2008 | Lasser | |
| 7,447,070 B2 | 11/2008 | Cernea | |
| 7,490,283 B2 | 2/2009 | Gorobets et al. | |
| 7,493,457 B2 | 2/2009 | Murin | |
| 7,502,254 B2 | 3/2009 | Murin et al. | |
| 7,502,259 B2 | 3/2009 | Gorobets | |
| 7,961,512 B2 | 6/2011 | Li et al. | |
| 7,986,554 B2 | 7/2011 | Li | |
| 8,027,195 B2 | 9/2011 | Li et al. | |
| 8,040,744 B2 | 10/2011 | Gorobets et al. | |
| 8,054,684 B2 | 11/2011 | Gorobets et al. | |
| 8,094,500 B2 | 1/2012 | Paley et al. | |
| 8,144,512 B2 | 3/2012 | Huang et al. | |
| 8,244,960 B2 | 8/2012 | Paley et al. | |
| 8,566,671 B1 | 10/2013 | Ye et al. | |
| 8,700,840 B2 | 4/2014 | Paley et al. | |
| 8,726,104 B2 | 5/2014 | Sharon | |
| 8,730,722 B2 | 5/2014 | Koh | |
| 8,853,765 B2 | 10/2014 | Lee | |
| 2001/0000023 A1 | 3/2001 | Kawahara et al. | |
| 2002/0118574 A1 | 8/2002 | Gongwer et al. | |
| 2003/0099132 A1 | 5/2003 | Ooishi et al. | |
| 2003/0182317 A1 | 9/2003 | Kahn et al. | |
| 2003/0223274 A1 | 12/2003 | Cernea | |
| 2004/0060031 A1 | 3/2004 | Cernea | |
| 2004/0109357 A1 | 6/2004 | Cernea et al. | |
| 2004/0177212 A1 * | 9/2004 | Chang | G06F 12/0246 711/103 |
| 2005/0073884 A1 | 4/2005 | Gonzalez et al. | |
| 2005/0141387 A1 | 6/2005 | Cernea et al. | |
| 2005/0144360 A1 | 6/2005 | Bennett et al. | |
| 2005/0144365 A1 | 6/2005 | Gorobets et al. | |
| 2005/0213393 A1 | 9/2005 | Lasser | |
| 2006/0114726 A1 | 6/2006 | Kozakai et al. | |
| 2006/0126390 A1 | 6/2006 | Gorobets | |
| 2006/0136656 A1 | 6/2006 | Conley et al. | |
| 2006/0161728 A1 | 7/2006 | Bennett et al. | |
| 2007/0061502 A1 | 3/2007 | Lasser | |
| 2007/0065119 A1 | 3/2007 | Pomerantz | |
| 2007/0091677 A1 | 4/2007 | Lasser et al. | |
| 2007/0103977 A1 | 5/2007 | Conley et al. | |
| 2007/0159652 A1 | 7/2007 | Sato | |
| 2007/0180346 A1 | 8/2007 | Murin | |
| 2007/0186032 A1 | 8/2007 | Sinclair et al. | |
| 2007/0211530 A1 | 9/2007 | Nakano | |
| 2007/0220197 A1 | 9/2007 | Lasser | |
| 2007/0220935 A1 | 9/2007 | Cernea | |
| 2007/0237006 A1 | 10/2007 | Murin et al. | |
| 2007/0260808 A1 | 11/2007 | Raines et al. | |
| 2007/0268745 A1 | 11/2007 | Lasser | |
| 2007/0283081 A1 | 12/2007 | Lasser | |
| 2007/0285980 A1 | 12/2007 | Shimuzu et al. | |
| 2008/0002467 A1 | 1/2008 | Tsuji | |
| 2008/0082736 A1 | 4/2008 | Chow et al. | |
| 2008/0104309 A1 | 5/2008 | Cheon et al. | |

(56) References Cited

U.S. PATENT DOCUMENTS

| | | |
|---|---|---|
| 2008/0104312 A1 | 5/2008 | Lasser |
| 2008/0112238 A1 | 5/2008 | Kim et al. |
| 2008/0147996 A1 | 6/2008 | Jenkins et al. |
| 2008/0159012 A1 | 7/2008 | Kim |
| 2008/0181000 A1 | 7/2008 | Lasser |
| 2008/0209112 A1 | 8/2008 | Yu et al. |
| 2008/0244338 A1 | 10/2008 | Mokhlesi et al. |
| 2008/0244367 A1 | 10/2008 | Chin et al. |
| 2008/0250220 A1 | 10/2008 | Ito |
| 2008/0250300 A1 | 10/2008 | Mokhlesi et al. |
| 2008/0279005 A1 | 11/2008 | France |
| 2008/0294814 A1 | 11/2008 | Gorobets |
| 2008/0301532 A1 | 12/2008 | Uchikawa et al. |
| 2008/0307192 A1 | 12/2008 | Sinclair et al. |
| 2008/0310224 A1 | 12/2008 | Roohparvar et al. |
| 2009/0055680 A1* | 2/2009 | Honda ............... G06F 11/1068 714/5.1 |
| 2009/0067244 A1 | 3/2009 | Li et al. |
| 2009/0089481 A1 | 4/2009 | Kapoor et al. |
| 2009/0089482 A1 | 4/2009 | Traister |
| 2009/0089520 A1 | 4/2009 | Saha et al. |
| 2009/0094482 A1 | 4/2009 | Zilberman |
| 2009/0172247 A1 | 7/2009 | Bar-Or et al. |
| 2009/0172498 A1 | 7/2009 | Schlick et al. |
| 2009/0310408 A1 | 12/2009 | Lee et al. |
| 2010/0037012 A1 | 2/2010 | Yana et al. |
| 2010/0107004 A1 | 4/2010 | Bottelli et al. |
| 2010/0115186 A1* | 5/2010 | Chang ................ G06F 12/0246 711/103 |
| 2010/0157641 A1 | 6/2010 | Shalvi et al. |
| 2010/0172179 A1 | 7/2010 | Gorobets et al. |
| 2010/0172180 A1 | 7/2010 | Paley et al. |
| 2010/0174845 A1 | 7/2010 | Gorobets et al. |
| 2010/0174846 A1 | 7/2010 | Paley et al. |
| 2010/0174847 A1 | 7/2010 | Paley et al. |
| 2010/0174852 A1* | 7/2010 | Chien ................ G06F 12/0246 711/103 |
| 2010/0287217 A1 | 11/2010 | Borchers et al. |
| 2010/0325351 A1 | 12/2010 | Bennett |
| 2010/0329007 A1 | 12/2010 | Chibvongodze et al. |
| 2011/0063909 A1 | 3/2011 | Komatsu |
| 2011/0096601 A1 | 4/2011 | Gavens et al. |
| 2011/0099460 A1 | 4/2011 | Dusija et al. |
| 2011/0119430 A1* | 5/2011 | Lai ..................... G06F 12/0246 711/103 |
| 2011/0138109 A1* | 6/2011 | Liu ..................... G06F 12/0246 711/103 |
| 2011/0153913 A1 | 6/2011 | Huang et al. |
| 2011/0246705 A1* | 10/2011 | Mudama ............ G11C 16/3495 711/103 |
| 2012/0008384 A1 | 1/2012 | Li et al. |
| 2012/0008405 A1 | 1/2012 | Shah et al. |
| 2012/0008410 A1 | 1/2012 | Huynh et al. |
| 2012/0281479 A1 | 11/2012 | Kochar et al. |
| 2013/0031429 A1 | 1/2013 | Sharon et al. |
| 2013/0031431 A1 | 1/2013 | Sharon et al. |
| 2013/0229868 A1 | 9/2013 | Koh et al. |
| 2014/0085985 A1 | 3/2014 | Pan et al. |
| 2014/0173268 A1* | 6/2014 | Hashimoto ......... G06F 11/0754 713/2 |
| 2014/0204678 A1* | 7/2014 | Mu ...................... G11C 16/10 365/185.19 |
| 2014/0289559 A1 | 9/2014 | Hashimoto |
| 2015/0003150 A1* | 1/2015 | Aritome ............. G11C 16/3427 365/185.02 |

FOREIGN PATENT DOCUMENTS

| | | |
|---|---|---|
| JP | 61292747 A | 12/1986 |
| JP | 01128297 | 5/1989 |
| JP | 06150666 A | 5/1994 |
| WO | WO 1998/044420 | 10/1998 |
| WO | WO 00/49488 | 8/2000 |
| WO | WO 03/025939 A2 | 3/2003 |
| WO | WO 2006/064318 | 6/2006 |
| WO | WO 2007/141783 | 12/2007 |

OTHER PUBLICATIONS

"SanDisk, Toshiba Develop 32-Nanometer NAND Flash Technology," *SanDisk Corporation and Toshiba Corporation*, Feb. 11, 2009, www.physorg.com/news153597019.html, 9 pages.

Chang et al., "Real-Time Garbage Collection for Flash-Memory Storage Systems of Real-Time Embedded Systems," Nov. 2004, ACM, ACM Transactions on Embedded Computing Systems, vol. 3, pp. 837-863.

Choudhuri et al., "Performance Improvement of Block Based NAND Flash Translation Layer," CODES + ISSS '07, Salzburg, Austria, Sep. 2007, pp. 257-262.

Eitan et al., "NROM: A Novel Localized Trapping, 2-Bit Nonvolatile Memory Cell," *IEEE Electron Device Letters*, vol. 21, No. 11, Nov. 2000, pp. 543-545.

Im et al., "Storage Architecture and Software Support for SLC/MLC Combined Flash Memory," Mar. 2009, ACM, SAC'09, pp. 1664-1669.

Kang et al., "A Superblock-Based Flash Translation Layer for NAND Flash Memory," EMSOFT'06, Oct. 2006, pp. 161-170.

Lee et al., "Block Recycling Schemes and Their Cost-Based Optimization in NAND Flash Memory Based Storage System," Oct. 2007, ACM., EMSOFT '07, pp. 174-182.

Raz et al., "Implementing MLC NAND Flash for Cost-Effective, High-Capacity Memory," Sep. 2003., M-Systems, 13 pages.

* cited by examiner

Programming into four states represented by a 2-bit code

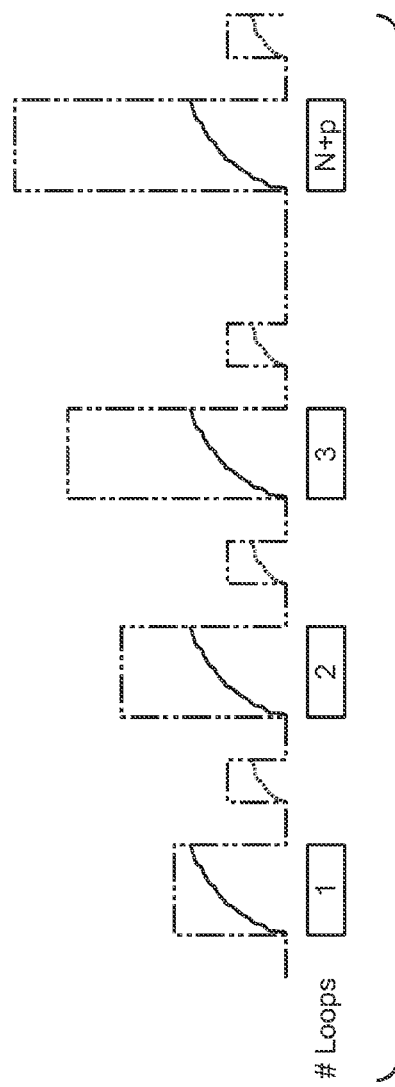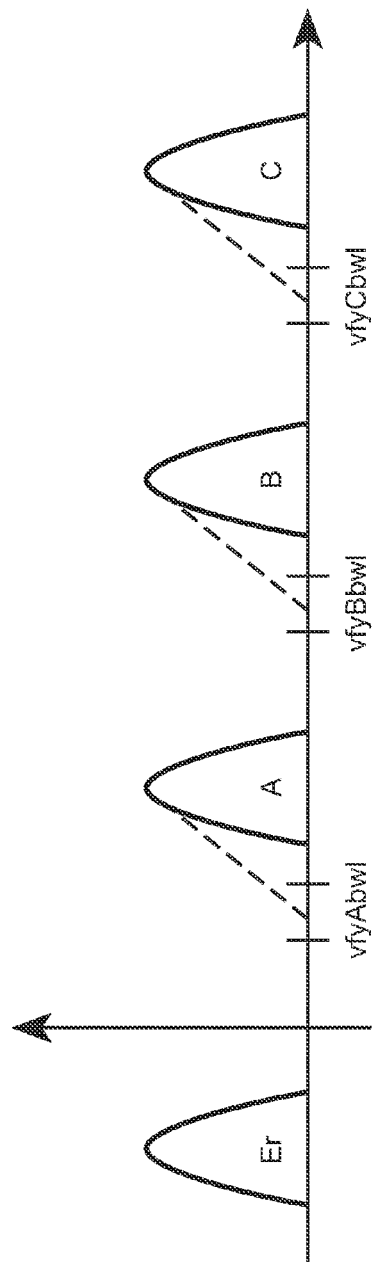

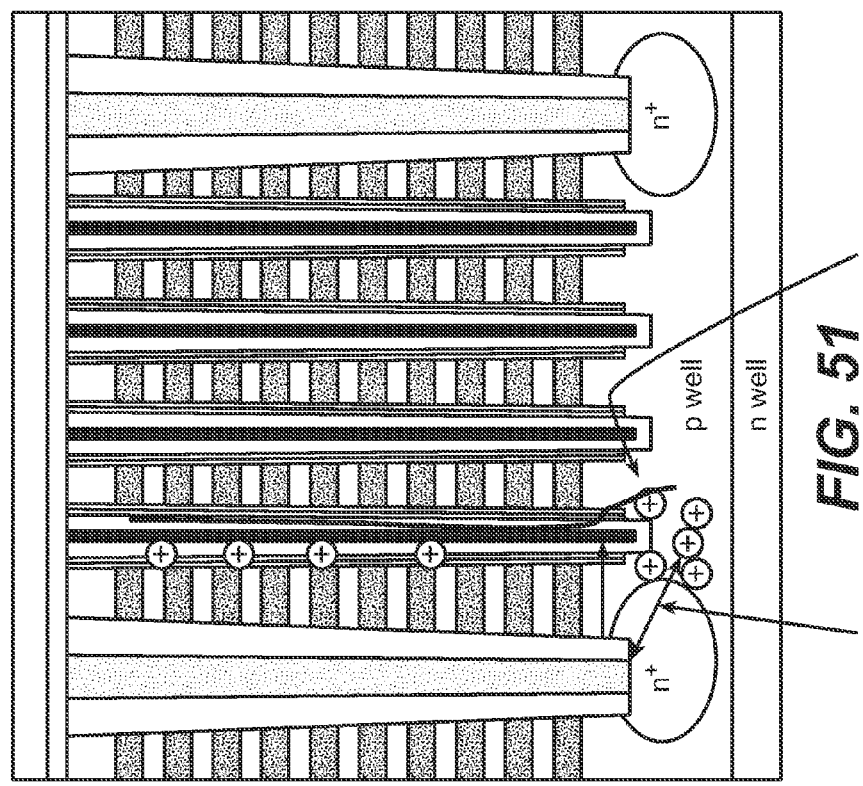

ERASE STRESS AND DELTA ERASE LOOP COUNT METHODS FOR VARIOUS FAIL MODES IN NON-VOLATILE MEMORY

BACKGROUND

This application relates to the operation of re-programmable non-volatile memory systems such as semiconductor flash memory that record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. For example, a nonvolatile memory cell may have a trapping dielectric sandwiched between two silicon dioxide layers. Multi-state data storage is implemented by separately reading the binary states of the spatially separated charge storage regions within the dielectric.

SUMMARY

A method of determining defects in a non-volatile flash memory circuit includes programming memory cells of a first plurality of blocks of an array of the non-volatile flash memory circuit and subsequently performing an erase operation on the first plurality of blocks, where the erase operation includes an alternating series of erase pulses and erase verify operations. For each the first plurality of blocks, a count is maintained of the number erase pulses required for the corresponding block to verify as erased in the erase operation. An average erase count is determined from the counts of a second plurality of blocks from the first plurality of blocks. A defect determination operation is performed on a first block of the first plurality of blocks, including: comparing the count for first block to the average erase count; and in response to the count for the first block exceeding the average erase count by a first number of counts, marking the first block as defective.

A further method of determining defects in a non-volatile flash memory circuit includes performing a stress operation on a group of one or more blocks of an array of the non-volatile flash memory circuit and, subsequent to the stress operation, performing a defect determination operation. The stress operation includes: with the group of blocks unselected, applying an erase stress voltage to the group of blocks; and subsequently programming the group of blocks. The defect determination operation includes: performing an erase operation on a first block of the group; subsequently reading a second, distinct block of the group; determining whether the quality of the data as read from the second block is degraded; and in response to determining that the data as read from the second block is degraded, marking the second block as defective.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 38 and 39 represent a program/verify waveform, how a broken word line responds, and effect on the distribution of programmed cells.

FIG. 51 illustrates erase disturb related to shallow erase.

DETAILED DESCRIPTION

Memory System

Figure 1:
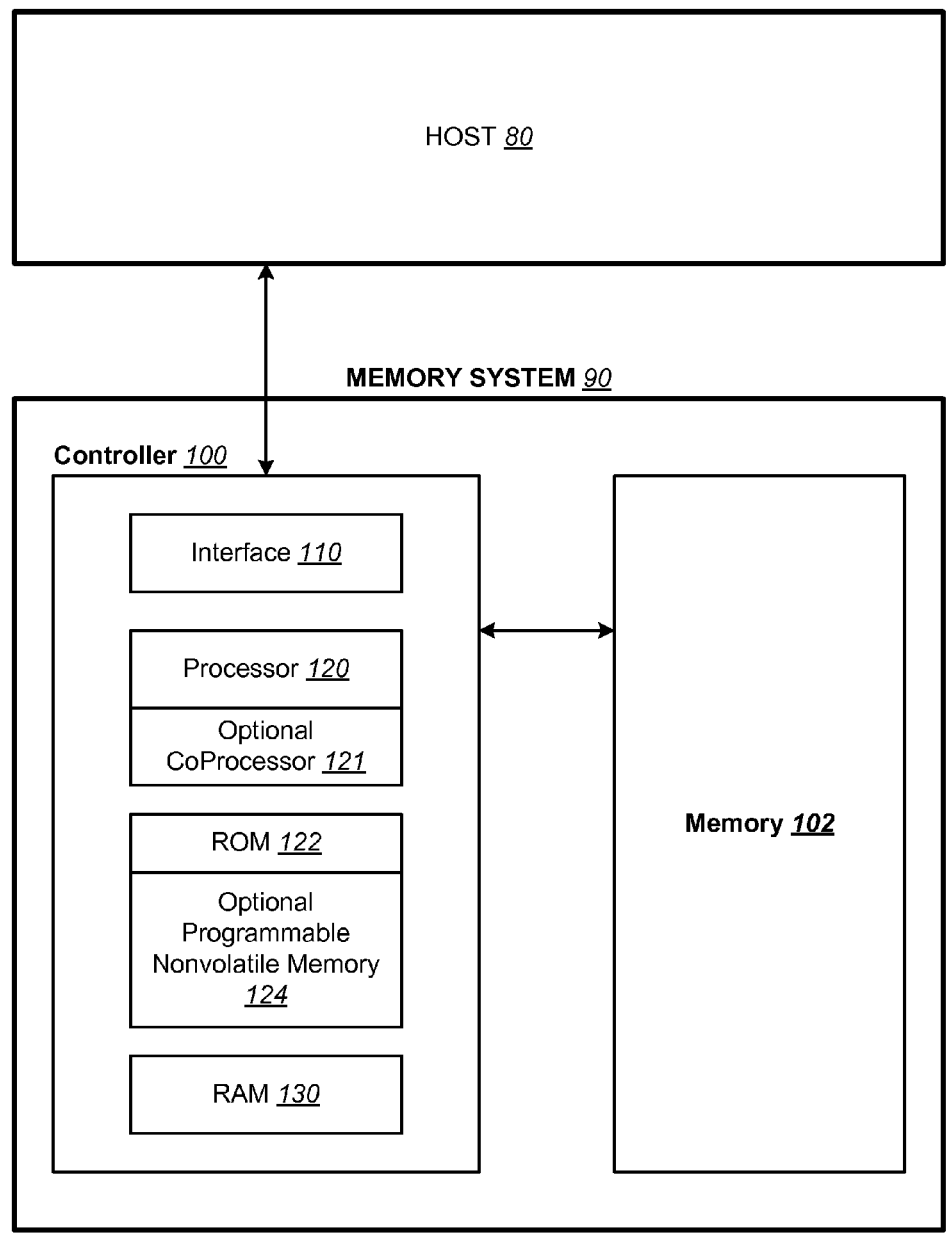
FIG. 1 illustrates schematically the main hardware components of a memory system suitable for implementing various aspects described in the following.

FIG. 1 illustrates schematically the main hardware components of a memory system suitable for implementing the following. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 2:
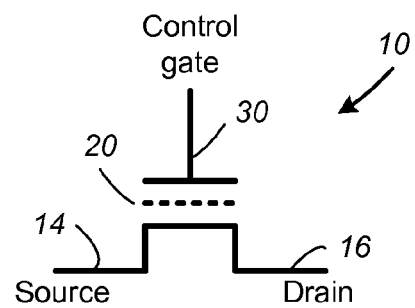
FIG. 2 illustrates schematically a non-volatile memory cell.

It will be recognized that the following is not limited to the two dimensional and three dimensional exemplary structures described but cover all relevant memory structures within the spirit and scope as described herein Physical Memory Structure FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
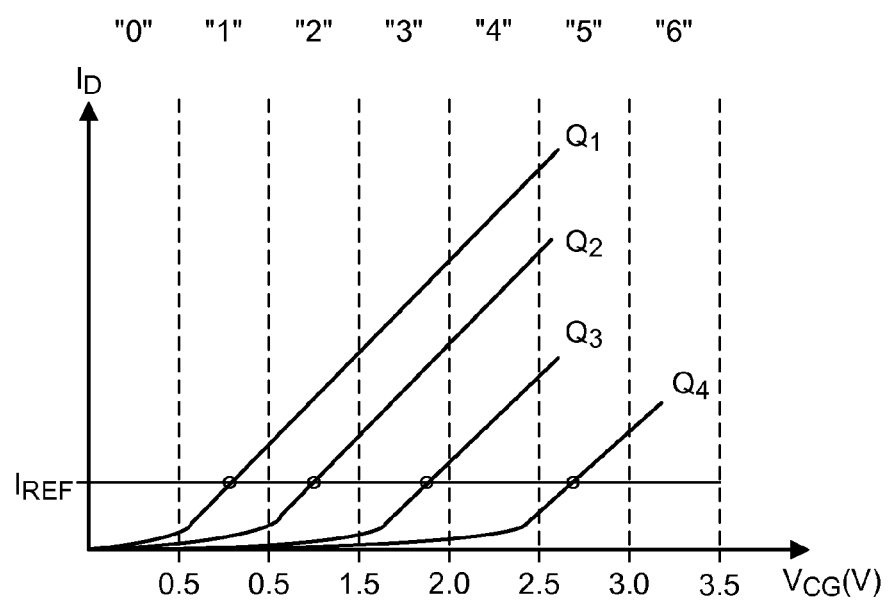
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
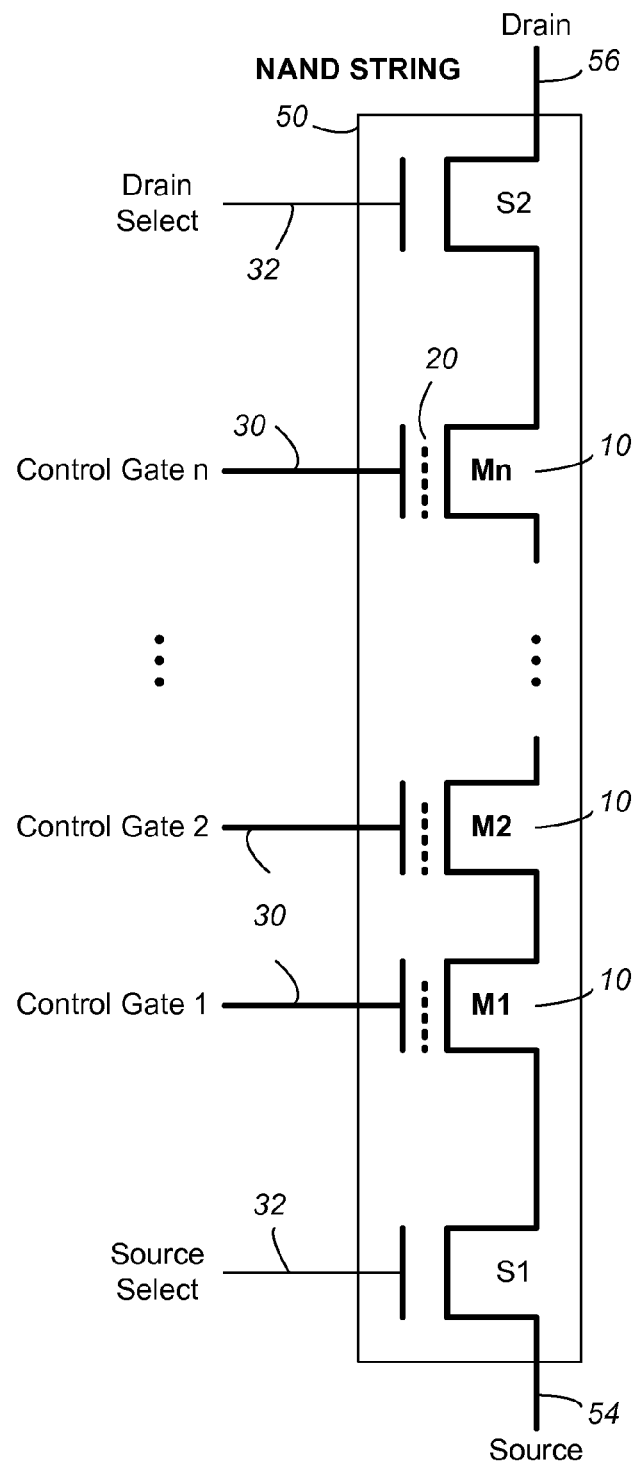
FIG. 4 illustrates schematically a string of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 5:
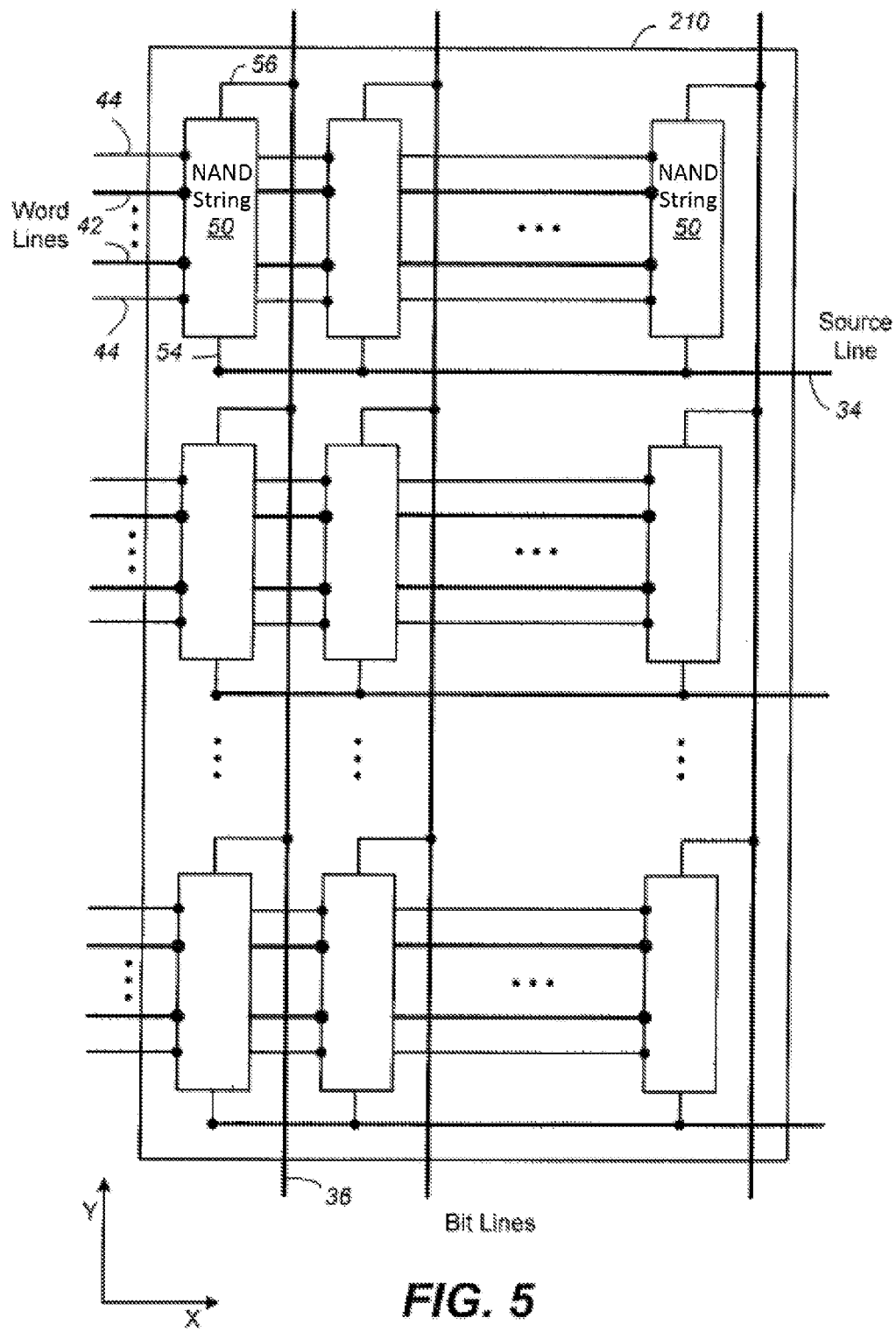
FIG. 5 illustrates an example of a NAND array 210 of memory cells, constituted from NAND strings 50 such as that shown in FIG. 4.

FIG. 5 illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 6:
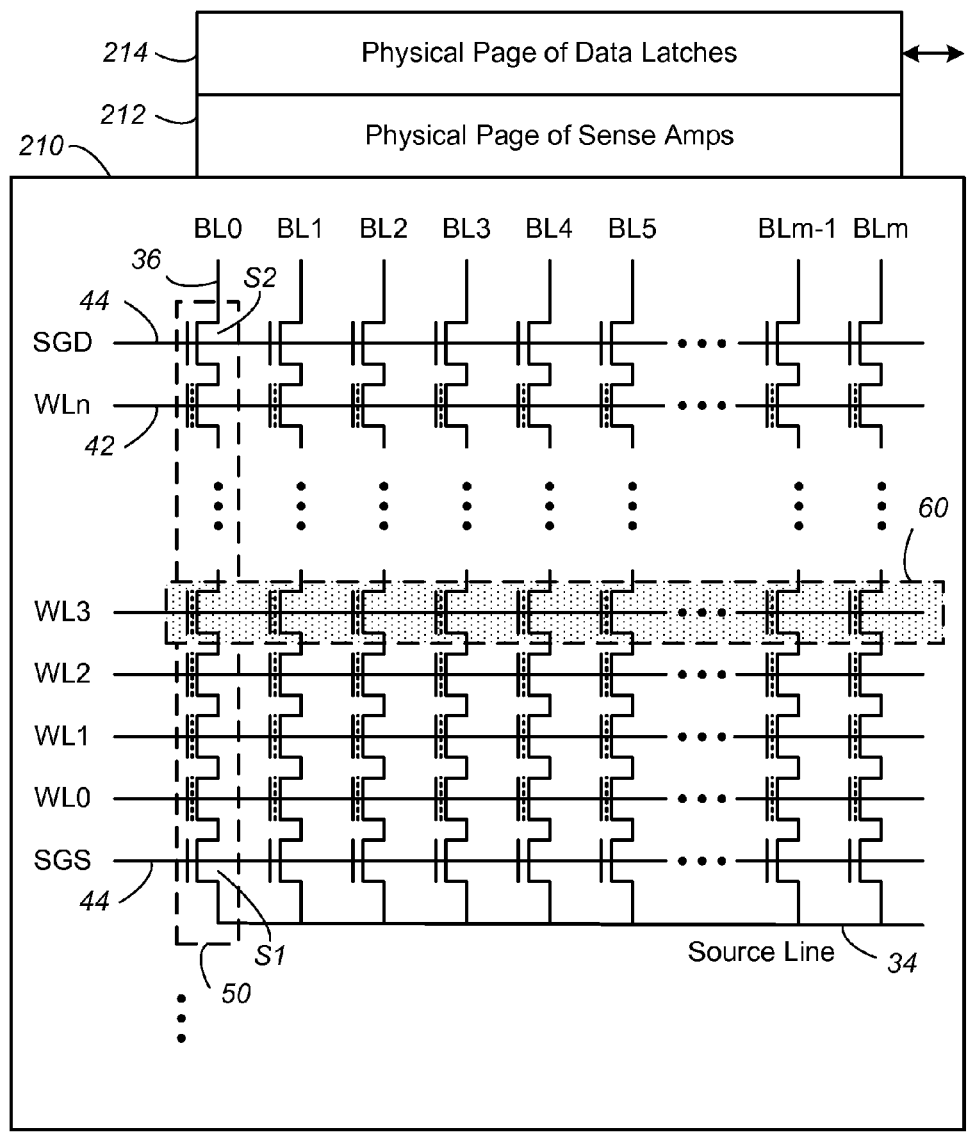
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
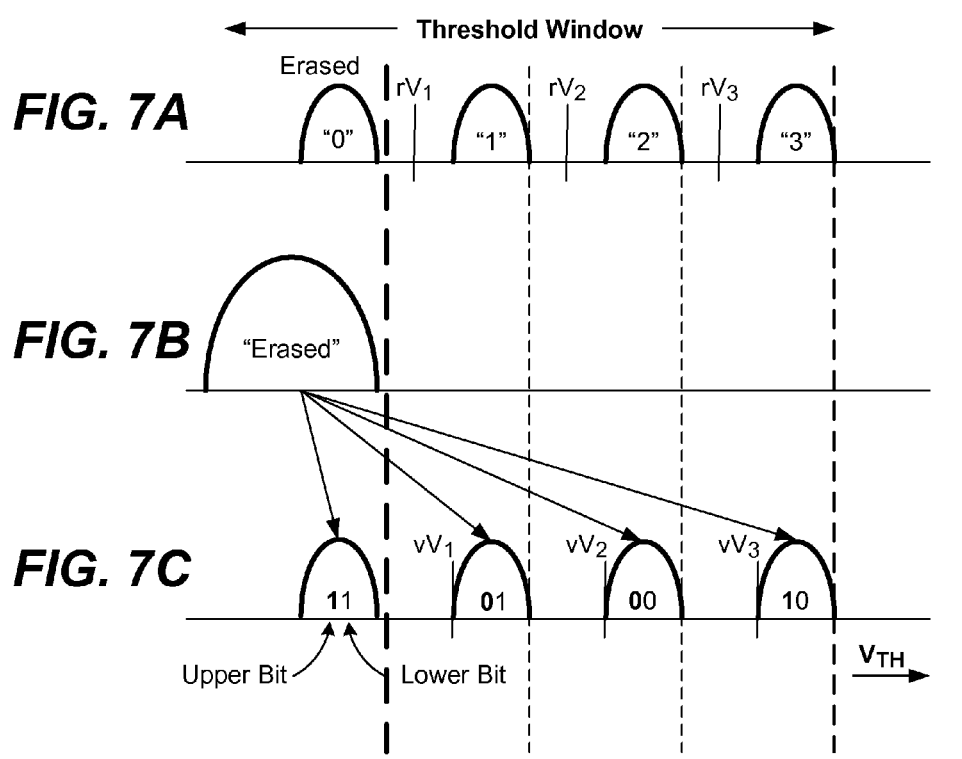
FIGS. 7A-7C illustrate an example of programming a population of memory cells.

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 8:
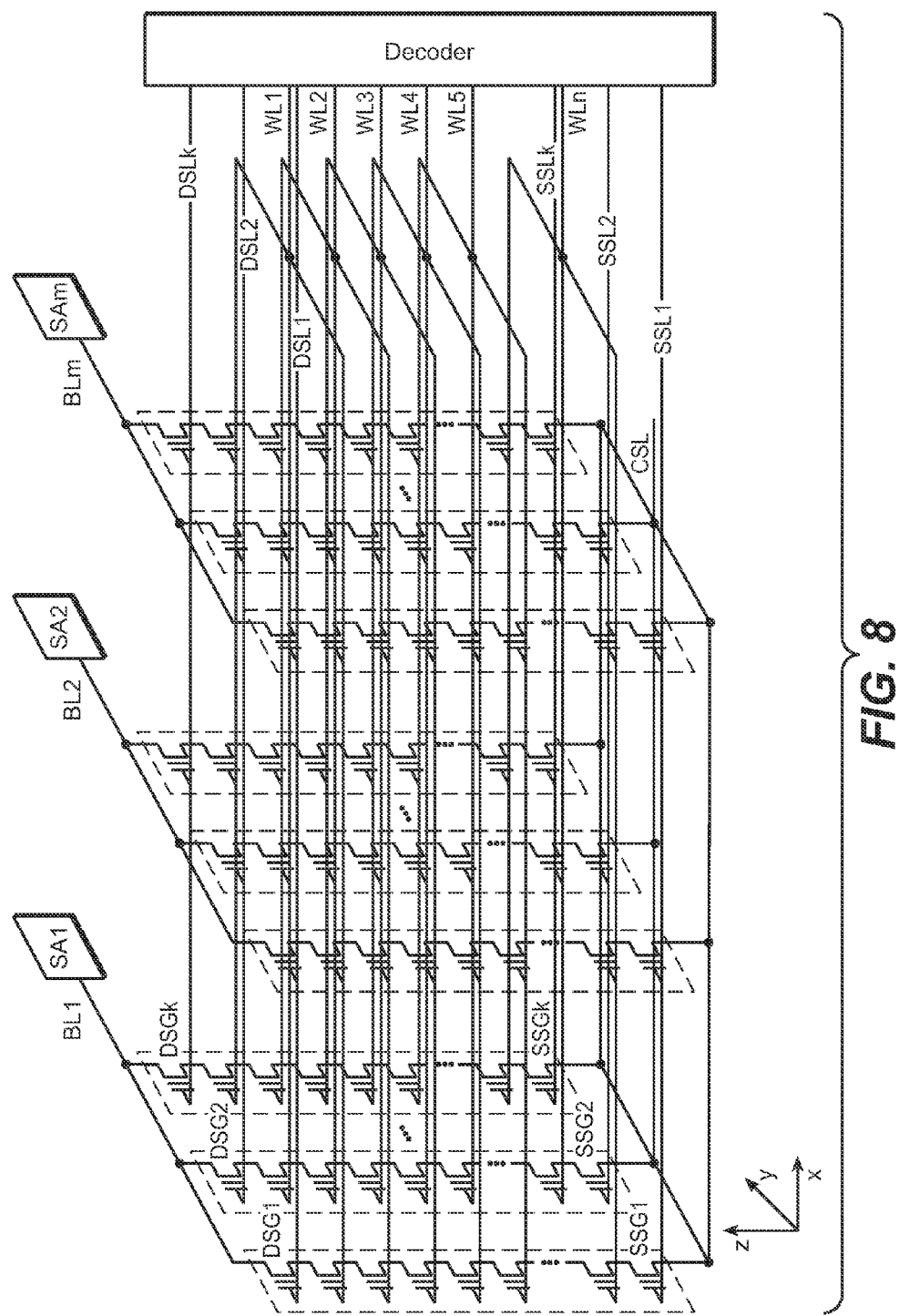
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-$m$, each run across the top to an associated sense amp SA1-$m$. The word lines, WL1-$n$, and source and select lines SSL1-$n$ and DSL1-$n$, then run in x direction, with the NAND string connected at bottom to a common source line CSL.

Figure 9:
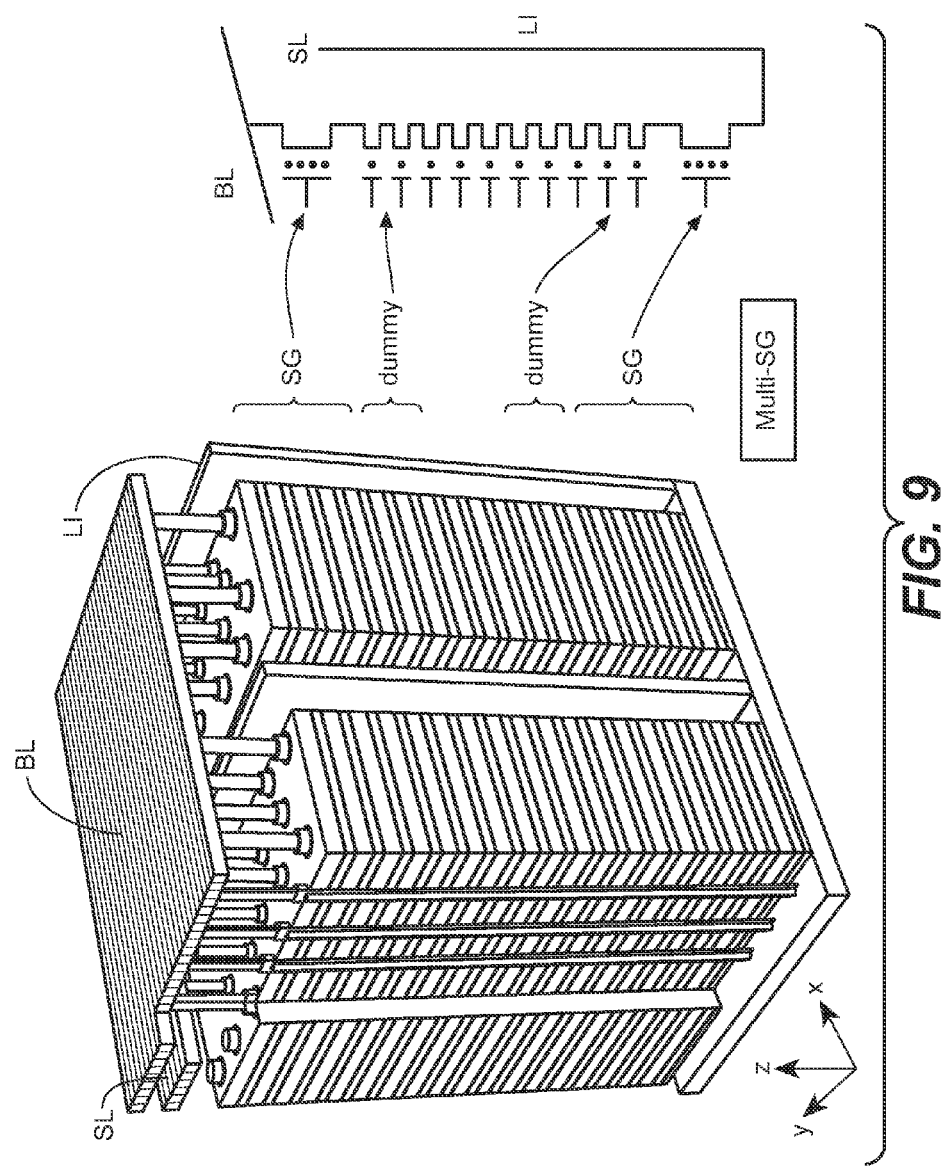
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series (as described in U.S. patent application Ser. No. 13/925,662, filed on Jun. 24, 2013), making for more uniform processing of layers. Additionally, the select gates are programmable to have their threshold levels adjusted. This exemplary embodiment also includes several dummy cells at the ends that are not used to store user data, as their proximity to the select gates makes them more prone to disturbs.

Figure 10:
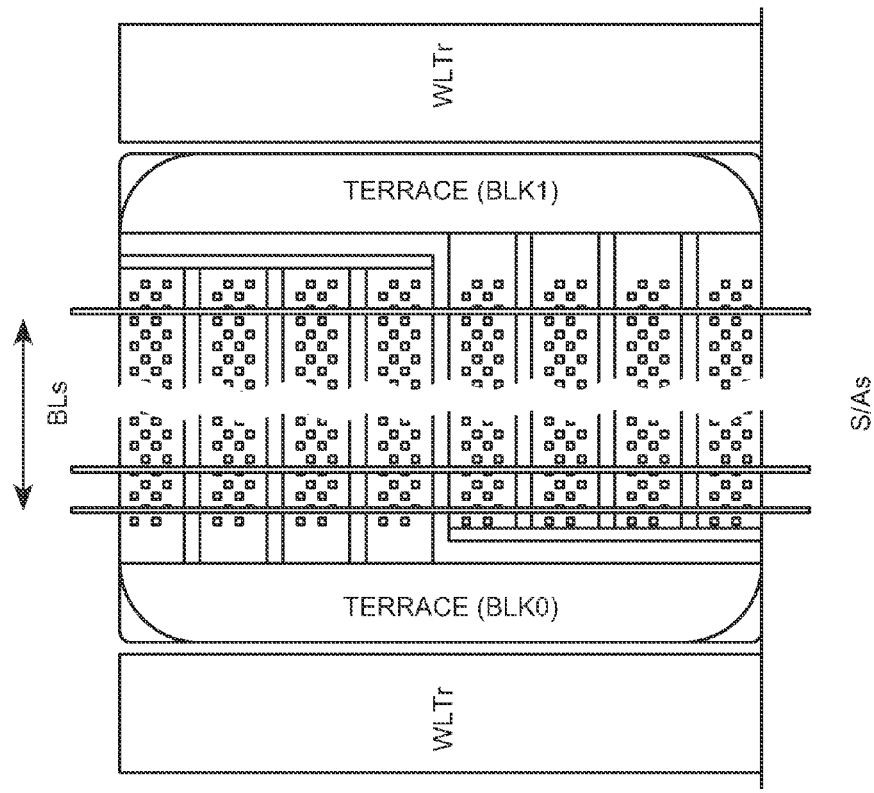

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
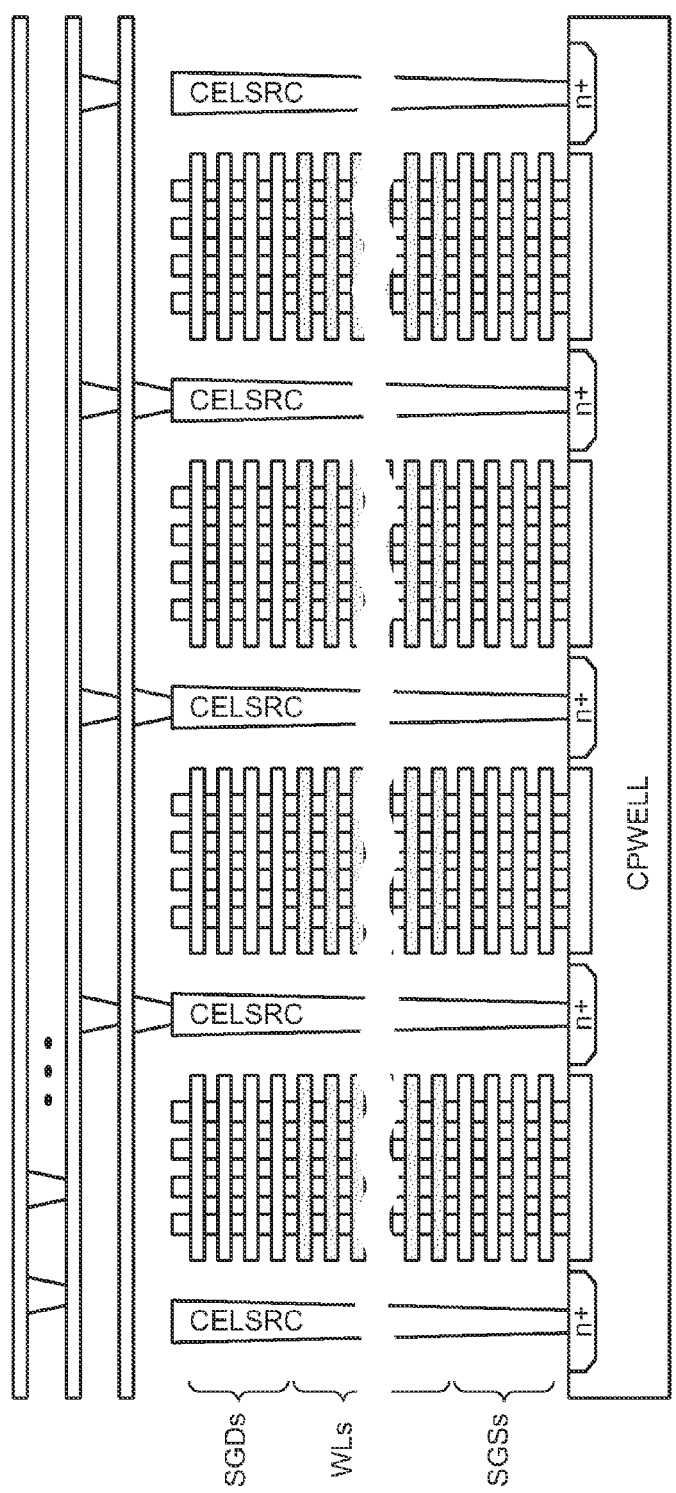

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
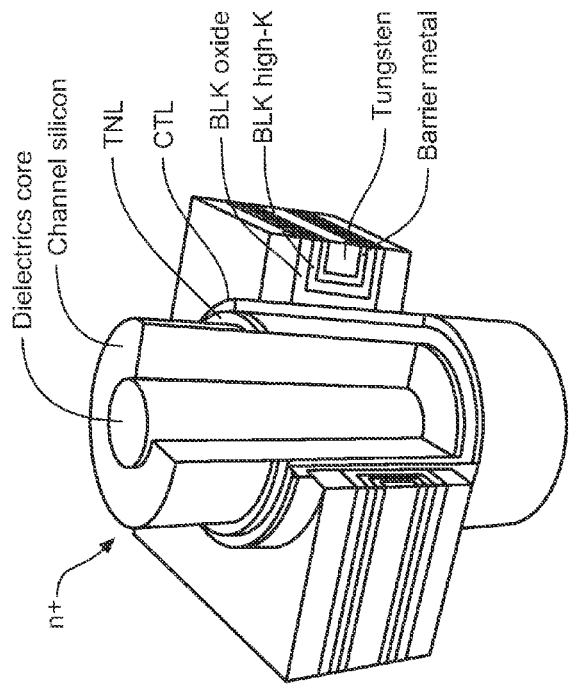

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Array Structure Defects

Memory arrays such as those described above are often subject to various defects, such as broken or leaky word lines and bit lines. A number of techniques for the determining of, and the dealing with, these sorts of problems are presented in the following US patent publications: 2012-0008405; 2012-0008384; 2012-0008410; 2012-0281479; 2013-0031429; 2013-0031429; and 2013-0229868. The following present a number of additional techniques in the context of the sort of 3D memory structures described above with respect to FIGS. 9-12. Although these techniques are particularly applicable to such structures, many of them are more generally applicable, such as to 2D NAND and other array structures.

Word Line to Word Line Shorts, Same Block: AC Stress Mode

Figure 13:
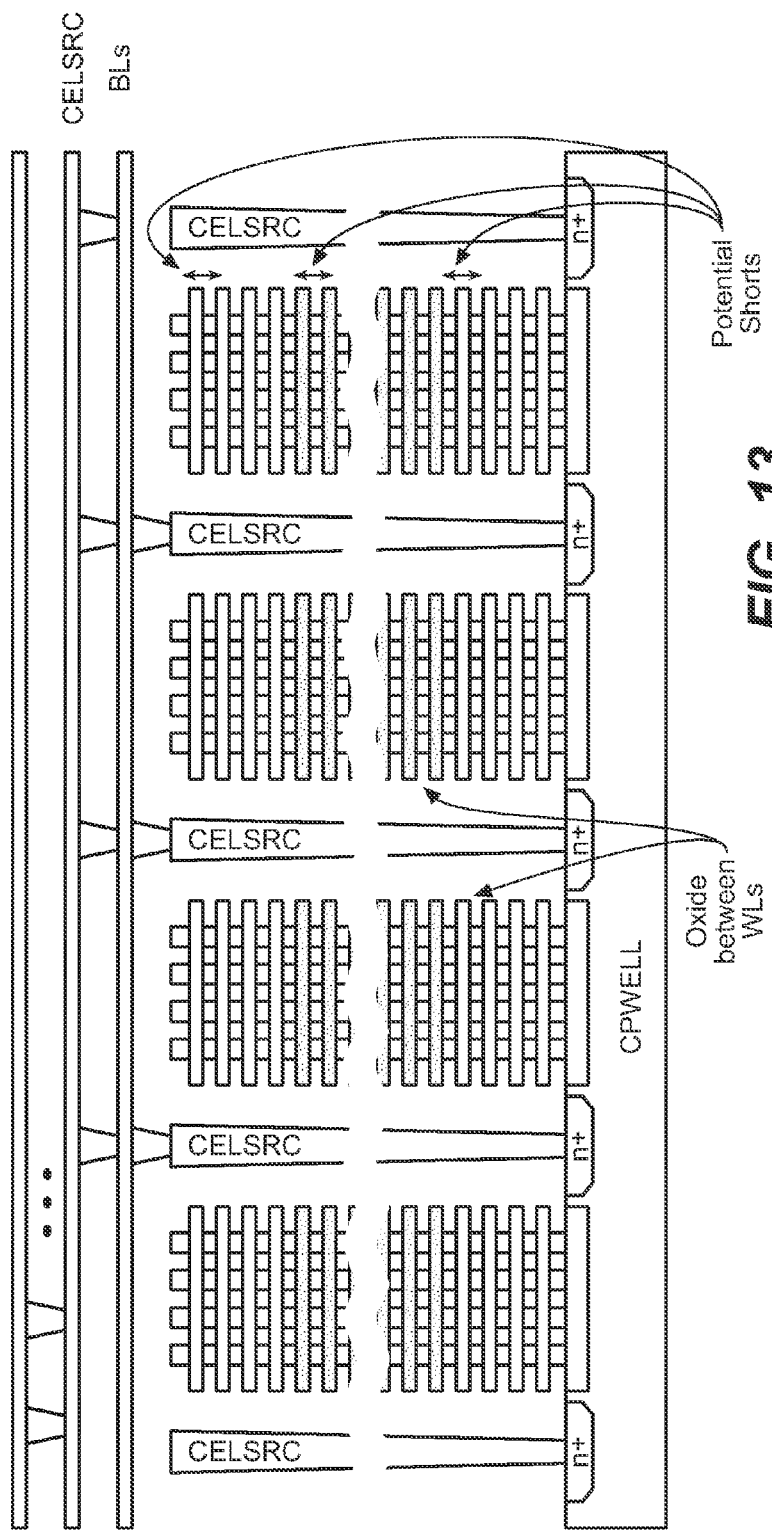
FIG. 13 is a side view of a block, similar to FIG. 11, but with some of the features highlighted.

This section considers shorts between word lines between of the same block, whether in a 2D array or a 3D. In a 3D arrangement, such as illustrated in the FIGS. 9-12, a number of word lines are stacked on top of each other, with an oxide layer in between the pairs of word lines to act as an insulating layer. If this oxide layer is not deposited uniformly or, due to some contamination, is thinner than the target values, the oxide can fail at some point, leading to a short. The stress mode described in this section can accelerate the failure to occur as part of a defect determination process. FIG. 13 can help to illustrate the problem.

FIG. 13 is a side view of a block, similar to FIG. 11, but with some of the features relevant to the current discussion highlighted. As before, four fingers of a block are shown with some of the global bit lines, source lines and so on running across the top. More specifically, the two arrows to the right show two of the gaps between word lines that would be filled with oxide. (As discussed further below, these oxide layers are also between select gate lines, as shown in the second finger.) The potential word line to word line shorts would then be across these oxide layers, such as illustrated at the right most finger.

A number of references cited above present techniques for determining such shorts. Typically, these use a DC stress applied to the word lines. This section uses an AC stress that, in the exemplary embodiment, is applied to the odd and even word lines; for example, while toggling the even word lines to a high voltage level VH, the odd word lines are toggled to a low voltage level VL. (More generally, this can be done to with two sets of word lines, such as a portion of the word lines, where the two sets have at least one word line from each that is adjacent.) VH is taken as a high voltage level such that the Delta (VH-VL) is high enough to stress the oxide in between adjacent WLs. For example, VH can be as high as 20V to reflect the sort of word line stress levels seen due to program and erase voltage levels used on the device. VL can be the low level (ground or VSS) on the device. This toggling is illustrated schematically in FIG. 14, that shows the voltage levels being applied to the two sets of word lines.

Figure 14:
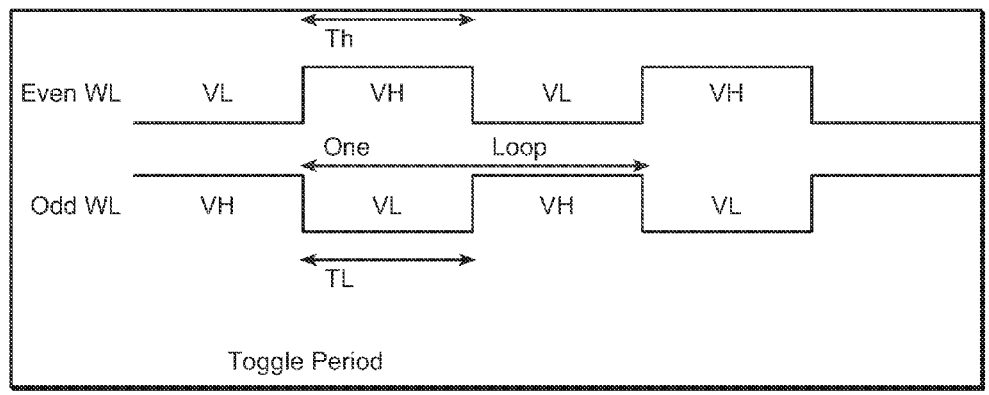
FIG. 14 shows the toggling of voltage levels being applied to the two sets of word lines to apply an AC stress.

As shown in FIG. 14, the even word lines alternately have the VL and VH levels applied, with the odd word lines being similarly toggled but with the phase reversed. These waveforms can be based on a number of settable parameters, including the time period of the VH level, defined by parameter Th, and the time period of VL level, defined by parameter TL. Th and TL can be adjusted to have Delta (VH-VL) between adjacent WLs for a fixed duration. In case the rise or the fall time of VH and VL differ, the parameters Th and TL can be adjusted to achieve a desired duration of the stress in each cycle. The number of loops of this AC stress can also be parameterized (loop count parameter) to prevent any kind of over kill or under kill. Although the exemplary embodiment applies these levels along the sets of even and odd word lines, as noted above this can be done on other subsets that have one or more adjacent word lines within the block or finger.

Figure 15:
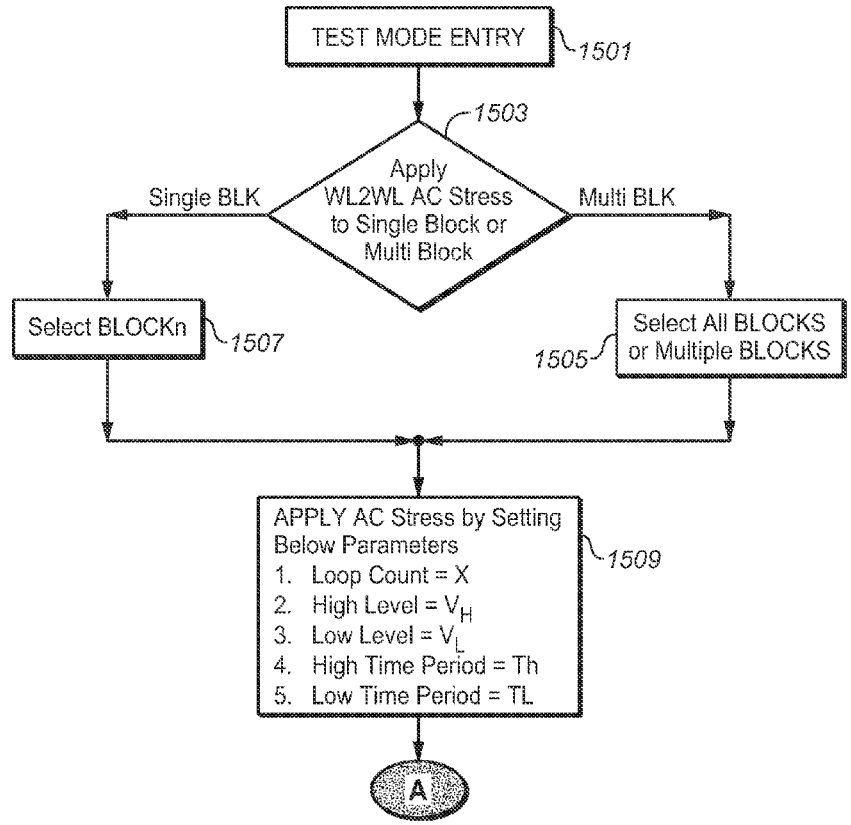
FIGS. 15 and 16 show an exemplary flow for an on-chip AC stress and defect determination process for word line to word line shorts within a block.
Figure 16:
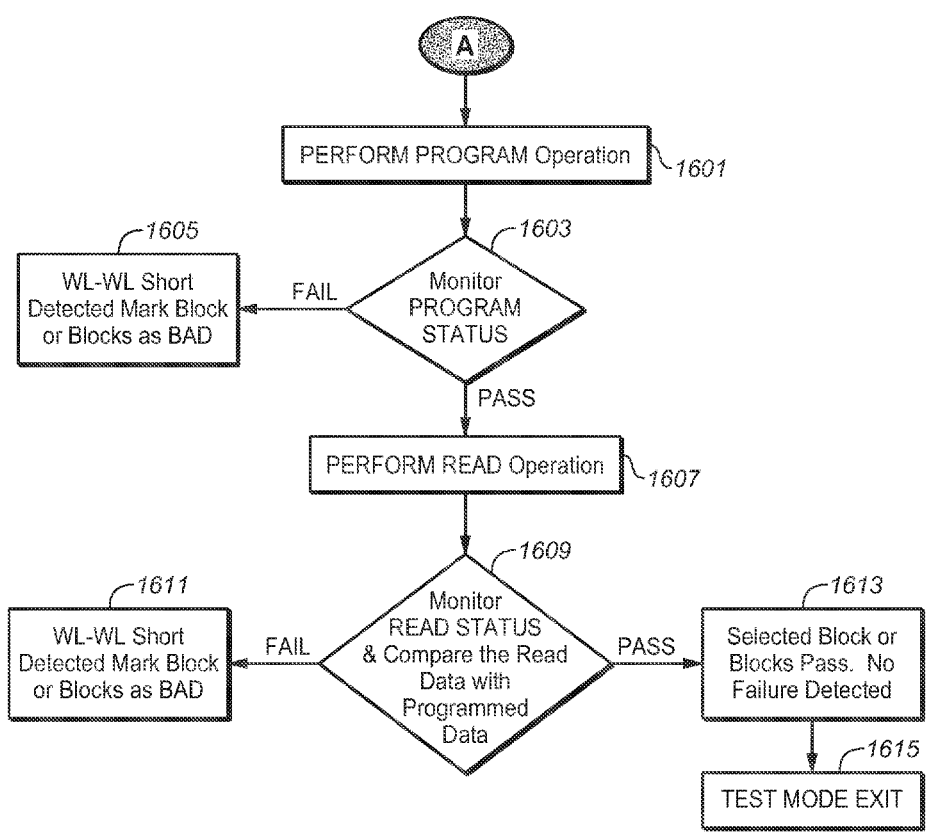

FIGS. 15 and 16 are an exemplary flow for the on-chip stress (FIG. 15) and defect determination (FIG. 16) process. The process begins with the test mode entry at 1501. This will typically be part of an initial test process, done before a device is packaged or shipped, to determine defective die, but also can also be done after the device has been in operation for some time, where this could them be implemented at the system level and with possible adjustments to the parameters (see 1509). At 1503 it is determined whether to just do a single block test or multiple, even all, blocks. In other embodiments, partial block test can also be done. The block (1507) or blocks (1505) are then selected. The stress is then applied at 1509, which show the parameters involved. The idea is to apply the stress to break any weak spots during the test, basically forcing the issue, rather than wait for these failures to occur during operation.

After the stress operation comes the defect determination operation. A number of techniques for this are described in US patent publications: 2012-0008405; 2012-0008384; 2012-0008410; 2012-0281479; 2013-0031429; 2013-0031429; and US2013-0229868. For the exemplary flow here, the stressed block or blocks are programmed and then can be read back to check for failures. The flow picks up at 1601 with a program operation, the status of which is monitored at 1603. If the write operation fails (1605), the bad block or blocks are marked as such and not used. Alternately, this (as well as 1611 below) could also be done at the word line level. If the program operation passes, the detection can then move on to a read operation at 1607. The read status is monitored at 1609 by, for example, comparing the data as read back with the data that was originally programmed. If the read status comes back as a fail, then the bad block or blocks can be marked (1611) as such. If the tested blocks pass (1613), the test mode can then exited (1615).

For the defect determination operation, determining whether a program operation has failed can be based on a word line failing by exceeding maximum number of program loops or on the read operation coming back with a failed bit count exceeding a limit. The data written and read back for this process can be a random pattern, either predetermined or not. In either case, the comparison of the read back data can be based on a comparison of the data pattern that was to be written, each by maintaining a copy or because it is based on a known, predetermined pattern. Rather than a direct comparison, it can alternately (or additional) be based on error checking and correction (ECC) and whether the data can be extracted within the ECC capabilities.

Figure 17:
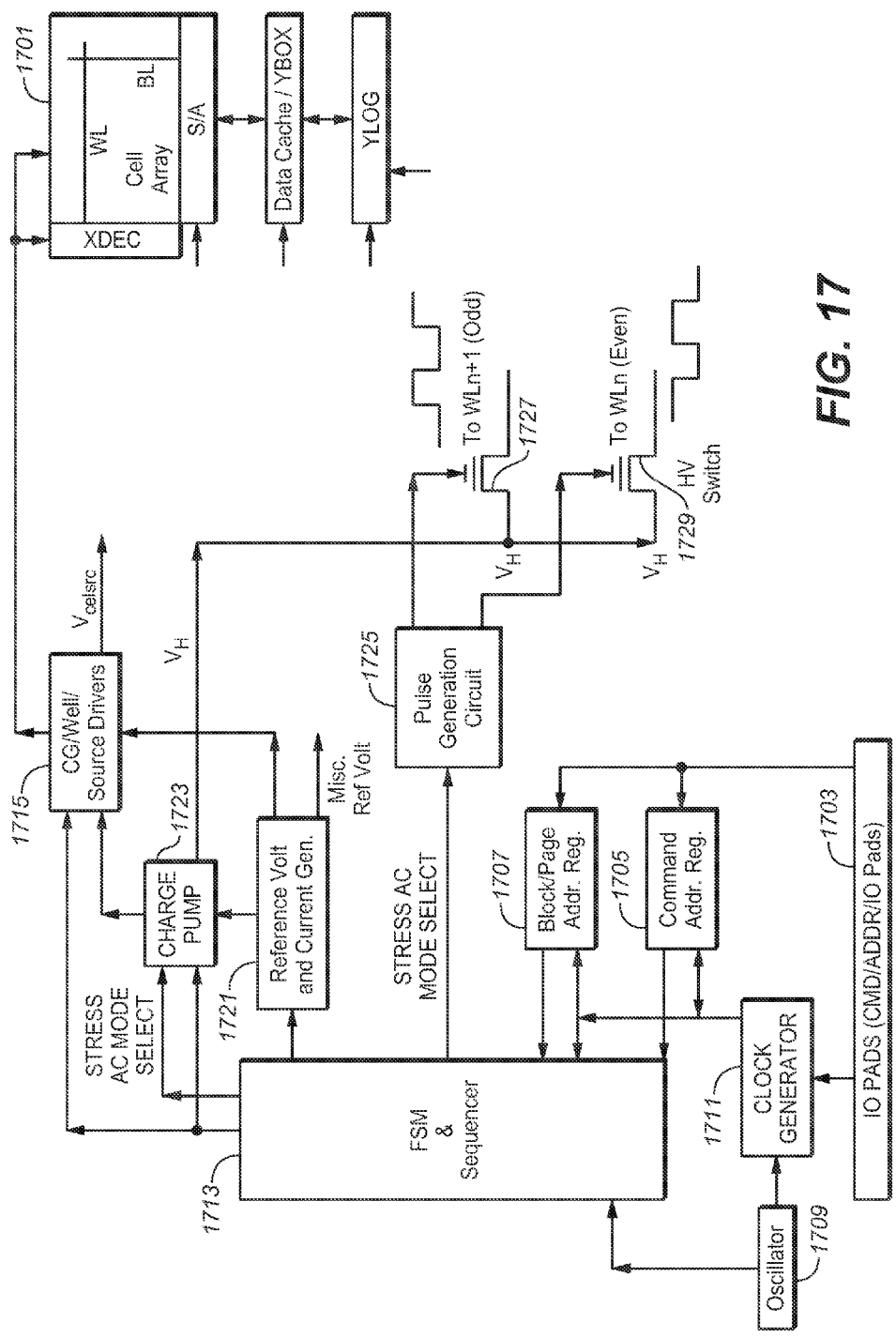
FIG. 17 is a schematic representation of some of the elements on the memory chip that are involved in the process of FIGS. 15 and 16.

FIG. 17 is a schematic representation of some of the elements on the memory chip that are involved in this process. A number of different embodiments are possible, but shows some of the basic elements. The array 1701 and its associated decoding and sensing circuitry can be of the BiCS or other 3D variety, but is here shown in more of a 2D sort of representation for simplicity. The memory circuit has a set of IO pads 1703 for commands, addresses and data transfer, which can then be passed on to command and block/page address registers (1705, 1707). An oscillator 1709 can be used with the clock generator to provide needed clock signals. A finite state machine (FSM) and Sequencer block 1713 represented to on-chip control logic that controls the various drivers 1715 for the array 1701. References voltage and current generators 1721 supply the various reference levels, including those supplied to the charge pump circuits block 1723, which generates the high level VH applied to the word lines in the intra-block AC stress mode of this section. A pulse generation circuit, here schematically separated out as block 1725, will then supply the stress level to the selected block when enabled by mode select signal, as schematically represented by the control signals to the control gates of the high voltage switches 1727 and 1729.

For any of the variations, these techniques can be effect for detecting current or incipient word line to word line shorts within a given block, without over identification, improving the identified defective parts per million (DPPM) value. This process can be implemented as a built in self-test (BIST) process that can help in reducing test times and also gives the option to perform the stress at the system level at other times, such as before performing a block.

Word Line to Word Line Shorts, Adjacent Blocks

In most non-volatile array structures, the issue of word line to word line shorts is traditional an issue for word lines within a common blocks. In some structures, such as the sort of 3D BiCS-type structure described above with respect to FIGS. 9-12, word lines from different, but physically adjacent blocks can be in close proximity. This section looks at the detection of such inter-block word line to word line shorts. As can be seen from FIG. 9, where the two shown fingers are from different blocks, word lines on the same vertical level from different blocks can be closely placed, separated by a distance that will decrease as device scales continue to shrink.

Word line to word line shorts from adjacent blocks can manifest themselves as erase disturbs, program disturbs, or both. For example, consider the case where a block X is already in a programmed state and unselected for erase, but an adjacent block, block X+1, is selected for erase. In case of a short between a word line WLn of block X and word line of block X+1, when applying the erase voltage level to block X+1, the erased bias level will transfer across the shorted word line WLn to block X, causing some degree of erase there so that block X will lose already programmed data, resulting in erase disturb there. Similarly, if block X is already programmed and meant to be unselected for additional programming while the adjacent block X+1 is selected for programming, when a programming pulse is applied along WLn in block X+1, this will be transferred across the short. WLn in block X be get over programmed and WLn of block X+1 will see high loading, resulting in program disturb there.

Figure 18:
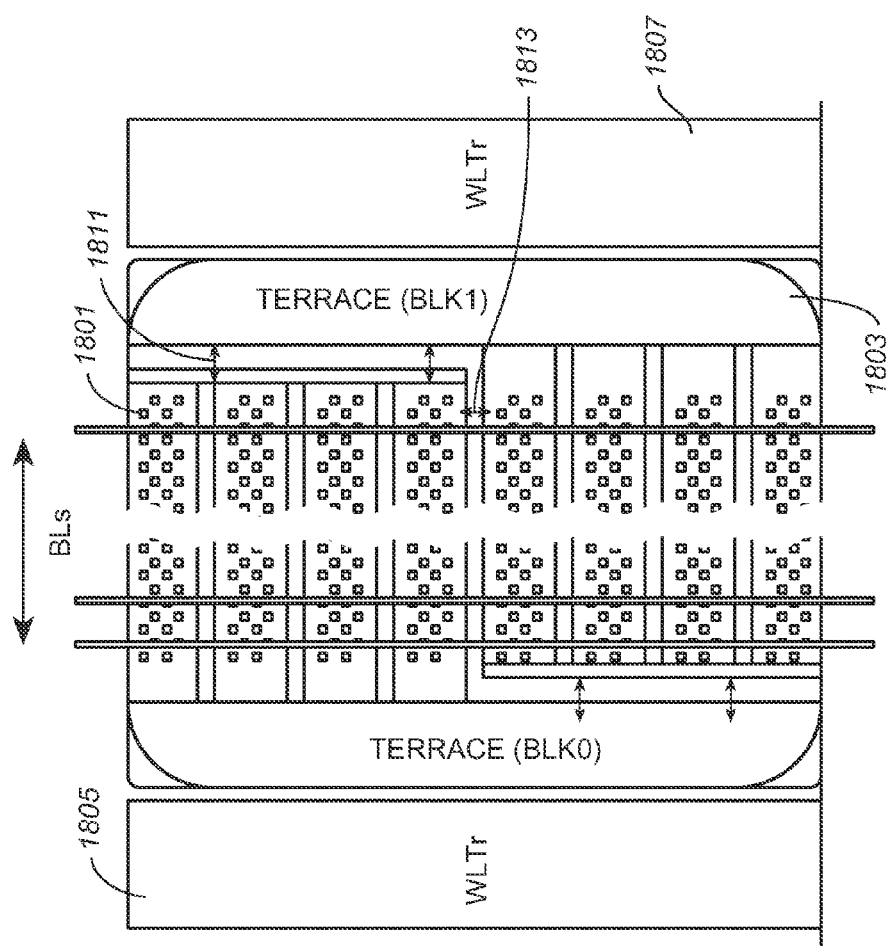
FIG. 18 is a top level, top down diagram of how blocks are paired and placed next to each other in the exemplary embodiment of FIGS. 9-12.

FIG. 18 is a top level, top down diagram of how blocks are paired and placed next to each other in the exemplary embodiment. The four (in this embodiment) fingers of block 0 1801 are at top, with each word line in the stack connected to a corresponding terrace level that in addition to being to the left of the fingers of block 0, are also in proximity to the fingers of block 1 1803. To the left and right are the respective transfer gates for block 0 (1805) and block 1 (1807). The bit lines then run up and down in this view, connecting the NAND strings running into the page to the associated sense amps. The arrows show some of the examples of where inter-block word line shorts can occur, such as between a word line of one block and the other blocks terrace region 1811 or between the word lines of adjacent fingers of different blocks 1813. Also this discussion is given in the context of the BiCS type structure, it can also be applied to other structures where word lines of one block are in proximity to the word lines of another block.

The process for determining inter-block word line to word line shorts between adjacent blocks can again use a stress operation and a detection operation, where the stress phase can be an AC or DC stress. The high level VH is again a high voltage level such that the Delta (VH-VL) is high enough to stress the oxide or weak defect in between adjacent word lines. VH can be as high as 20V to correspond to the stresses the device will see during erase and write operations. The low level VL is similarly such that the Delta (VH-VL) is high enough to stress the oxide or weak defect in between adjacent word lines, where VL can be as low as the low on-chip level of VSS or ground. After the stress mode, whether AC or DC, a word line to word line leakage determination can then be done to check pass/fail status using decoder circuit, modified as appropriate.

The inter-block stress between word lines can be applied in a number of ways. For example, a differing bias can be applied on the word lines from even and odd blocks. In one embodiment, this could be applying a high voltage to all word lines on even blocks and a low voltage to odd block, or vice versa. This will create a stress between word lines of physically adjacent blocks to be able to weed out defects at time at test time. This stress can be applied to two or more physically adjacent blocks at a time.

Figure 19:
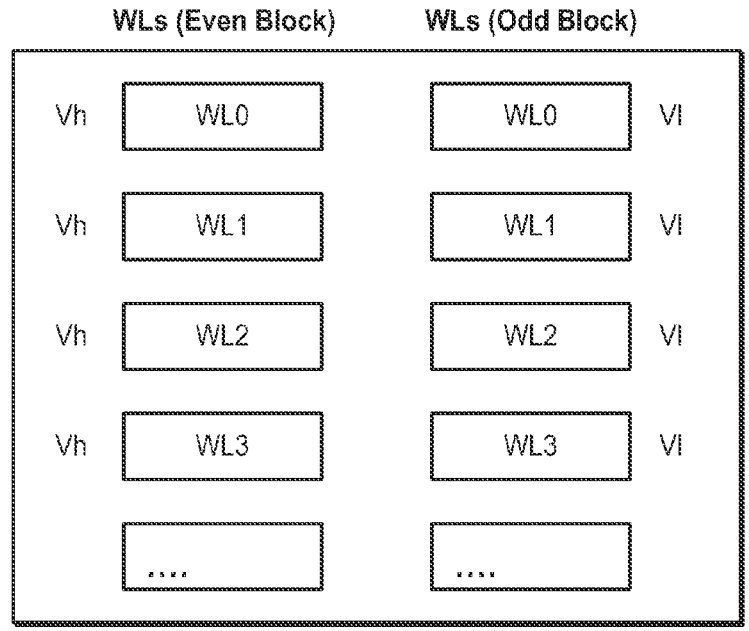
FIGS. 19 and 20 schematically represents two example of the word line levels as applied to even and odd block in an inter-block stress mode.

FIG. 19 schematically represents the word line levels as applied to even and odd block under this arrangements, where the word lines on even blocks are set high and the odd word lines are set low, where this can also be done the other way around. These levels can then be held for some duration in a DC stress mode, or toggled over a number of cycles. These levels can then be applied to by the corresponding decoding circuitry and transfer gates to the word lines according to this pattern.

Figure 20:
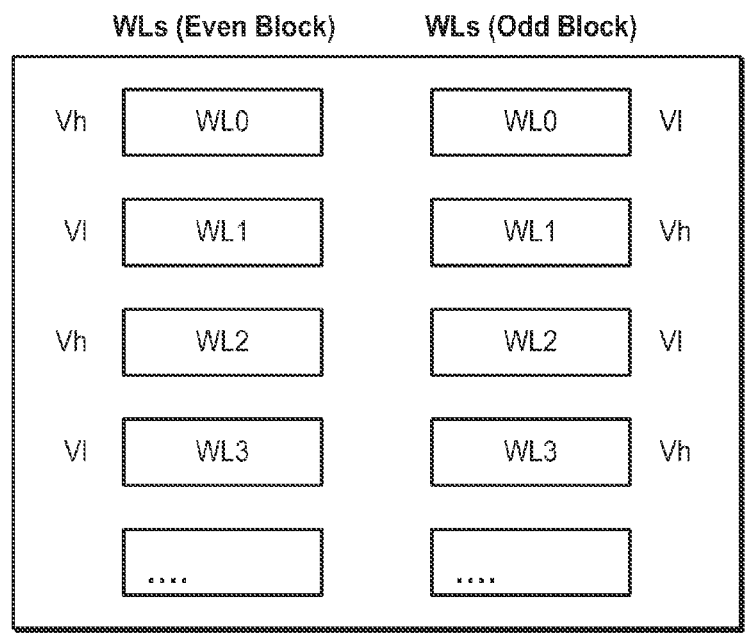

In an alternate stress mode, a stripe pattern can be applied, either as DC or toggled for a AC mode, to the word lines of adjacent blocks, where one pattern is applied for one block and the pattern reversed for the adjacent block. For example, on the word lines of even blocks, voltage levels can be applied in an alternating high-low pattern, as shown in FIG. 20, with the inverted low-high pattern on the odd blocks. This stress can again be done a pair of blocks at a time or multiple selected of blocks.

A post-stress detection sequence can then follow. The exemplary embodiment for a detection sequence uses an erase disturb test to detect the word line to word line shorts from adjacent blocks. This can be done by erasing all blocks of an array. For all blocks that pass the erase, a program follows to see whether blocks program correctly. For example, random data can be programmed on all blocks of the array, read back, and compared against the expected data to check for any program disturb. A block N can then be erased, after which an adjacent block N+1 is checked for any erase disturb.

Figure 21A:
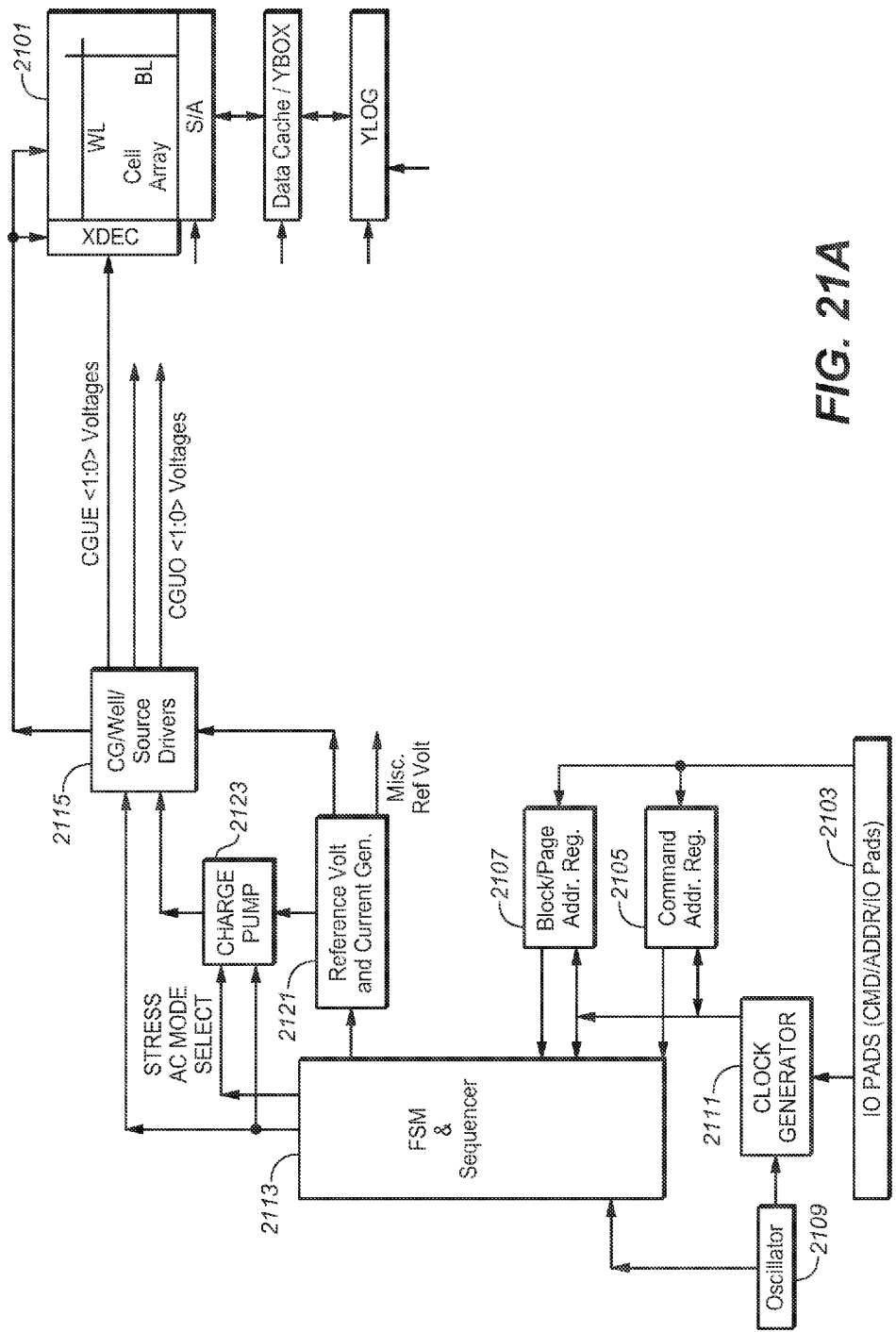
FIGS. 21A and 21B are a schematic representation of some of the elements on the memory chip involved in an inter-block word line short determination process.
Figure 21B:
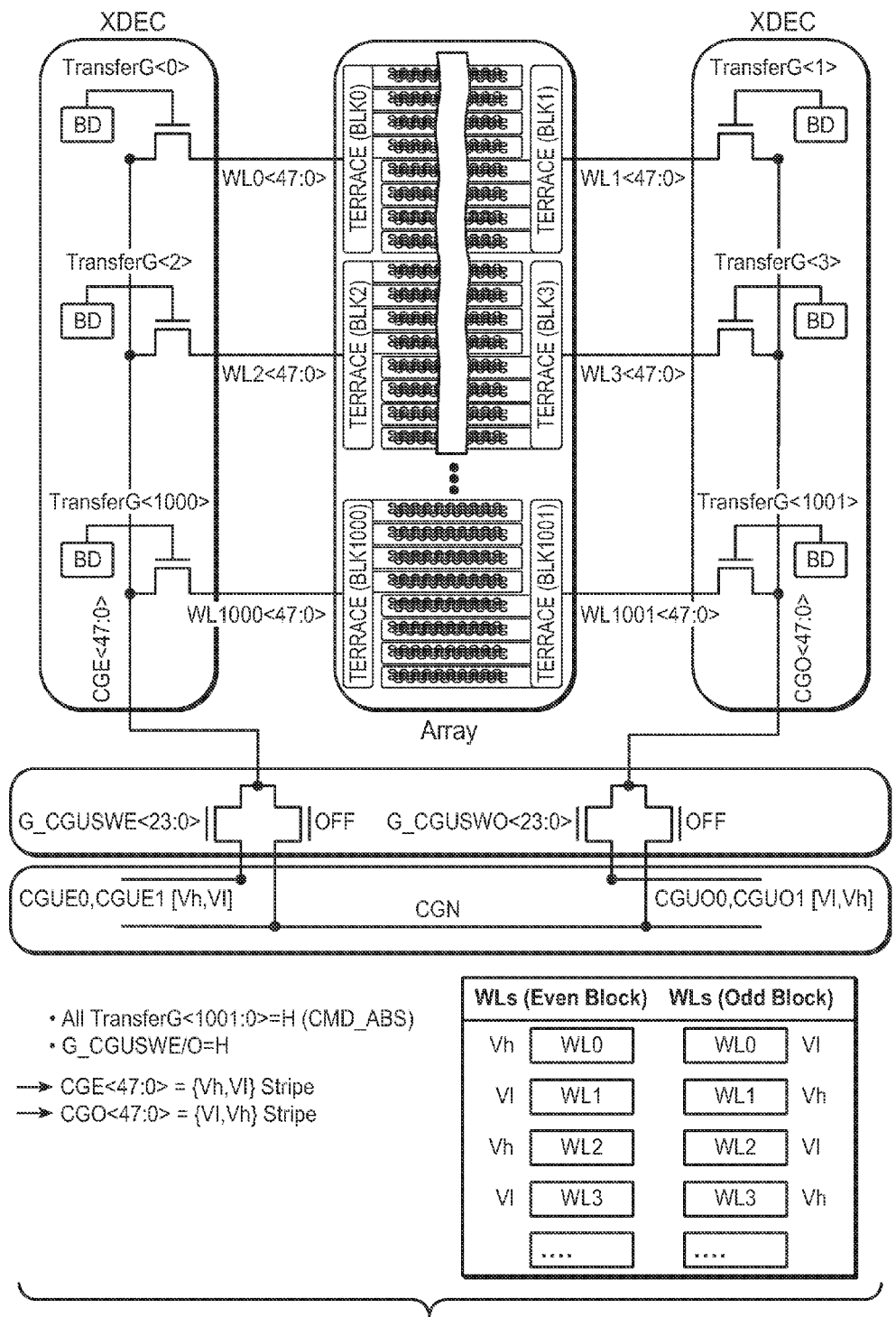

FIG. 21A is a schematic representation of some of the elements on the memory chip, similar to FIG. 17 and with the corresponding elements similarly numbered (i.e., array 1701 is now array 2101 and so on). To enable the inter-block word line to word line stress mode, a corresponding stress mode select signal is sent from the on-chip control logic to the charge pump, which in turn can supply the needed high voltage level to the control gate drivers in block 2115. These drivers can then supply the high and low stress voltages CGUE and CGUO to the even and odd blocks. FIG. 21B gives more detail on the decoding circuitry and its connections to the array for the exemplary embodiment, where the even block terraces are to the left and the odd block terraces to the right.

For any of the variations, the test mode of this section can consequently be used to catch word line to word line shorts between word lines of adjacent blocks. By using an AC version of the sort of alternating high and low voltage pattern illustrated with respect to FIG. 20, this can concurrently apply the sort stress described in the preceding section for word line to word line shorts within a block, helping to reduce test time. For the voltage patterns of either of FIG. 19 or 20, the separate biasing of neighboring block is used, which is not conventional in NAND memory decoder designs, but which can be further enhanced for parallelism by using opposite alternating patterns on facing blocks. As with the other defect determination methods described here, the detection of adjacent blocks' erase disturb, program disturb, or both can help to avoid the corrupting of user data.

Select Gate Shorts

The preceding two sections looking at defects that could to shorts between word lines. Going back to the structure shown FIGS. 9 and 10, this has multiple select gates on both the source and drain sides, so that in each finger there will be oxide layers between the end most word lines and the adjacent select gates lines (on both the source and drain ends) and also between the multiple select gate lines themselves. There will also be oxide layers between the corresponding select gate layers in different, adjacent blocks and different adjacent finger. Also, as the select gates in the exemplary embodiment have tunable thresholds—that is, they are programmable—they will also be subjected to high voltage levels. Consequently, select gate to select gate and word line to select gate shorts can occur.

Figure 22:
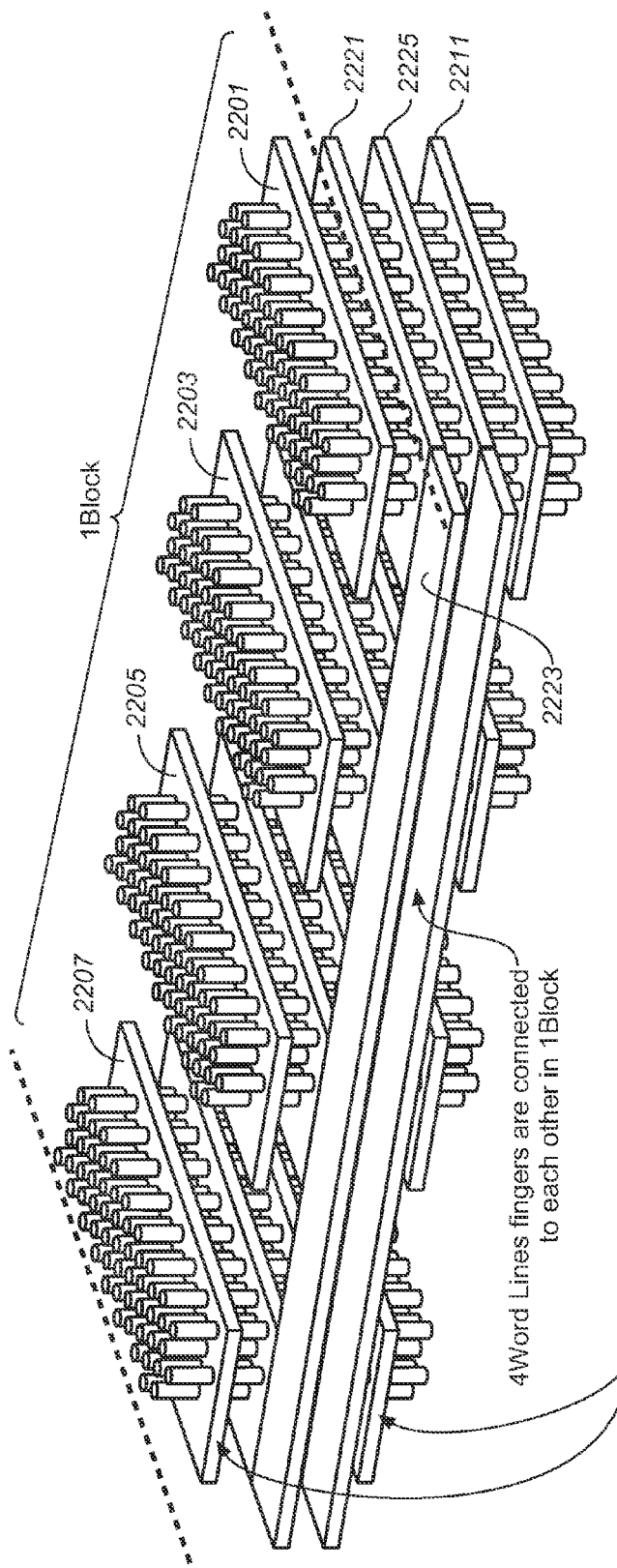
FIG. 22 is an oblique view of a simplified version of one block with four fingers, where each NAND string only has two memory cells and only a single select gate at either end.

Although similar to the word line case, the select gate structures have some differences that can be illustrated with respect to FIG. 22. FIG. 22 is an oblique view of a simplified version of one block with four fingers, where each NAND string only has two memory cells and only a single select gate at either end. Considering the rightmost finger, the pair of word lines 2221 and 2225 are between the select gate lines 2201 and 2211. As discussed above, the word lines of a given level from different fingers of the same block are connected together, as shown at 2223 for word line 2221, along the terrace region. The select lines of the fingers, however, are separate, so that the fingers can individually be selected. Consequently, the select gate lines at 2201, 2203, 2205, and 2207 are independent controllable, lacking the sort of connection between fingers that 2223 effects for the word lines. The simplified drawing of FIG. 22 shows only a single select gate on either end, but when there are multiple select gates, these are typically operated in unison as they perform a common select function.

Figure 23:
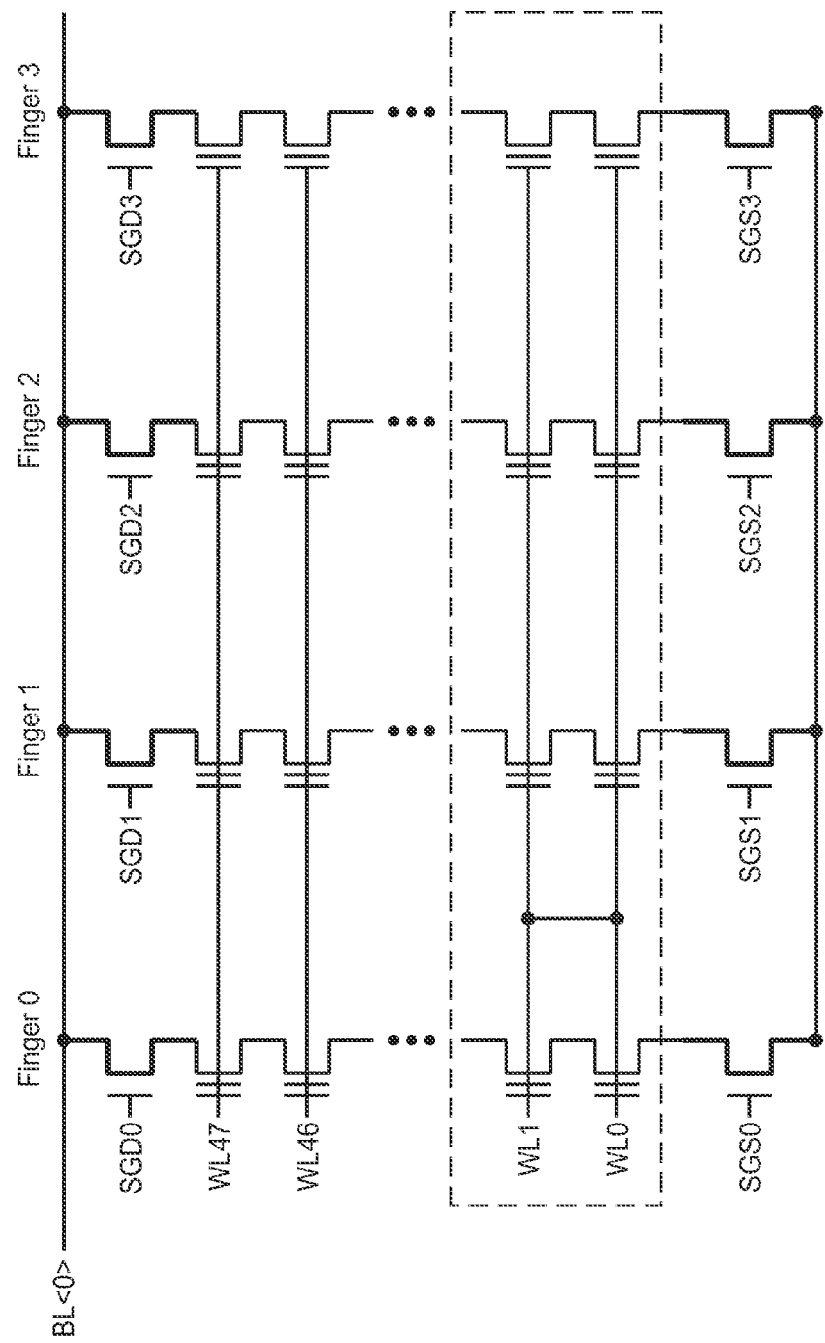
FIGS. 23 and 24 illustrate the consequences of a short between two word lines of the same block and a short between select gates.
Figure 24:
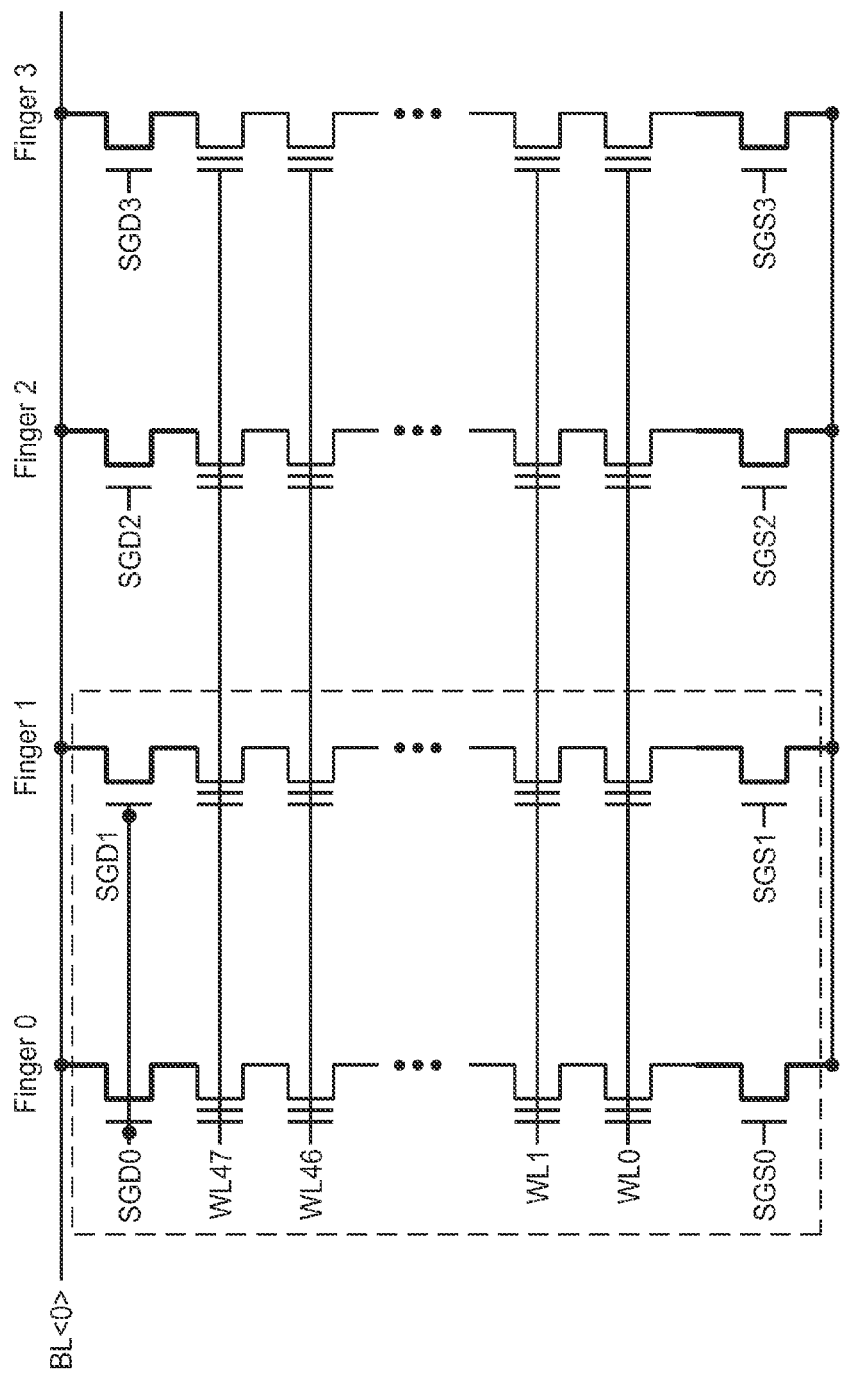

In this structure, the consequences of a select gate to select gate short can be more severe that a word line to word line short, as can be illustrated by comparing FIGS. 23 and 24. Both of these show four NAND strings from four different fingers of the same block. A given word line connects the gates across the fingers, while the select gates are individually controllable (where, in these figures, only a single select gate is shown on each of the source and drain sides). Referring to FIG. 23, a short between two word lines (such as WL0 and WL1) would cause all of the pages of data on these word lines of the block to be lost. Referring now to FIG. 24, if instead there is a short between select gates of different finger (such as SGD0 and SGD1), the corresponding NAND strings cannot be independently accessed, causing the loss of a much larger number of pages. As with the word line case, there are several types of shorts to consider. There can be select gate to select gate shorts in the same finger of the same block; across different fingers of the same block; and between blocks. There can also be shorts between the end most word lines and adjacent select lines. (A further possible short to the interconnect or local source line, affecting both word lines and select gate line, is discussed in the next section.) For each of these mechanism, a corresponding stress can be applied followed by a detection operation. Either an AC or DC stress can be used and can be done independently or, when appropriate, can be incorporated into the word line test operations. In some cases, such as the same block, different finger case, that is not available for the word line to word line case as illustrated in the FIG. 24, this would need to be an independent stress operation. Further, in addition to the stress and detection operations described herein, those presented in US patent publications: 2012-0008405; 2012-0008384; 2012-0008410; 2012-0281479; 2013-0031429; 2013-0031429; and US2013-0229868 can also be adapted to the select gate, and select gate-word line, cases.

The biasing voltages for select gate-select gate stress can be different compares to word line case, both to reflect the different levels that are used on these different transistors and also on the different decoding options that may be available on the selects of the device. Although the drain and source select transistor sets are typically operated respectively as a single drain and source transistor, if some or all of the elements of each set of (in this example) four can be individually biased, if the needed select gate decoding is available, this can be used for applying a strip pattern, either AC or DC, between the select gates lines of the same finger, different fingers of the same block, adjacent fingers of different blocks, or some combination of these. In the case where the set of select gates are share a gate contact (or, similarly, for only a single such gate), these will all have the same bias level and the stress is only applied between fingers (whether the same or different blocks). In an intermediate sort of situation where, say, one source select gate line ("SGSB") can independently biased while the other three (SGS) are connected together to have the same control, several stress options are available, such as: SGSB—SGSB (adjacent fingers); SGS—SGSB shorts (same finger, as for a word line to word line short); and SGS (either of 3 SGS of one finger)—SGS (either of 3 SGS of adjacent finger).

Word Line to Local Source Line Shorts

In an array with a NAND type of architecture, the NAND string of a block are typically connected to a common source line, as shown at 34 of FIG. 5. The source lines of multiple blocks, even all of the blocks of a die, often share such a common source line. Referring to the 3D structure of FIG. 11, in the arrangement shown there, between each of the fingers of the same block a local common source line CELSRC (or local interconnect, LI) runs up to connect the source side of the NAND strings to one or more global common source lines (not shown in FIG. 11) running across the top the structure. As can be seen in FIG. 11, this places the word lines (and select gate lines) in proximity to this local source line interconnect, leading to the possibility of shorts across the intervening oxide.

During an erase operation in this sort of structure, the LI (CELSRC) will couple to the high erase voltage, while the word lines (and any dummy word lines) are low (0V) and the select gate lines can be either driven or floated to prevent them from being erased. In case of an LI to word line short, the erase voltage will be droop and the device may not be able to successfully erase the word lines. This defect can also cause read and program operations to fail. This is block level failure. This section looks at methods for determining such defects at test time.

In 2D NAND devices, there are often modes that apply a stress (high voltage) on word lines, while keeping the source line low (close to 0V), but this sort of stress mode can degrade the characteristics of the memory cells, leading reliability and endurance concerns. Additional, in a typically 2D arrangement, the metal line of a source line does not run next to word lines, so that the failure mode considered in this section is more specific structures, such as the BiCS array, that have this sort of lay out.

In the exemplary embodiment, a high voltage (~VH) is applied on the local common source line of the block (LI or CELSRC), and lower level is applied to the word lines, including any dummy word lines, with the select gate lines either driven or floated. Here VH is a voltage level such that it is high enough to break weak oxide between LI and any word lines, but small enough such that reverse bias diode between the CPWELL (p+) and the CLESRC (n+) region does not break down; for example, in the exemplary embodiment this can be on the order an erase voltage, say 20V. The low level can be taken from among the low levels on the chip, such as VWL, VSG, or VL. Both VWL and VSG are also voltage levels close to VSS or VSS, with values such that they will not stress the memory cells, so that endurance and reliability are not adversely affected. In this example, VSG is VSG voltage is mainly a biasing voltage to turn on the NAND string during read/program/erase operations and VWL can be mainly be VCGRV (control gate read-verify) level, where VCGRV voltage can go as low as close to 1V in an exemplary embodiment. The CPWELL level can be set at range of values between the high and low levels, as long as combinations with the other voltages does not break down the reverse bias diode between the CPWELL (p+) and the CLESRC (n+) region.

This arrangement of bias levels will stress weak oxide depositions, whether due to contamination or other defect, in the region between the word lines and the local source line interconnect in order to bring about a short. This can cause the defect to manifest itself at test time, rather than once the device is in use. As high voltage levels are not placed on the word lines, the cells will not be stressed, avoiding adverse effects for reliability and endurance. FIG. 25 again shows a side view of the exemplary embodiment with an overview of the applied voltages.

Figure 25:
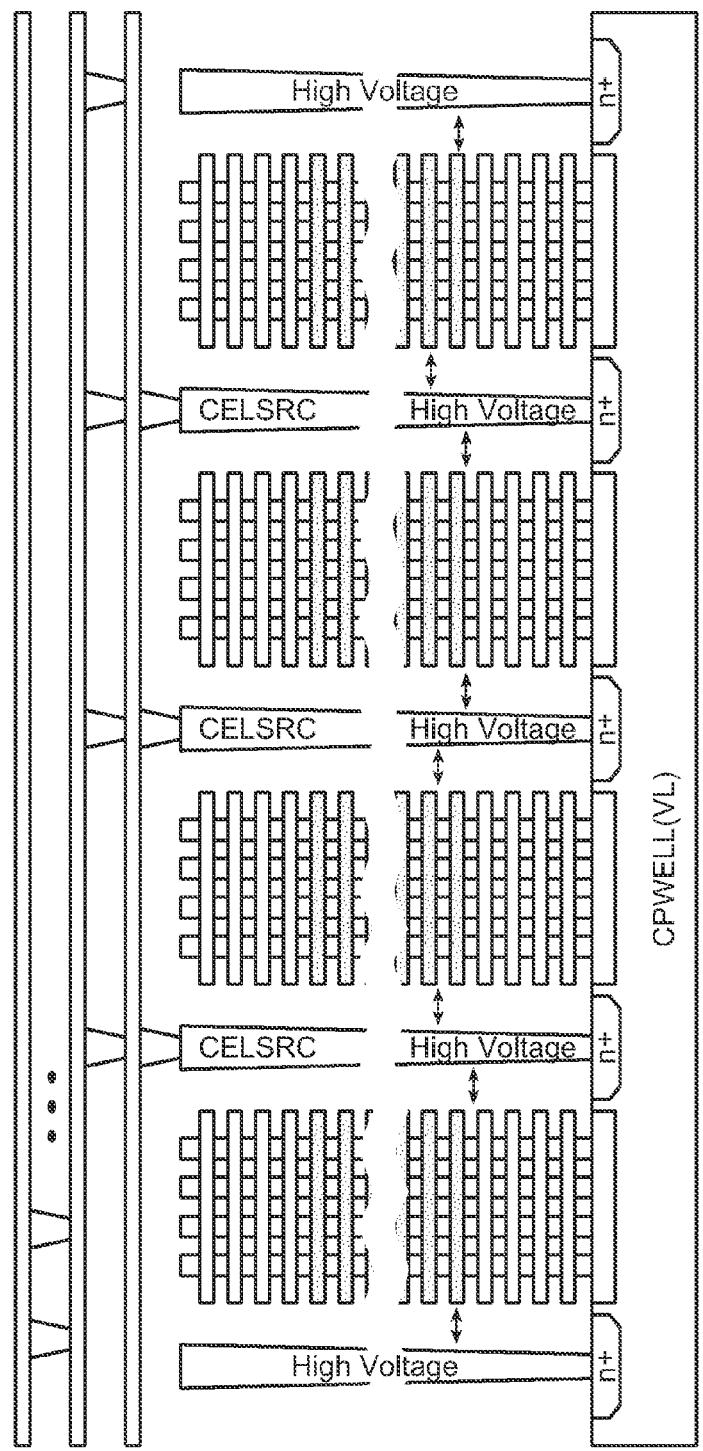
FIG. 25 shows a side view of the exemplary embodiment with an overview of the applied voltages to stress for local interconnect to word line physical shorts.

In FIG. 25 the word line to local source line stress is applied in the circled region. The low voltage levels on the leftmost finger and the high voltage on the vertical source line interconnect. The arrows illustrate particular examples of locations of stress between a word line and the source interconnect line where leakage could occur.

Figure 26:
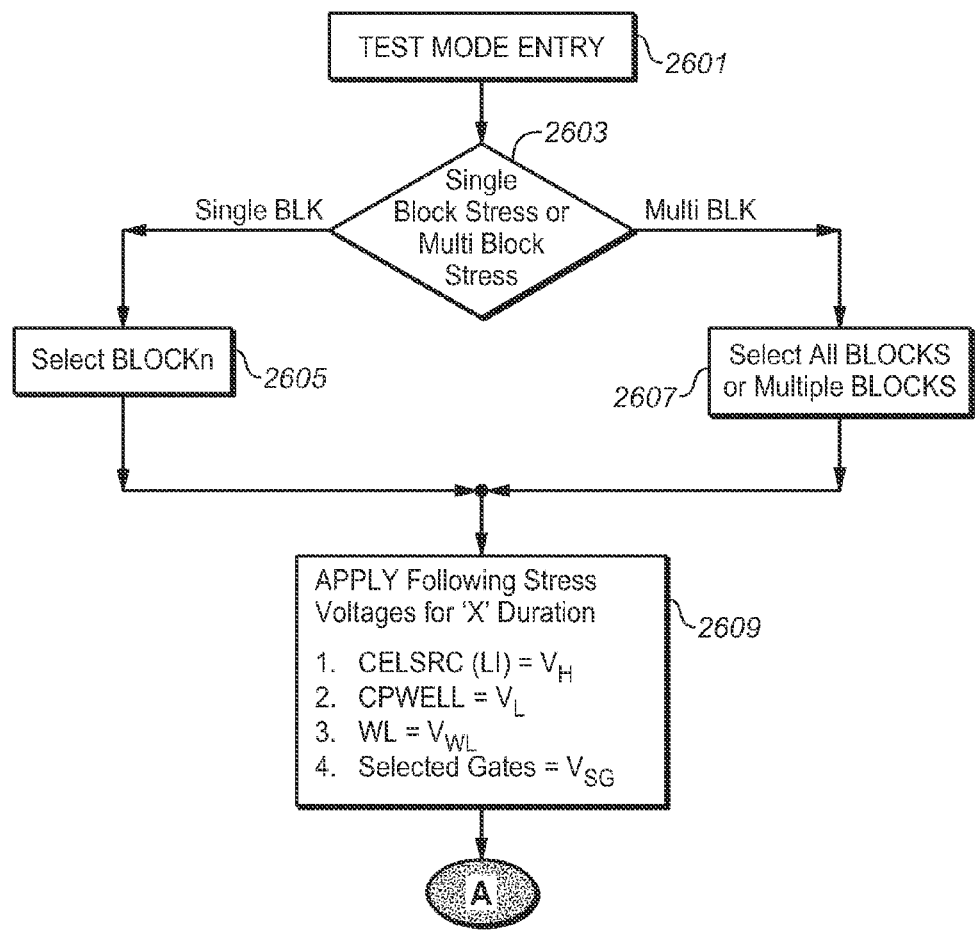
FIGS. 26 and 27 are an exemplary flow of a test mode to screen local interconnect to word line physical shorts.
Figure 27:
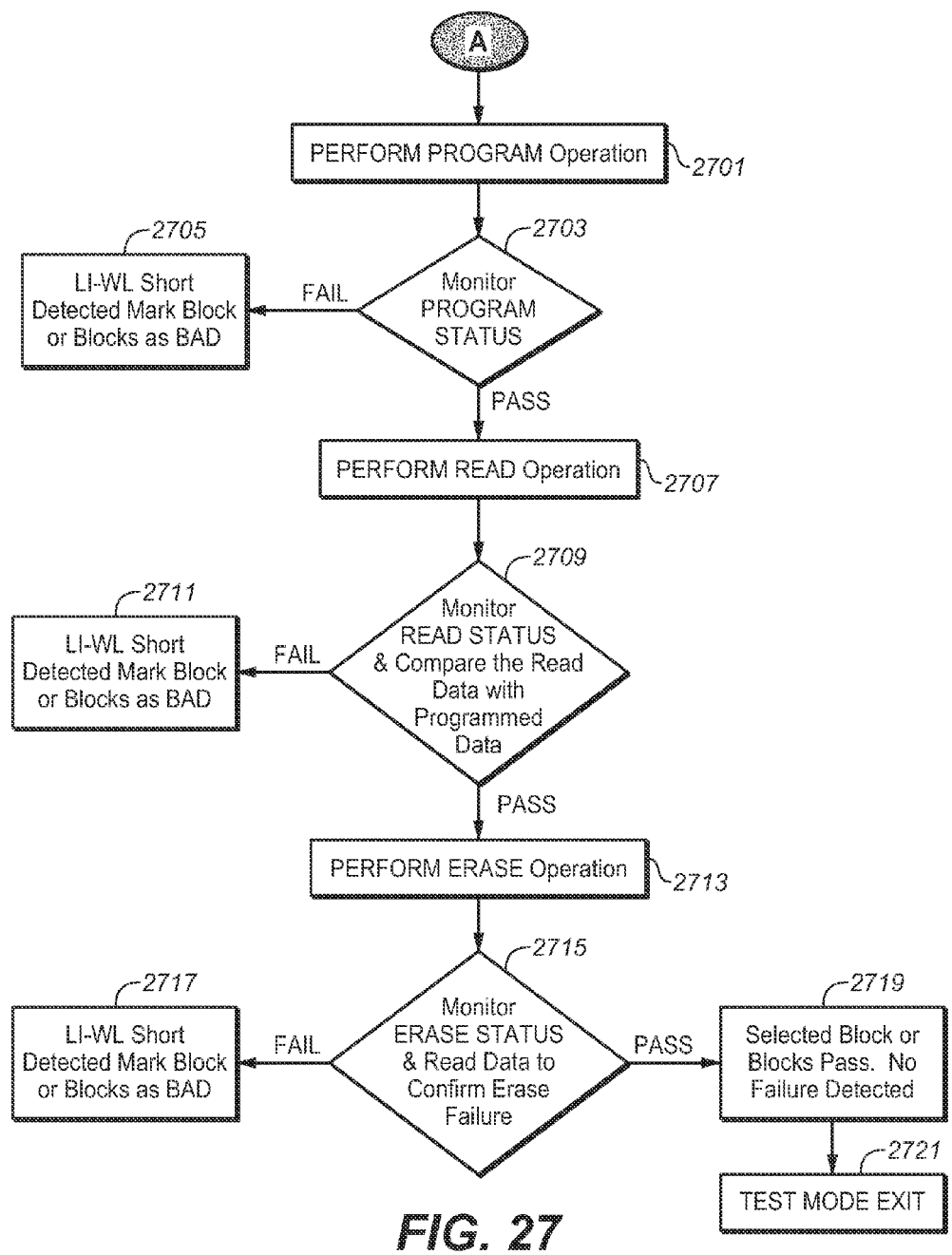

FIGS. 26 and 27 are an exemplary flow of a test mode to screen local interconnect (LI) to word line physical shorts, similar to FIGS. 15 and 16 above for the intra-block word line to word line case. The test mode can either be done as part of an initial test process or as a system level countermeasure where, after some number of cycles and before erasing any blocks, the test can be done to catch any bad blocks before programming in any data. FIG. 26 is the stress phase and starts at 2601 with entry into the text mode. At 2603 the determination is made as to whether a single block or multiple blocks are to be tested and at 2605 or 2607 the corresponding select signals are sent out. The stress voltages are then applied at 2609. As with the word line to word line cases, the duration of the stress is a settable parameter, as can be the various levels.

FIG. 27 illustrates an exemplary embodiment for the detection phase, where many of the specifics are as discussed with respect to FIG. 16. This begins with a program operation at 2701, which is monitored at 2703. If the program fails for any blocks, these are marked bad (2705). If the program operation passes, a read can then be performed at 2707. The read status is then monitored at 2709 and the result can be checked by, for example, comparing the data as read back with the data as stored. Any blocks that fail are marked bad at 2711. If the read operation passes, an erase can then be performed at 2713. This is monitored at 2715, with any failing blocked marked at 2717. If the erase is passed (2719), the test mode is then exited (2721).

Figure 28:
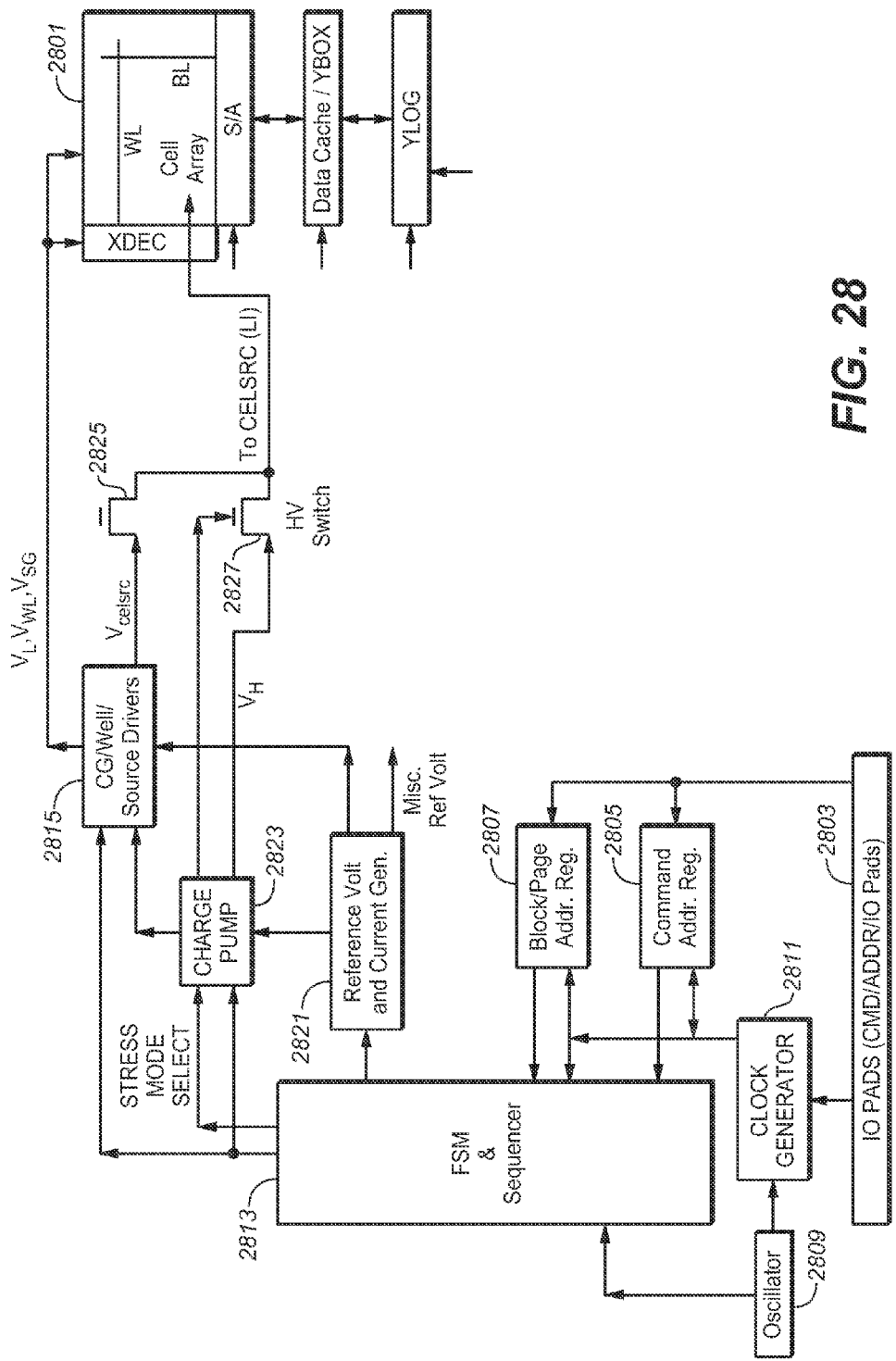
FIG. 28 is a schematic representation of some of the elements on the memory chip that are involved in the process of FIGS. 26 and 27.

FIG. 28 is a schematic representation of some of the elements on the memory chip, similar to FIGS. 17 and 21, and with the corresponding elements similarly numbered. To enable the inter-block word line to word line stress mode, a corresponding stress mode select signal is sent from the on-chip control logic to the charge pump, which in turn can supply the needed voltage levels for the word lines and select gate lines to the drivers in block 2115. The usual levels for CELSRC are supplied through switch 2825, with high voltage VH from the charge pump can be supplied through a high voltage switch 2827, that also can get its control gate voltage from the charge pump.

Bit Line to Low Voltage Signal Shorts

In the memory array, global bit lines span the structure connecting the memory cells to the sense amplifies used in sensing operations. This shown above in FIG. 18, for instance, where each NAND string is connected to a bit line, and each bit line is connected to a NAND string in finger. The sense amps are then located on the periphery of the array. In the exemplary embodiment, and for simplifying this discussion, each sense amp connects to a single bit line. In other embodiments, where less than all of the bit lines are sensed at once (say, every other or every fourth bit line being sensed concurrently), multiple bit lines (such as 2 or 4) are associated with each sense amp. As the spacing of bit lines is typically smaller than the area needed by the sense amp circuits, the sense amp circuits are often staggered relative to one another in the chip's layout. This means that one bit line may be adjacent to the sense amp associated with another bit line.

During erase operations in some memory circuit designs, such as the exemplary BiCS type embodiment illustrated with respect to FIGS. 9-12, during an erase operation bit lines will couple to the erase voltage (which can be in the ~20-24V range), taking the bit lines to a high voltage. The sense amplifiers generally operate at lower voltages, such as VSS (0V), the high logic level (VDD, in the ~2-3V ranges), and, in some embodiments, a somewhat higher sense amp level used in pre-charging bit lines for sensing operations (VDDSA, in the ~4-5V range). Due to the proximity of the bit lines at high voltages with sense amp circuitry at relatively low voltages, the bit lines can short to the adjacent lower voltage circuitry. In case of such a bit line to low voltage signal short during device operations, the erase voltage (VERA) may droop and circuit will not be able to successfully erase selected blocks. Even if the bit line is repaired, this fault can still cause erase failure. Further, as the bit lines are global, this will be global defect for the portion of the array (typically the entire plane) spanned by the defective bit line.

Figure 29:
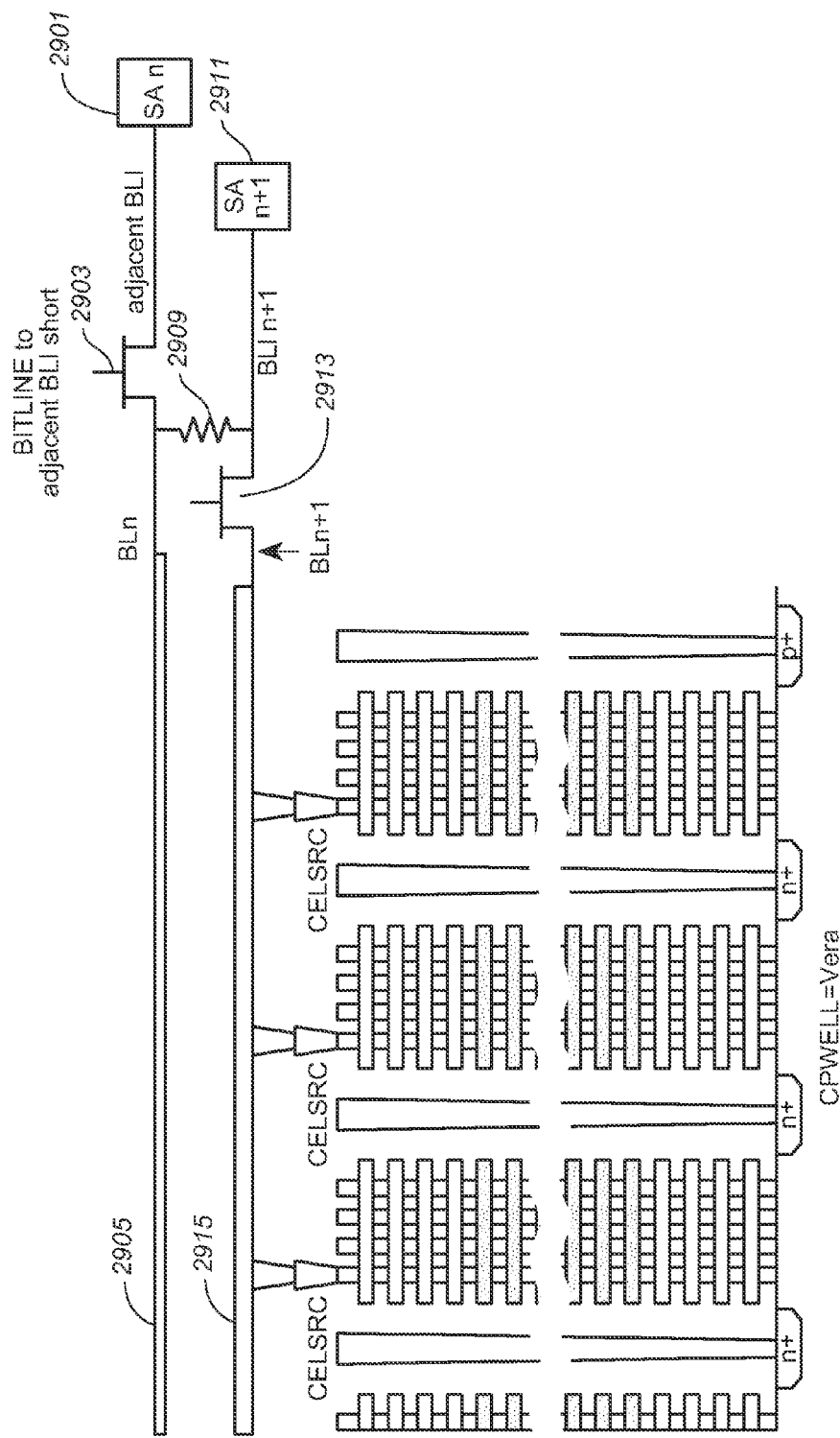
FIG. 29 is a schematic representation of a possible bit line to low voltage short.

FIG. 29 is a schematic representation of the situation in the BiCS context. A side view of several fingers of the array are shown, a pair of adjacent bit lines BLn 2905 and BLn+1 be explicitly shown at top. In an erase operation, the CPWELL is biased to the high erase voltage Vera. The unselected NAND strings will transmit the high voltage to these bit lines. Each of bit lines BLn 2905 and BLn+1 2915 are respectively connected an associated sense amp SAn 2901 and SAn+1 2911 though a switch 2903 and 2913, where sense amps are connect to the switches by an "internal" part of the bit line BLIn, BLIn+1. During erase, the switches 2903, 2913 are shut off, protecting the sense amps' circuitry and keeping the high voltage contained. Due to the layout, however, one bit line (such as BLn) may be adjacent to the BL1 portion, or other sense amp elements, associated with another bit line (such as BLn+1), resulting in a short as represented at 2909. Consequently, for any erase operation the high voltage Vera on the CPWELL will drain off through bit line BLn 2905. If the charge pump supplying the erase voltage in not able to keep up with this leakage, Vera will not be maintained and the erase operation will fail. Although illustrated for a 3D arrangement, this problem can also show up in other architectures, including in 2D arrays. As in the preceding sections, to detect such defects, a test can mimic the stress involved to force incipient failures and then perform a detection phase to see whether the circuit is able to perform the needed operations.

In the stress operation, one or more bit lines are set to the high voltages, while one or more adjacent internal bit lines (BLI) and/or associated sense amp circuits are set to a lower sense amp voltage. Although this can be done by applying the high level directly to the bit lines, most memory circuits typically do not include such connections. Consequently, the exemplary embodiment establishes the high bit line voltage as these would come about through normal circuit operations, namely from the CPWELL. This can be done in a I-plane erase failure stress mode by applying the high voltage to the P-well (e.g., bias ~20-24V) and having all blocks unselected, so the bit lines will couple through the NAND strings to the high voltage, while concurrently setting the sense amp nodes to the (relatively) low sense amp voltages (VDDSA/VDD/VSS). The stress can be applied in either a DC mode for some duration, or in an AC by applying some number of pulses of given durations to the P-well.

Figure 30:
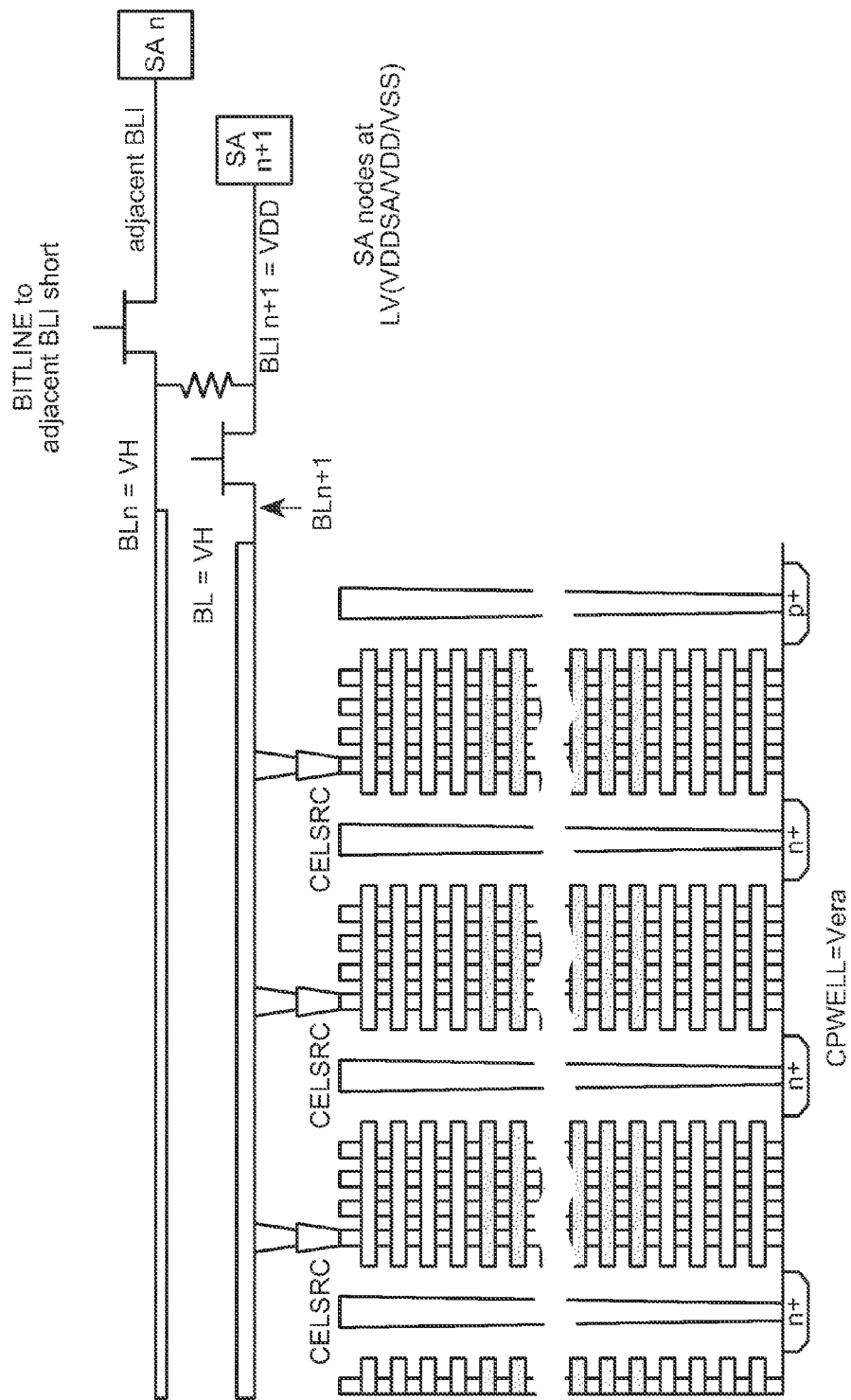
FIG. 30 is similar to FIG. 29, but marked with some of the voltage levels involved in the stress phase of determining bit line shorts.

Any resultant bit line short would drain off the high voltage from the P-well, reducing its ability to effect an erase as the charge pump supplying the high voltage may not be able to keep up. This is used in the detection operation of the exemplary flow by reducing the drive capability of the charge pump and determining whether the erase voltage can be held. For example, the pump clock can be set at the slower end of its range and the Vera voltage being measure internally to detect any droop due to a bit line high voltage-sense amp node low voltage defect/leak. A comparator circuit can use a reference voltage for compassion with the Vera level. Alternately, the pump clock can be set at its slowest and an auto-detect built in self-test (BIST) mode can be based on the charge pump's ON time being, due to the leakage, longer than typical This technique will stress the bit line to low voltage node, accelerating the failure of defects, but without overly stress the memory cells of the array. FIG. 30 is similar to FIG. 29, but marked with some of the voltage levels involved in the stress phase. As discussed above, VH is a voltage level high enough to break weak oxide between the bit lines and the low voltage nodes, but small enough such that there no degradation of the select gates or any other circuit elements. LV is the relatively low voltages used by the sense amp nodes (e.g., VDDSA/VDD/VSS).

In the exemplary embodiment, the blocks are all unselected, with the NAND strings conducting between the P-well and bit lines. This stress mode is chosen so as to minimize effects on cell characteristics to avoid negative effects on reliability and endurance. The stress mode can also be used at system level by applying the bit line to low voltage node stress to catch full plane erase issues prior to programming data into the array. The stress can be applied at time 0 or after some numbers of program-erase cycles.

Figure 31:
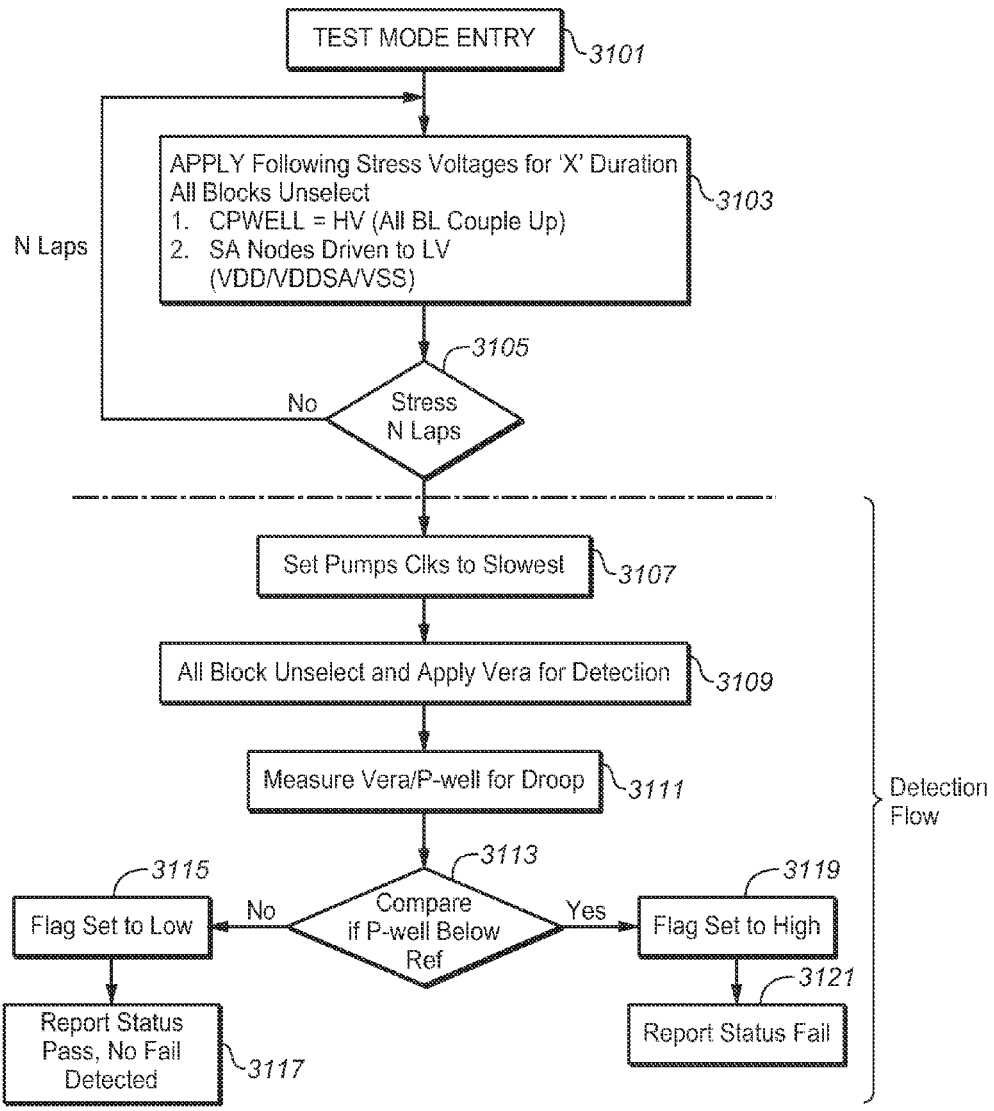
FIG. 31 is an exemplary flow for test process for determining bit line to low voltage shorts.

FIG. 31 is an exemplary flow for these test processes, beginning by entering the test mode at 3101. The stress is applied at 3103, where the duration and voltage levels can be settable parameters. If an AC stress mode is used, this will applied for N loops 3105, where N can also be a settable parameter. In the exemplary detection flow, the pump clock is set to its slowest (3107), all of the blocks in the plane are unselected and the Vera is supplied to the P-well from the pump (3109), and value of Vera on the P-well is measured (3111). At 3113 the P-well level compared against a reference level and if it has drooped, a flag can be set according (here, as high at 3119) and this status can be reported out at 3121. If Vera is maintained, the flag is set (in this example) as low at 3115 and the status reported out at 3117.

Figure 32:
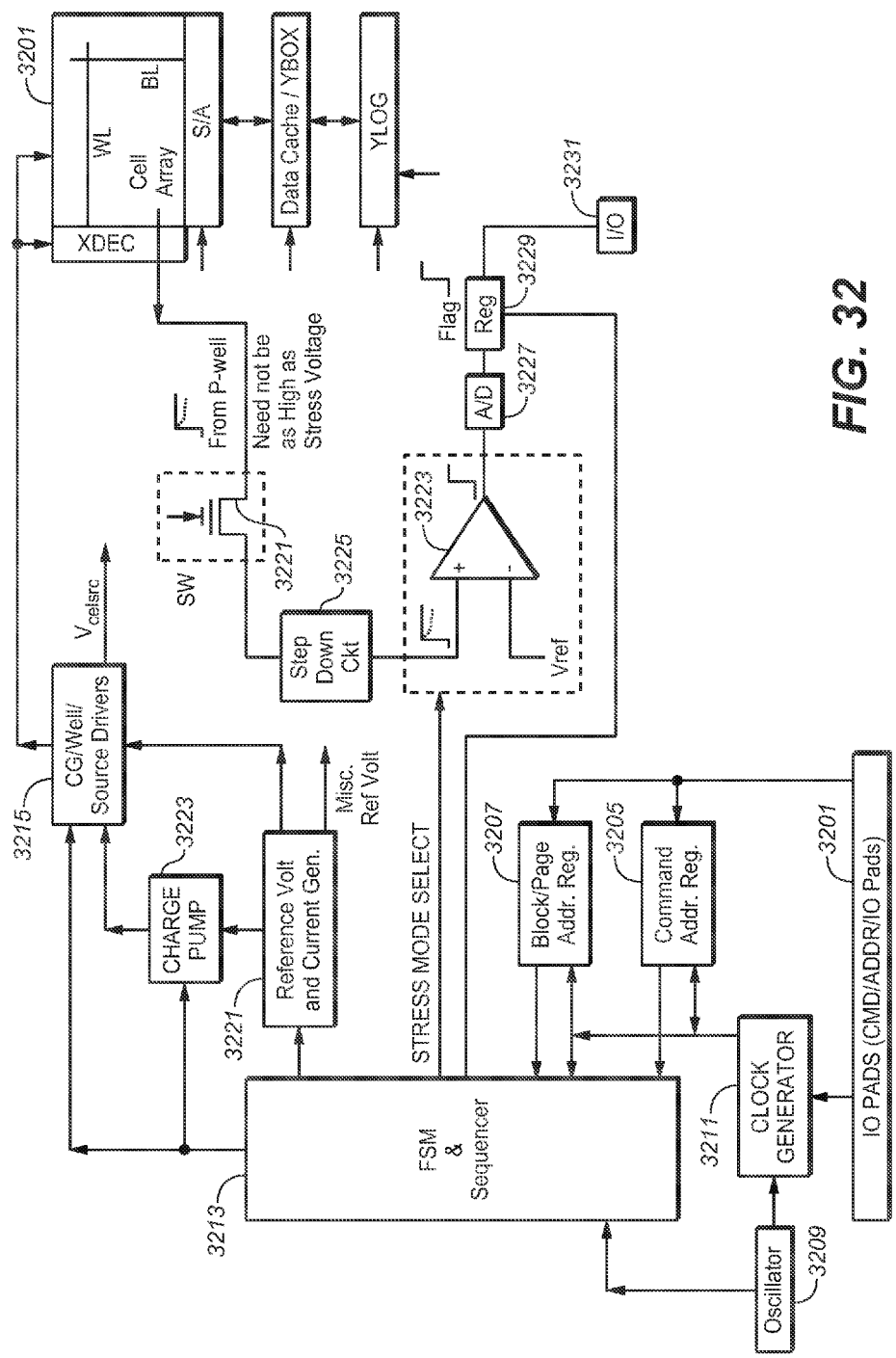
FIG. 32 is a schematic representation of some of the elements on the memory chip involved in the process of FIG. 31B.

FIG. 32 is a schematic representation of some of the elements on the memory chip, similar to (and similarly number to) FIGS. 17, 21 and 28, for implemented the test mode of FIG. 31. During the detection phase as enabled by the stress mode select signal, while the detuned charge pump drives the P-well the switch SW 3221 supplies the P-well level to the comparator 3223. This can be stepped down by the step down circuit 3225 for comparison to a reference level Vref. The output of the comparator 3223 can then be converted to a digital value at A/D 3227 and stored in the register 3229 as the Flag value, where the register 3229 can receive a clock signal from the FSM & Sequencer block 3213 to latch the flag value. The flag value will indicate if the plane failed, and put out at the I/O page 3231 (separated out here form the other pads for illustrative purposes).

AC Stress Method for Bit Line-Defects

The preceding section considered shorts between bit lines and low voltage circuitry related to the sense amps. This section considers techniques for determining other bit line defects, including bit line to bit line shorts, bit line to "memory hole" defects, and resistive bit lines. An AC stress mode is used to accelerate the bit line defects, where this can be applied as a global stress concurrently across all blocks.

The memory hole defect can be illustrated with respect to FIGS. 9 and 12 for a 3D structure. As shown in FIG. 9 the bit lines (BL) run across the top of the structure in the x direction, with the NAND strings formed into the memory in holes that run down into the structure in the z direction. The global bit line then connects to n+ region (see FIG. 12) of a corresponding NAND string at the top; or, rather, it is supposed to connect to the bit line unless there is a memory hole open issue with the various resistive contact involved. An analogous defect can also occur in 2D structures, such as at the location indicated by reference number 56 in FIG. 5, but the additional complexity of the BiCS type structure tends to make them more prone to this sort of problem. This section looks at a stress and detection to catch the memory mole open defect, as well other bit line related defects.

Figure 33:
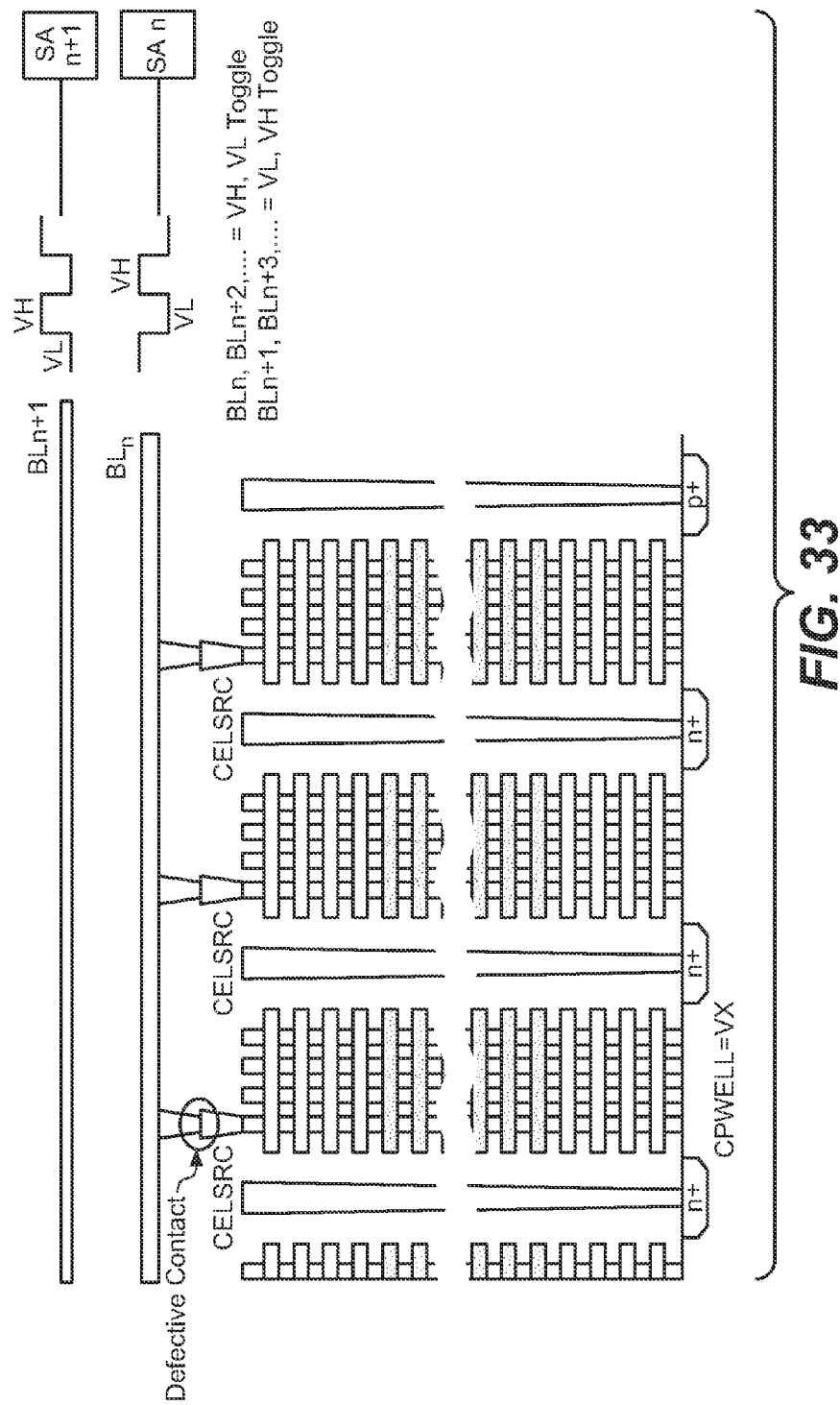
FIG. 33 shows a view of a 3D array structure with an example of a bit line-memory string contact highlighted.

FIG. 33 shows a view of an array structure similar to FIG. 30, but with an example of the contact in question circled. Specifically, bit line BLn is connected to the left-most NAND string of each of the three shown fingers. These bit line contacts to the n+ region for memory hole can be very resistive, causing the string to be very resistive and unable to accurately sense the bits along the string current. Such open/resistive contacts can happen on multiple block locations in the array. A bit line to bit line DC stress is typically not sufficient to accelerate this problem so that it can be caught at time 0 (test time); and a normal read will also not readily detect such resistive bit lines. The following instead uses an AC stress to check for bit line to memory open contacts and other bit line defects.

More specifically, an AC voltage is applied to bit lines, toggling between a high voltage (VH) and a low voltage (VL) (or the other way around), to accelerate the defect. The stress can be applied to single bit lines, groups of multiple bit lines, or as a global stress applied to all of the memory hole contacts concurrently. In the exemplary embodiments, these levels are applied to the bit lines from the sense amps to drive the bit line side of the contacts. The other side of the contact can be driven by the setting the CPwell to a level VX through the memory hole, where VX can be 0V or a negative voltage (e.g. ~−2V), where this level can be set on the well that is then left to float while the AC voltage toggles on the bit line side. Additionally, if the AC stress is applied out of phase to physically adjacent bit lines, this can be concurrently be used as a stress for detecting bit line to bit line shorts. This use of an out of phase AC stress is illustrated in FIG. 33 where SAn is driving BLn at VH when SAn+1 is driving BLn+1 at VL, and vice versa. For example, this can be used at a global bit line level by concurrently driving the even and odd bit lines out of phase with one another.

Figure 34:
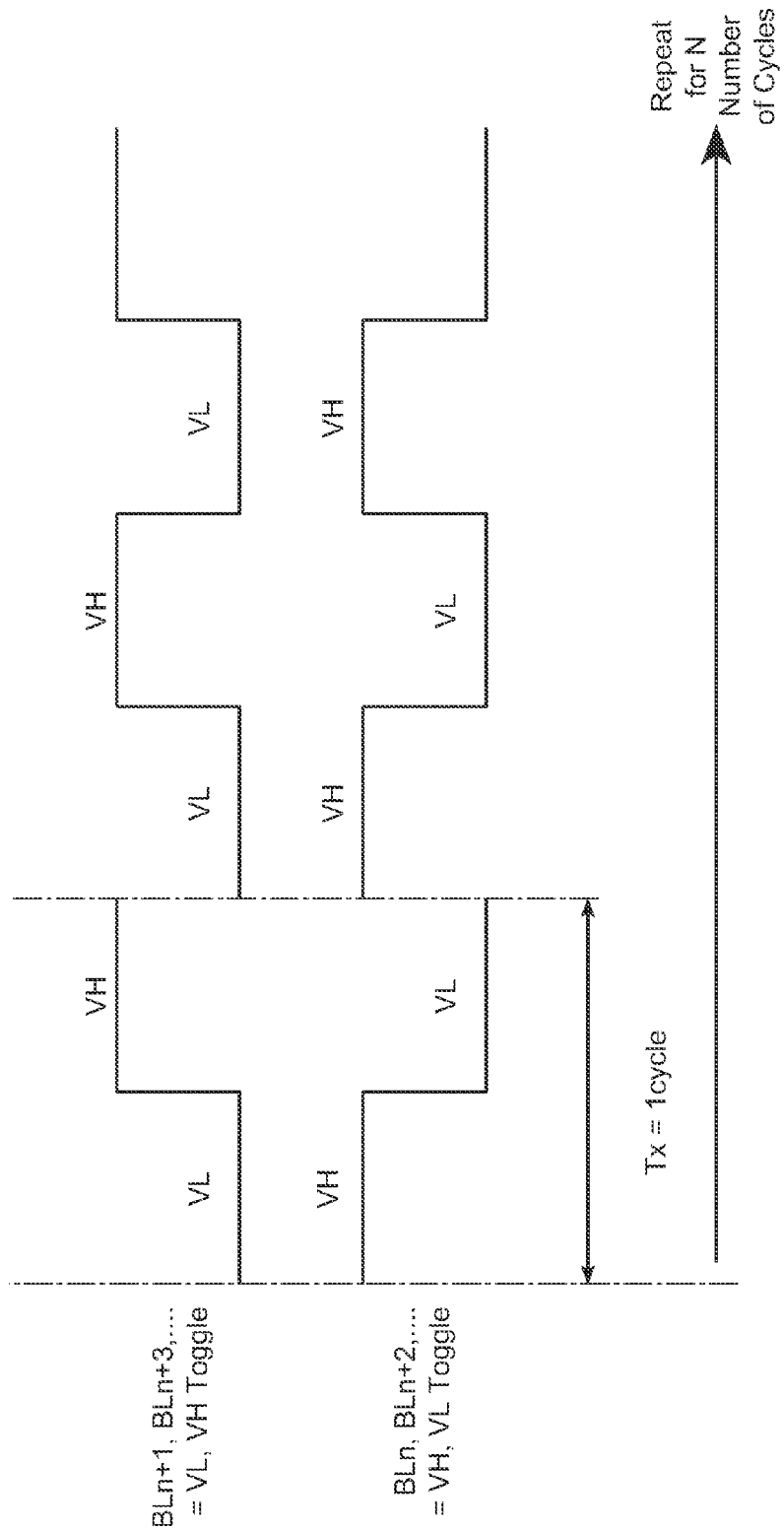
FIG. 34 represents an exemplary set of waveforms for the AC voltage applied to the bit lines.

An exemplary set of waveforms for the AC voltage applied to the bit lines is represented in FIG. 34. The cycle time Tx and the number of cycles N can both be settable parameters that can be determined as part of device characterization. The VH value applied by the sense amps can be a regular operating value of sense amp, such as VDDSA (~3-4V), or a higher level used for this purpose. VL can be 0V or VSS. The level on the CPwell can be set at VX=0V or even a negative level such as −2V and then left to float while the stress is applied.

After the stress phase, a detection phase follows. The detection check for bit line to memory hole open contacts can be done across all blocks, checking one block at a time. All of the blocks to be checked are erased and then read against the expected erased block result (an all FF data pattern). An open contact would correspond to a string not returning the expected result. For the detection, the read can be modified to pre-charge the bit lines to a higher voltage and the sensing time reduced to more effectively detect any resistive strings. This can also be followed by a check for bit line to bit line shorts by programming and reading back data; for example, a random data pattern can be written in and read back, similar to the process described for word line to word line shorts as described with respect to FIG. 16. Any defective structures can be marked as bad, where this can be done at the string or block for a bad contact or at the column level or bit line level for bad bit lines.

The techniques of this section have system level advantages. At the system level, highly resistive memory holes can be detected as described above and marked as "unrepairable" or replaced with redundancy or extra strings (local columns) available at the block level. The AC stress mode and detection be performed as part of a built in self-test process as well as being applied at system level to accelerate bit line to bit line short, resistive bit lines and marking of bad columns.

Figure 35:
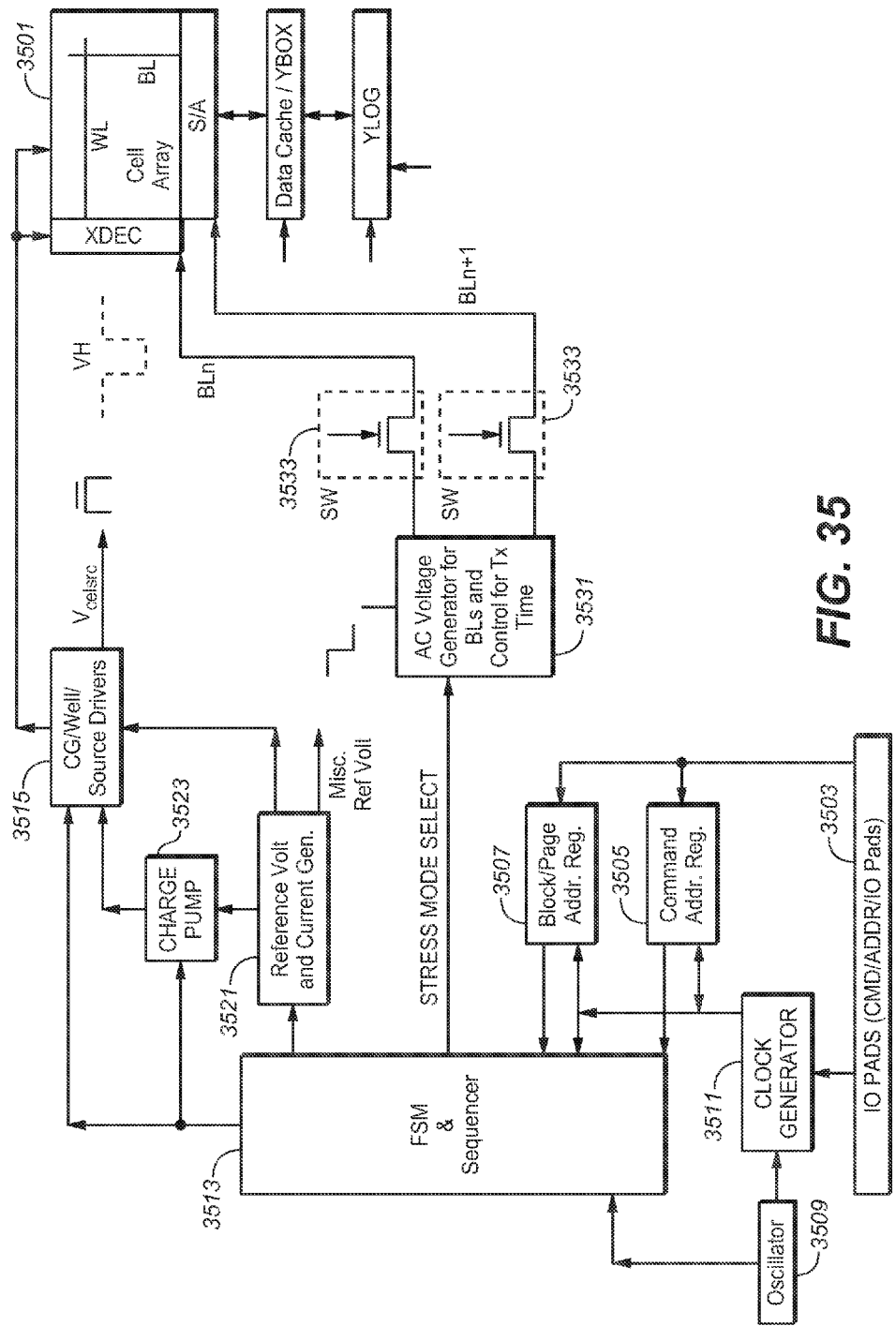
FIG. 35 is a schematic representation of some of the elements on the memory chip for applying an AC stress to bit lines.

FIG. 35 is a schematic representation of some of the elements on the memory chip, similar to (and similarly number to) FIGS. 17, 21, 28, and 32, for implementing the AC bit line test mode of this section. During the detection phase as enabled by the stress mode select signal, the block 3531 is the AC voltage generator for the bit lines. This will apply the VH levels through the switches 3533 and 3535 respectively to the even and odd bit lines with the time as controlled by the period Tx. For detection, the sense amps in the peripheral circuitry can pre-charge the bit lines to higher voltages and reduce sensing time to detect any resistive memory hole.

Improved Techniques for Detecting Broken Word Lines

This section returns to the consideration of word line related defects, and more specifically to techniques for the detection of broken word lines. As with the earlier sections, the techniques present here can be combined with the various features found in US patent publication number 2012-0008405 and other references cited above.

Figure 36:
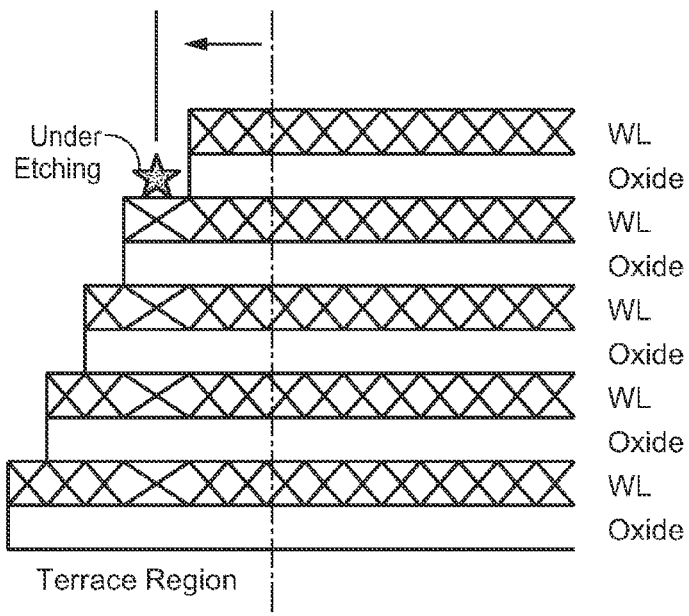
FIGS. 36 and 37 illustrate some examples of broken word lines in a memory array.

Considering the problem of broken word lines in the context of a BiCS memory as illustrated in FIGS. 9-12, a word line can be broken in several ways. A first type of broken word line relates to the routing between the word line decoding circuits and the portion of the word lines along the control gates. Referring to FIG. 10, the terrace region to the sides of the memory columns are etched to form a stair case area for the lines from the decoding circuitry to hook up. Along the stair case area of the terrace region, the lines from the decoding circuitry run over the structure and an interconnect drops down to connect to the corresponding word line. This is illustrated in FIG. 36 where a number of word lines (WLs) are separated by oxide layers, where the memory cell region is to the right of the broken lines and the terrace region to the left. To connect to the corresponding step, the oxide (and other layers above the word line) need to be etched away. In the case of an under-etch, the interconnect connection to the word line will be highly resistant. An analogous defect can occur in 2D memory structures, but the particulars of the BiCS and similarly structures are particularly prone to this type of defect.

Figure 37:
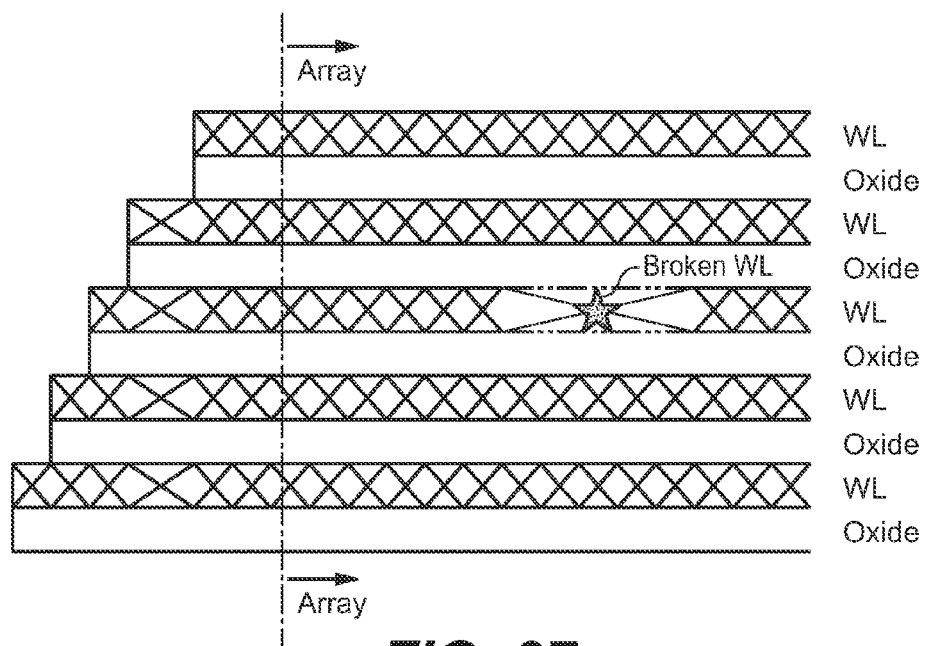

A second type of word line break is illustrated in FIG. 37 where, due to non-uniform word line thickness, a high resistance can occur in the middle of a word line. This is much as described in US patent publication number 2012-0008405.

For either sort a break, a relatively high resistance will result along the word line so that when a voltage is applied to the word line, the portion of the word line on the far side break will charge up more slowly. For the sort of break illustrated in FIG. 36, this will affect all of the memory cells along the word line. For the sort of break illustrated in FIG. 37, memory cells on the far of break (to the right, as drawn in FIG. 37) will be affected. When a voltage is applied along word line, whether a sensing or programming voltage, the control gates of the affected cells will charge up more slowly than for the non-affected cells, as illustrated in FIG. 38.

FIG. 38 shows a programming waveform of an increasing amplitude staircase of programming pulses alternating with verify operations. The broken line illustrates the desired waveform. On the far side of a break, however, the voltage level seen will be as shown in the solid line due to the resistance at the break. The lower of the effective programming pulse, so that memory cells seeing this reduced pulse will take more pulses to write, if they can even be successfully programmed to verify at their target states. As the break will also affect the memory cell's gate voltages for the verify operation, so that the determination of threshold voltages after a pulse will be inaccurate. As the program pulse voltage (VPGM) and verify voltage (VFY) are both lower for the affected cells, there threshold distributions (Vt) are shifter lower, as illustrated in FIG. 39 for a four state per cell (Er, A, B, C) embodiment. In FIG. 39, the solid lines shows the desired distribution and broken line represents the leftward shifted cells that can result from broken word lines. As both pulse and verify level are lowered, an effected cell may appear to pass (successfully verify) after some extra pulses, but still not be sufficiently programmed. Consequently, a broken word line test of this sort based on a standard program operation may not be sufficient to catch very resistive broken word lines based on the relative number of additional programming pulses as this can also occur due to process variation, with resultant yield loss and erroneous detection of broken word lines.

This section looks at two methodologies for detecting word line breakage. In a first of these, an algorithm uses a modified programming process where the verify's sensing operation is elongated. This can be used to detect broken word lines of the type associated with both FIG. 36 and FIG. 37. This methodology can also be applied to memory structures (such as those of BiCS type) that have programmable select gates in order to determine broken select lines. In an exemplary embodiment, an internal circuit on the memory device can detect the delta of program pulses between good control lines (i.e., word lines or select gate lines) and broken control lines to identify the broken control lines. In a second set of methodologies that is useful for the sort of break illustrated with respect to FIG. 36, differences in ramp-up times for a word line (or select line) when a VPGM or other voltage is applied can be used to differentiate good word lines (or select lines) from those with hookup related failures.

Looking at test program operation with the elongated verify, it is useful to have a good word line baseline calibration. This can be done by detecting the average number of pulses (NP) for good word lines using a standard programming staircase for the VPGM pulse values and pulse widths and standard very VFY voltages and timings. The number of pulses for a given word line can be represented as NP=N+p, where N is the average number of pulses for a good word lines and p is a variation from the average. The average N can be calibrated and record the value in internal latch. Depending on the embodiment, the N value can be the average of a block or set of blocks (such as a plane or die), where outliers can be ignored, or word line to word line variations within a block can be used, as discussed in more detail in the references cited above. If the delta p is in the variation range of, say, 2 or 3 loops from the average, then this can be considered to be process variations for normal word lines.

After the good word line calibration, broken word lines can then be detected by a test program operation to determine the number of pulses when using the target program level and pulse width, and where the verify voltage VFY is again the target value, but with an elongated verify time. A parameter can be used to change this verify time.

Figure 40:
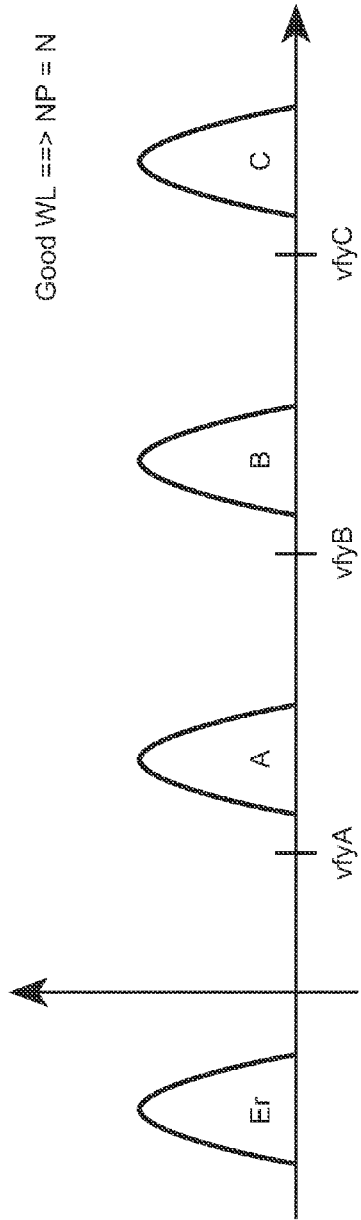
FIGS. 40 and 41 show the desired distribution of states and a standard program/verify waveform.
Figure 41:
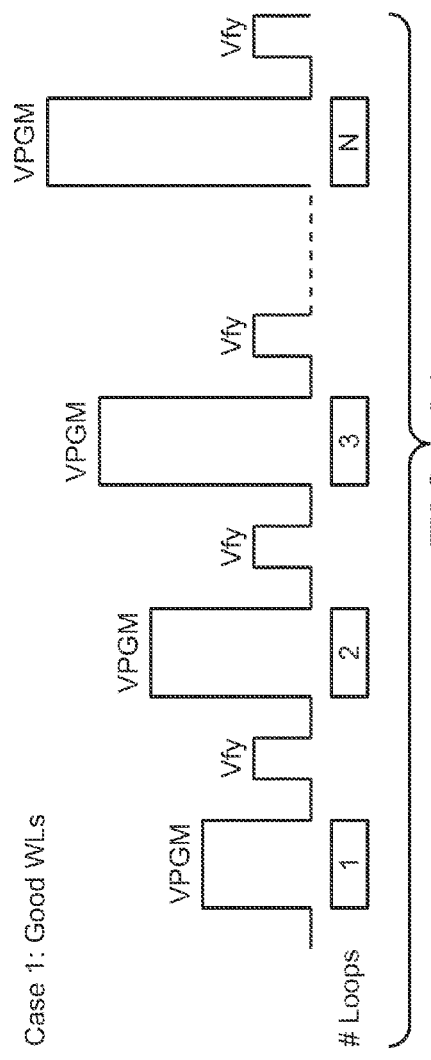
Figure 42:
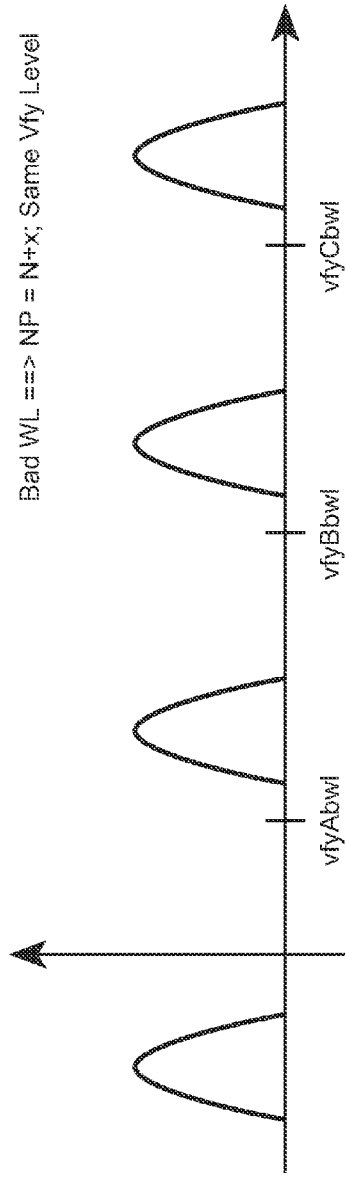
FIGS. 42 and 43 show a distribution of states and a modified test program/verify waveform with an elongated verify.
Figure 43:
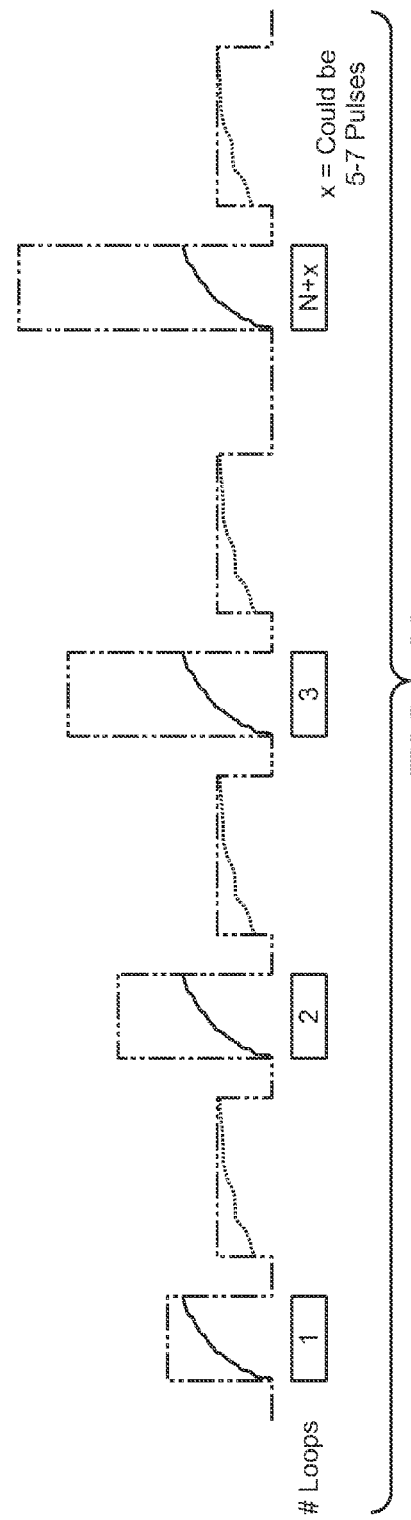

For reference, FIG. 40 shows the cell distribution for a properly programmed cell population in a four state per cell embodiment, where vfyA/B/C are the target verify levels. FIG. 41 is a standard program pulse/verify word line waveform. For simplicity, only single state verify is shown between pulses, although multi-state memories typically include multiple verifies corresponding to different states between at least some pulses. FIGS. 42 and 43 are the corresponding figures for the elongated verify test program operation.

As in FIG. 38, FIG. 43 shows the applied word line waveform as the broken line, inside of which is the voltage as seen on the far side of the break. By increasing the verify time relative to a standard write, the broken word line can develop to reach the target Vfy level, so that there is no longer the shift in the distribution, although this can require a significantly higher number of VPGM pulses. In this embodiment, the broken word line verify levels (vfyAbwl, vfyBbwl, vfyAbwl) are taken the same as the corresponding standard verify levels because of the slow program verify times. The number of programming pulses for a broken word line is then NP=N+X, where is a delta above the average. The NP value can then be recorded to check for a bad word line. If the delta X is greater than, say, 3 loops, this can be reported out as a suspected broken word line failure for the word line. (If N+X=Y, for some limit Y, then a fail status would result since program loop reaches a maximum value.)

In terms of system side implementation, the memory system can monitor an in-build Delta X loop count for any abnormal word lines from the memory chips and keep a backup copy of data on those word lines only. This can then be used broken word line failures during reads that lead to an uncorrectable ECC error. This sort of arrangement can be complementary to the various post-write read and enhance post-write read (EPWR) techniques described in US patent publication and patent numbers US-2011-0096601; 2013-0031431; U.S. Pat. Nos. 8,566,671; and 8,726,104.

Figure 44:
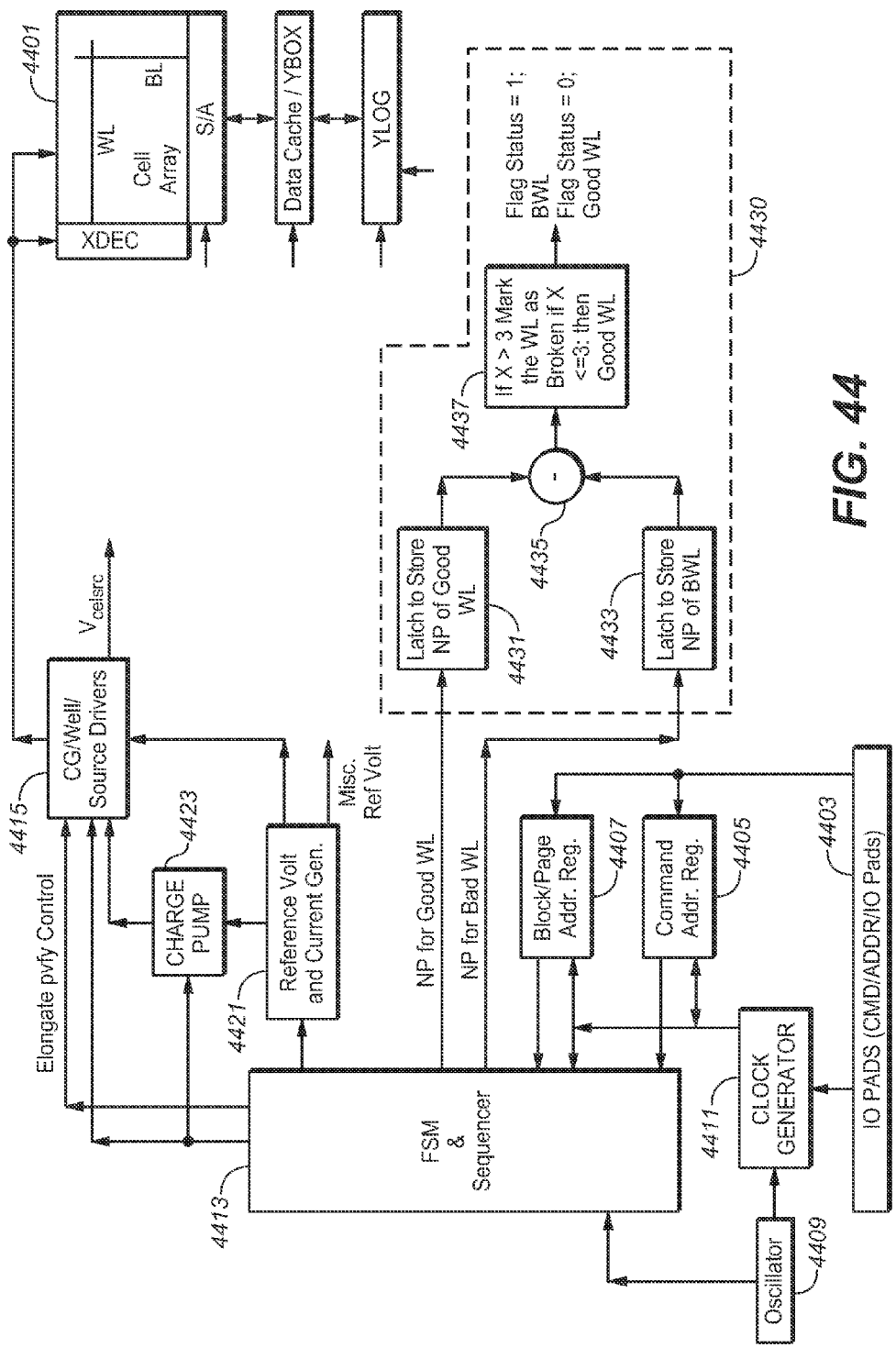
FIG. 44 is a schematic representation of an embodiment for some of the circuitry that can be used in determining whether a word or select line is defective based on the test program.

FIG. 44 is a schematic representation of some of the elements on the memory chip, similar to (and similarly number to) the similar figures of the preceding sections, but with the elements pertinent to the present discussion explicitly included at 4430. The reference value for the number of pulses expected for programming of a good word line is latched at 4431. To determine whether a word line is bad, the number pulses used to program a word line in the test program can be latched at 4433, with the reference value subtracted at 4435 and compared by logic at 4437. (Although shown to be separate for the discussion of this section, these function can be part of the general control logic of the chip in block 4413.) If the WL meets the good word line criterion (here X≤3) it is marked as good, if it fails it is marked as bad and the status flags marked accordingly.

By elongating the verify time, the accuracy of determining bad lines is improved relative to the standard verify timing. At the system level, the number of pulses can be monitored and used to detect any word lines end of life. As noted, this technique can be applied to broken select gate lines as well as word lines, although a separate calibration may be used for the select gate lines.

A second of methodologies for determining broken word line looks at the rate at which the interconnection circuitry the word line decoder circuitry and the word line itself charges up when driven through the decoder. If the word line is broken at some point along this interconnection line, the high resistance at the break will restrict the current flow causing the interconnect line to charge up more quickly. Consequently, this approach can be particularly effective for breaks of the sort illustrated with respect to FIG. 36 or other breaks between the driver and the control gate portion of the word line, although it can also be used to determine breaks on the control portion near the interconnect. This is effect is illustrate in FIG. 45.

Figure 45:
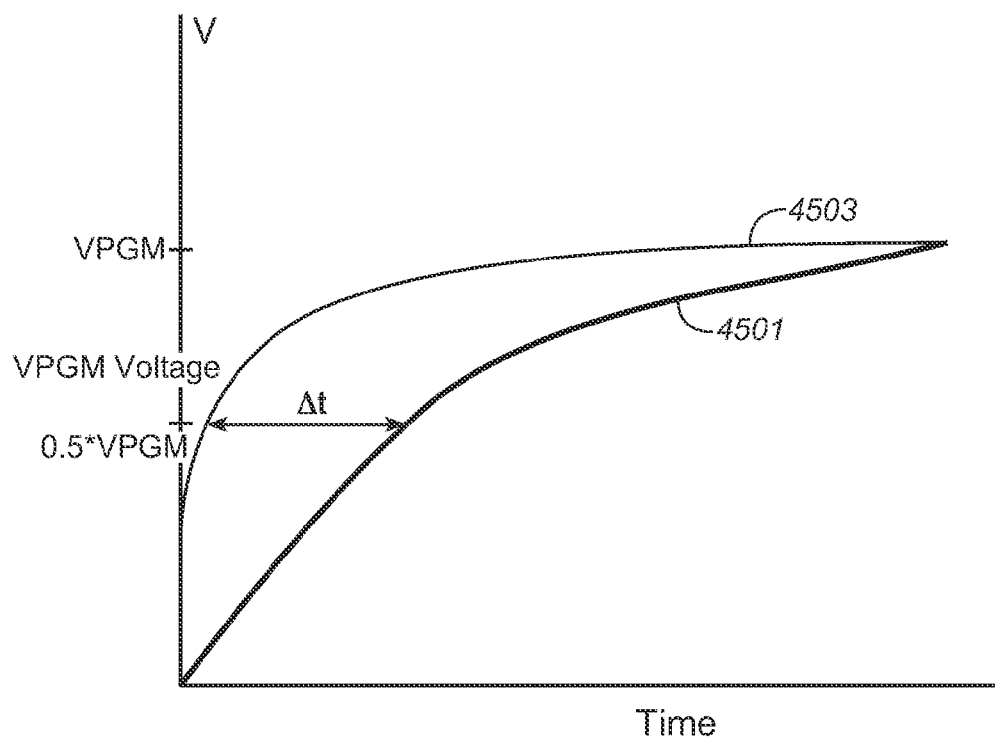
FIG. 45 illustrates the rate at which a broken word line may ramp up relative to a good word line.
Figure 46:
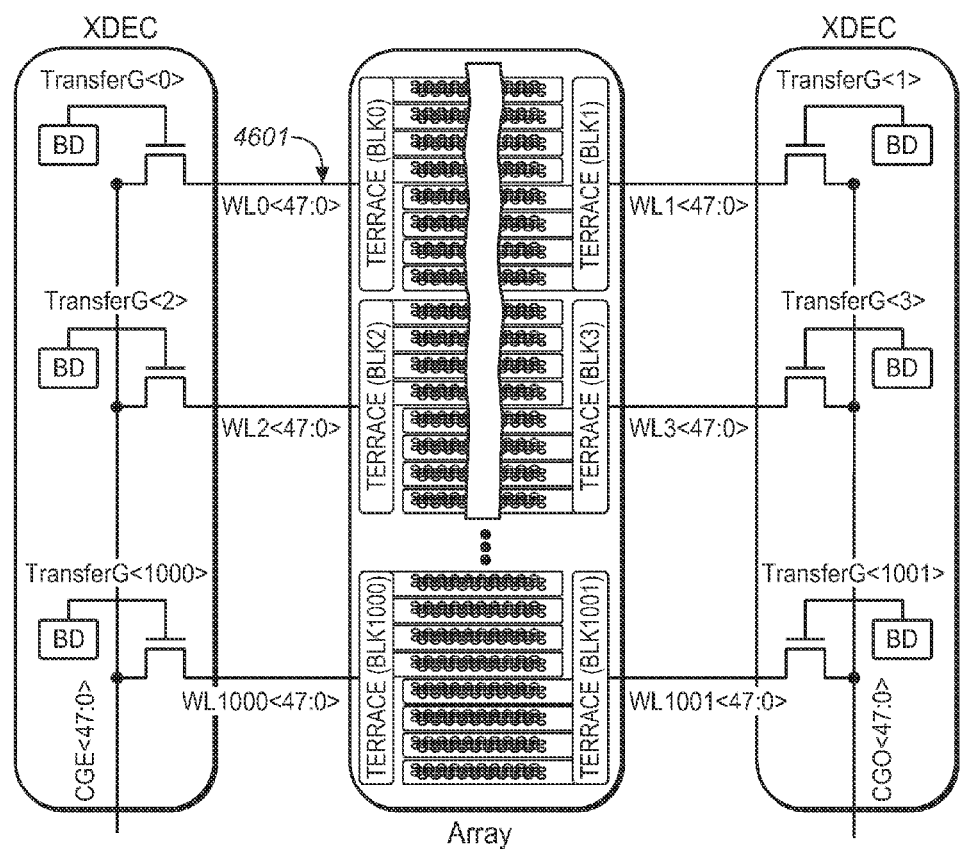
FIG. 46 shows an example of a point after the pass transistor where the slopes in FIG. 45 can be measured for a word line or select gate line.

In FIG. 45 the line 4501 represents the ramp up rate for a normal word line and 4503 represents the ramp up rate for a word line with a defect such as the under etch shown in FIG. 36. In this example, the applied voltage is a programming voltage VPGM, since this effect will typically be more pronounced for higher voltages, but other voltage levels can be used. Note that this technique can also be applied to determining similar break in select gate lines. In any of these cases, as the broken word line ins highly resistive at or near the beginning or the word line, the driver will not see the complete capacitance resulting in the quicker ramp up. An analog circuit can then detect the time difference Δt between a bad word line and a good word line to reach, say, half of the applied voltage. FIG. 46 shows some of the same elements as in FIG. 21B to show at 4601 an example of a point after the pass transistor where this slope can be measured for a word line or select gate line.

Concurrently Selection of Multiple Word Lines for High Voltage Stress

A number of stress modes can involve the application of high voltages to word lines, such as various stress modes described above or in US patent publications: 2012-0008405; 2012-0008384; 2012-0008410; 2012-0281479; 2013-0031429; 2013-0031429; and 2013-0229868. For example, control gate to substrate or floating gate to control gate shorts can be checked by programming the word lines to the highest states. Typical decoding/driving circuitry can only apply a programming or other high voltage to a single selected word line per block. For a stress mode using such a high word line voltage, having to do a single word line per block can be have a large test time impact. Alternately, concurrently selecting all word lines across multiple blocks to receive a program voltage would greatly speed up the process, but would place great demand on the charge pump circuitry providing the voltage and generally stress the memory circuit. To improve upon this situation, the present section presents a memory circuit structure and corresponding techniques with a stress mode where multiple words within the same block can concurrently be selected to receive a programming or other high voltage, while non-selected word lines can receive the pass voltage as used for non-selected word lines in a standard program operation and non-selected blocks can be left to float.

Figure 47:
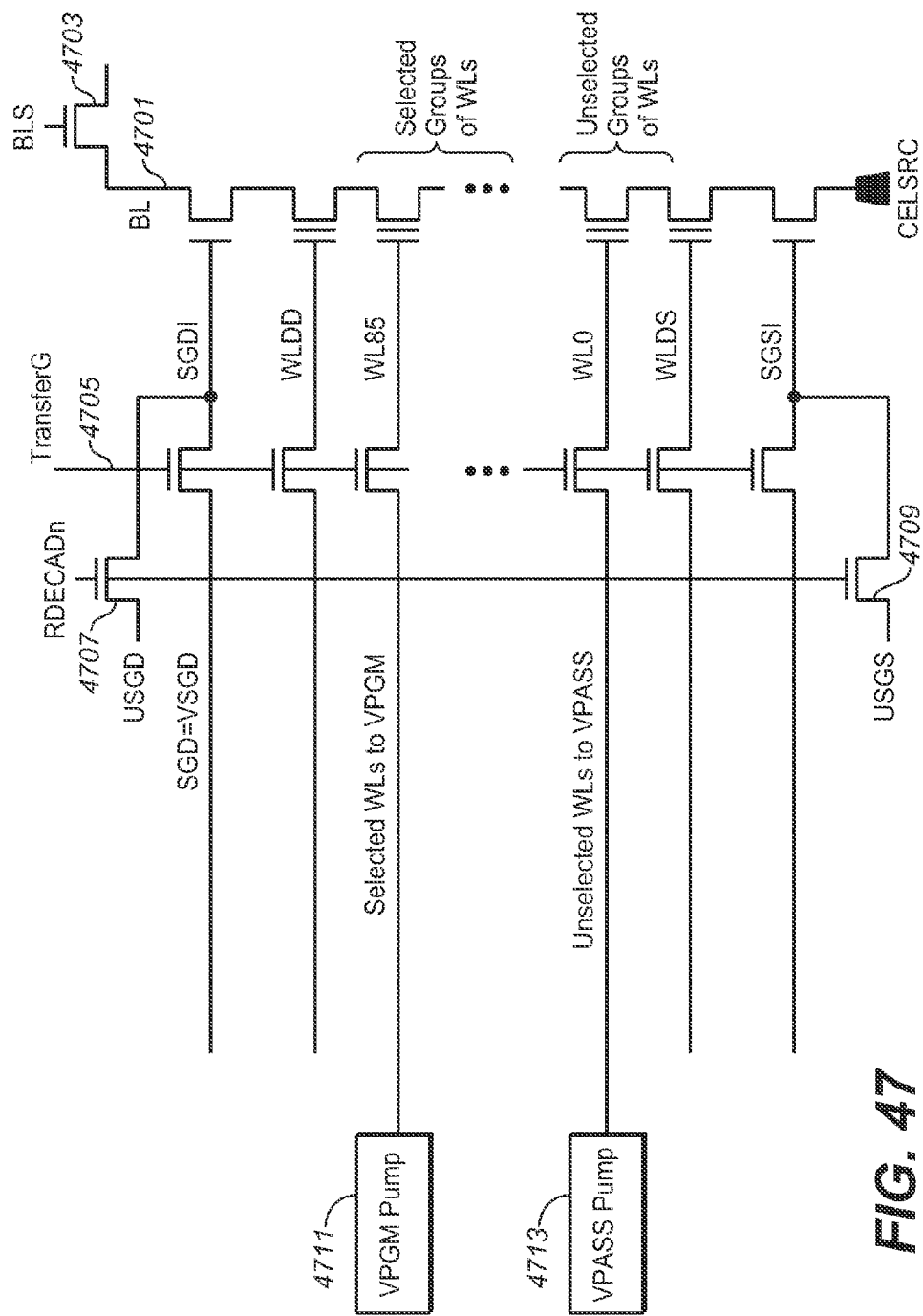
FIGS. 47 and 48 respectively illustrate 2D NAND and BiCS based examples.
Figure 48:
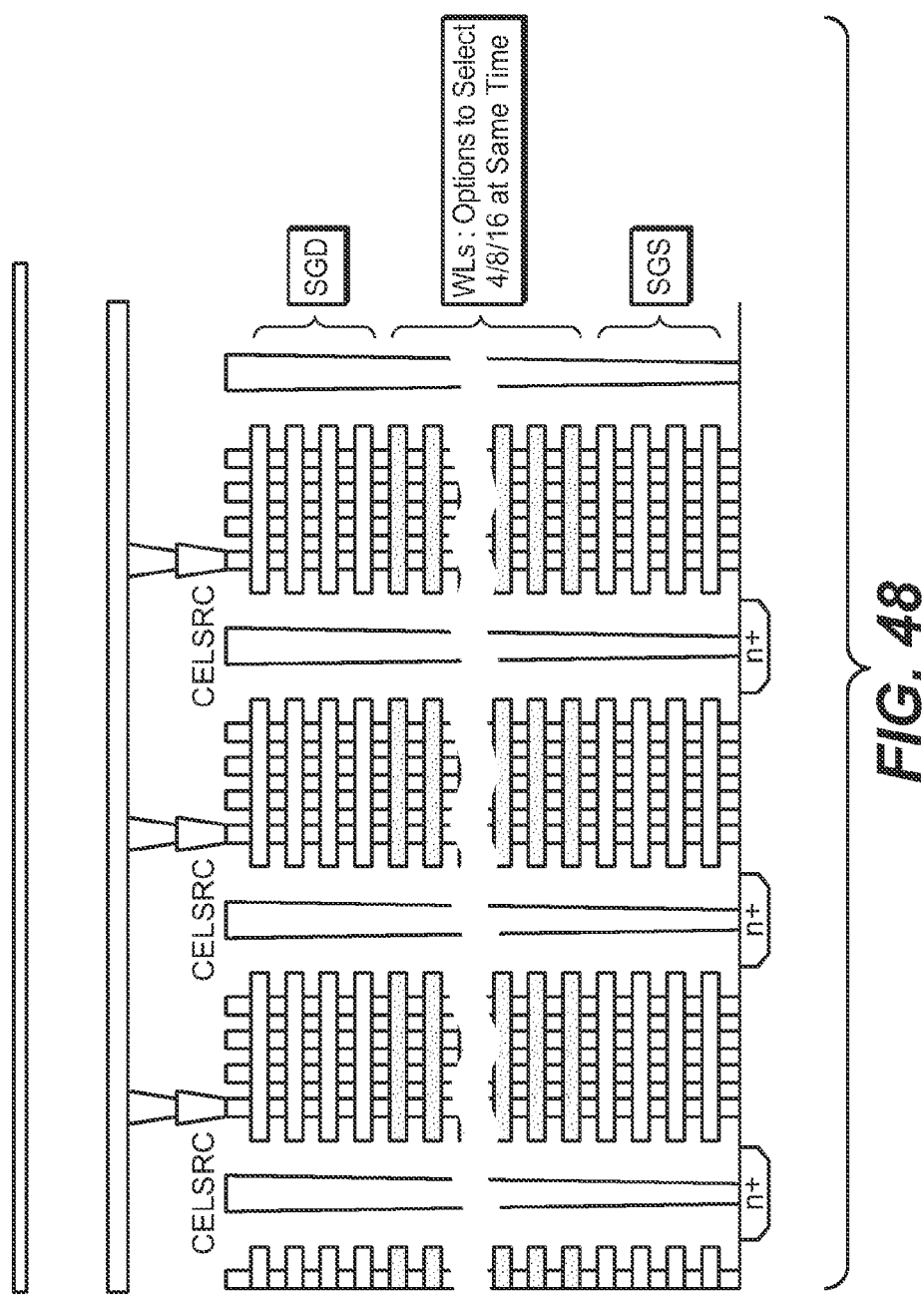

More specifically, a multi-word line select option for a given block can be used for a group of selected word lines to be set to the a programming voltage VPGM or other high voltage, while the unselected word lines of the block are set to Vpass to minimize electric field differences in order to avoid disturb. For example, a group of selected word lines could number 4, 8 or 16. In an exemplary embodiment, the multi-word line option can be applied to one block per plane, so that if there are two memory planes, for example, two such blocks can be selected simultaneously for the multi-word line option for those blocks. FIGS. 47 and 48 respectively illustrate 2D NAND and BiCS based examples.

FIG. 47 shows a representative NAND string 4701 supplied along bit line BL on the drain side through bit line select switch BLS 4703 and on the drain side to the common source line CELSRC. In this example, memory cells 0-85 are connected in series along word lines WL0-85 between source and drain select gates SGS and SGD, where a dummy word line WLDS and WLDD is included on either end. Operating voltages for the word lines are supplied by the various bias and driving circuitry, here represented by charge pumps supplying the programming voltage 4711 and pass voltage 4713. The decoding circuitry to selectively apply these voltages along the word lines is represented by the transfer gates connected along the line TransferG 4705. A pair of gates 4707 and 4709 is also included as an additional path to set select gate levels. As shown, an edge group of word lines on the drain side is selected to receive Vpgm, the drain select gate is set VSGD, and unselected word lines are set to Vpass; that is, the string can be biased as typical for programming, but with more than a single word line receiving Vpgm. Here the selected word lines are an adjacent set, but other embodiments can have varying levels of interleaving between the selected and unselected word lines. Any dummy word lines can be treated as for other non-selected word lines.

FIG. 48 is a counterpart of FIG. 47 in the contest of a BiCS type memory such as described above with respect to FIGS. 9-12. The multiple select gates SGD and SGS on either end can be biased as in a standard write. For the word lines, a set of, say, 4, 8, or 16 of these can be selected to receive concurrently the high voltage, while the rest get the pass voltage. The selected groups of word limes, where the different numbers (e.g., 4, 8, or 16) can be set by a parameter, can then be biased to Vpgm as supplied by the corresponding charge pump. The unselected word lines are biased to Vpass by the Vpass pump, or, if the circuit is using a high voltage (such as 12V) poser supply, by a drop down regulator circuit.

For any of these arrangements, being able to simultaneously stress at a high voltage more than a single word line per block can improve the defect detection process both in the number of stress modes available and in terms of the level of parallelism that can be used. In terms of the degree of parallelism obtainable from a multi-word line select of a single block, a single word lines from a similar number of blocks could be concurrently stressed and obtain the same amount of parallelism; however, not just the selected blocks are biased in this process, but also any non-selected word lines of selected blocks are also biased to the Vpass. Consequently, a multi-block, single word line would use much more current and power from the charge pumps, possibly to the point that the pump will collapse, that the equivalent single block, multi-word approach and also word lines with the Vpass level many more times.

Figure 49:
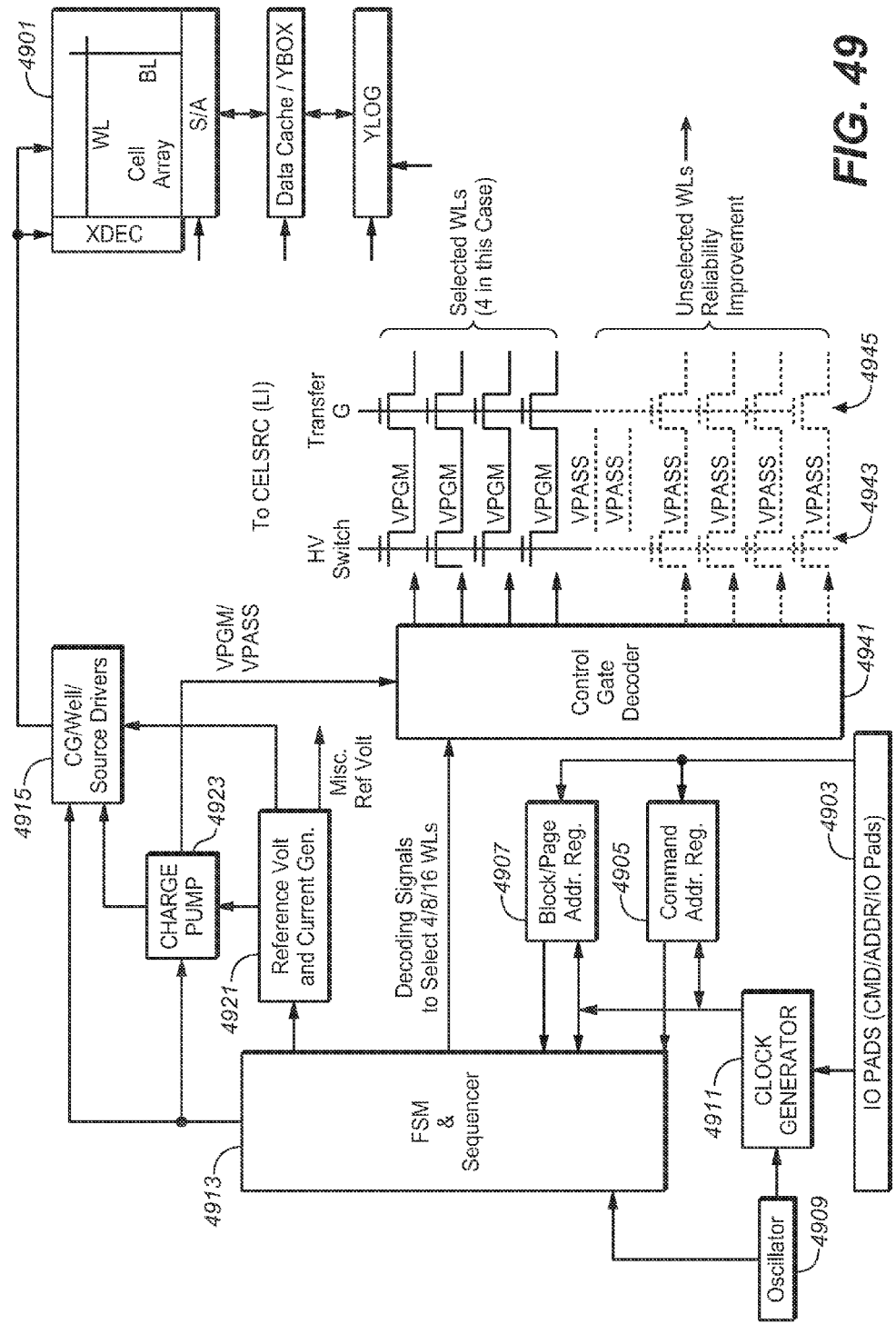
FIG. 49 is a block diagram that highlights some circuitry involved in a multi-word line select test mode.

FIG. 49 is a block diagram that highlights some circuitry involved and is similar to, and similarly numbered as, FIG.

44 and other such figures above. In particular, the control gate decoding circuitry and passed gates used to biased the word lines of the array 4901, which can be of the 2D NAND or BiCS variety, for example, is singled out. The charge pump circuits 4923 supply the control gate decoding block 4941. Based on the decoding signals from block 4917, the selected word lines are the supplied with Vpgm through the high voltage switches along 4943 and transfer gates along 4945. Vpass is similarly supplied to the non-selected word lines.

The use of this multi-word line select more can provide for better control of voltage levels when used in test modes with creating big electric fields between the selected and unselected word lines, helping to lower the amount of disturb. As multiple word lines are concurrently set high, control gate to substrate stress test modes can be greatly accelerated relative to a single word line stress, as can various word line to word line, flash write, and control gate to floating gate stress modes.

Multi-word line select can also be used to monitor critical dimension (CD) differences of word lines. Memory devices can have significant word line CD variation between early (toward source side), middle, and end (toward drain side) word line groups. The ability to apply high program voltages concurrently to multiple word lines can help to bring this issue out at test time.

The word line grouping methodology can be used for early word line screen to detect reliability issues and also simplify word line tests at the system level as it can be applied to groups of word lines within a block. As an example of a test implementation that can be performed at die sort for word line dependency issues, some sample block can be selected in which word line groups can be programming with an elevated programming voltage. By using groups of word lines, this only needs to be done a few times: for example, if groups of 16 are used on blocks of 48 word lines, only 3 programming are needed. The pulses can then be examined to whether some word line groups are faster or slower than others.

Erase Stress and Delta Erase Loop Count Method for Various Fail Modes

Figure 50A:
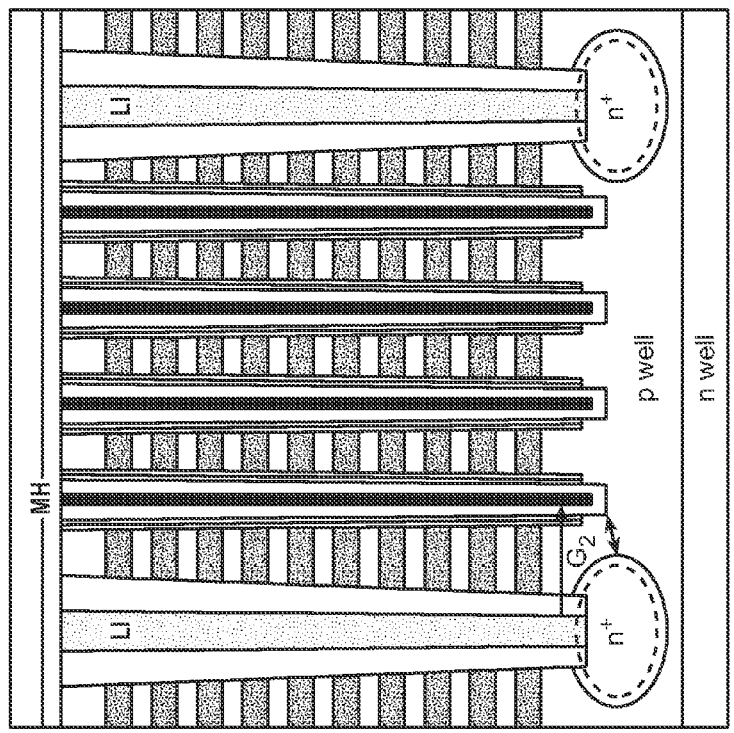
FIGS. 50A and 50B respectively illustrate a BiCS structure a good and bad local interconnected to memory hole (LI-MH) spacing.

This section considers the issue of erase disturb related to local source line interconnect (LI) to memory hole (MH) overlap. FIG. 50A illustrates an example of a BiCS type structure with good LI-MH spacing, where the spacing d1 is sufficient and the change of and n$^+$p overlap is less. At time 0, the interconnect resistance will be low. During erase, holes do not see n$^+$p overlap region electrons, there is no band to band tunneling, and erase disturb is not an issue.

Figure 50B:
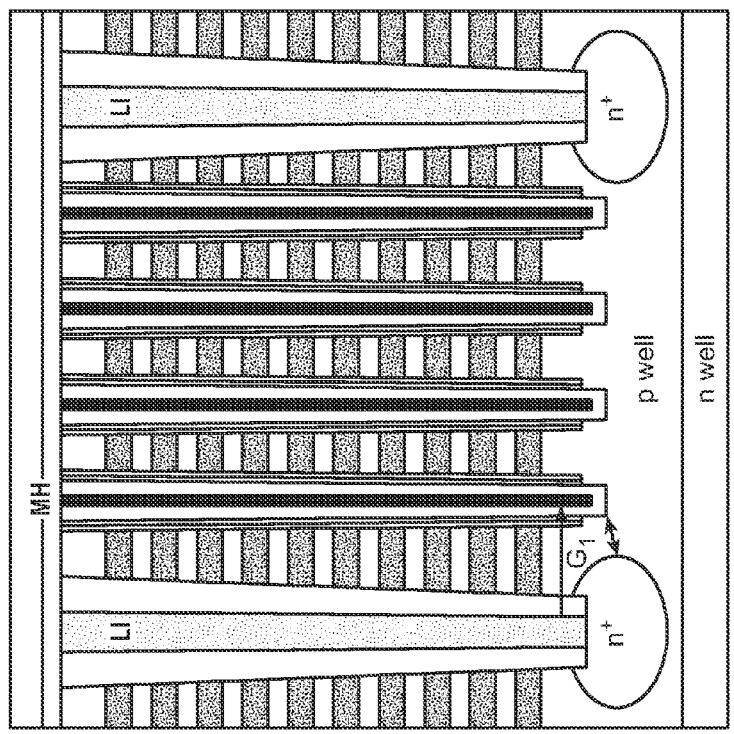

FIG. 50B illustrate poor LI-MH spacing, where the spacing (d2) is short (d$_2$<d$_1$) and n$^+$p overlap chance is increased. During erase, holes recombine with n$^+$p overlap region electrons (band to band tunneling), leading to erase disturb.

FIG. 51 illustrates a mechanism of erase disturb due to shallow erase. As shown at bottom left, there is recombining as there is n+ overlapping towards the adjacent memory hole. Recombination causes very few holes to reach the vertical substrate, leading to shallow erase.

Figure 52B:
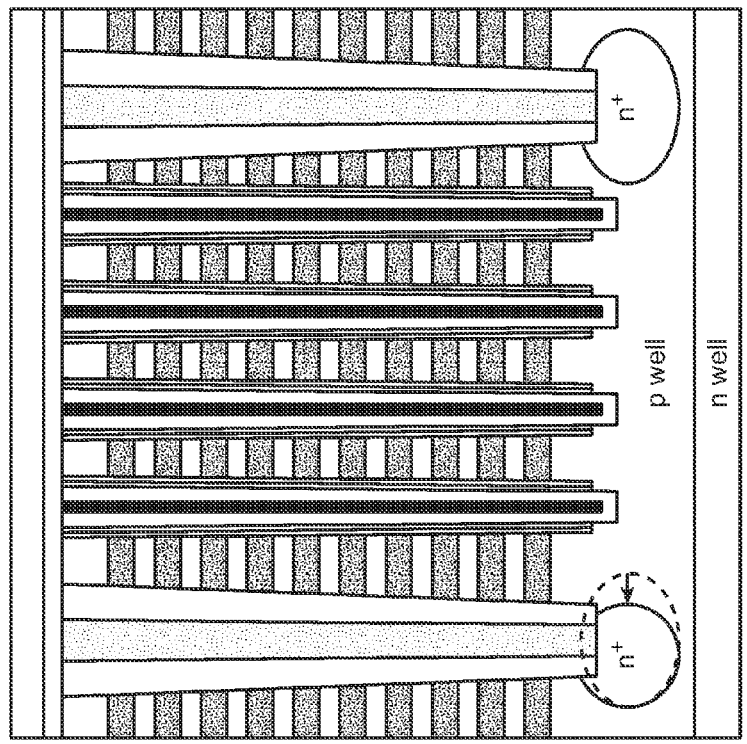
FIGS. 52A and 52B respectively illustrate erase disturb due to LI-MH bad spacing at time zero and after cycling.
Figure 52A:
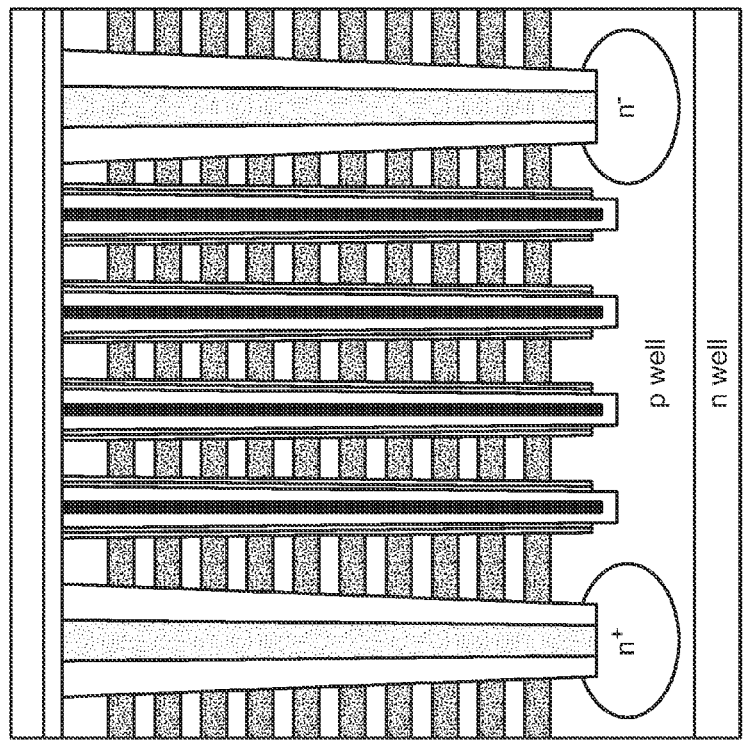

FIGS. 52A and 52B considers erase disturb for non-selected blocks. FIG. 52A shows an example of bad LI-MH spacing at t=0, when the device is fresh. FIG. 52B shows the non-selected block after cycling. Due to recombination, the n+ doping region becomes depleted, causing the overall string resistance to increase, leading to erase disturb issues. This issue will not be seen if the spacing between the local interconnect and adjacent memory hole is to the specification as there will not be many e-hole re-combinations.

Figure 53A:
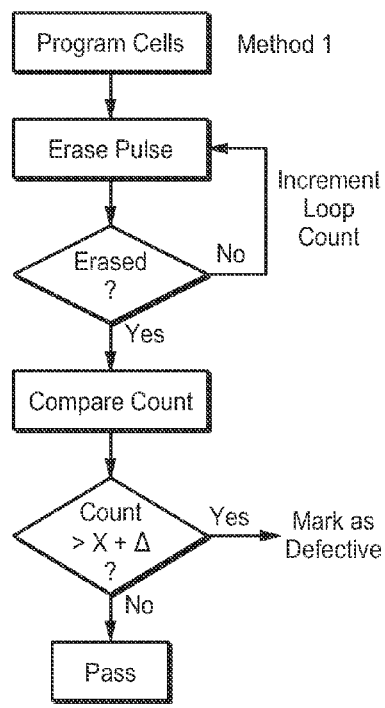
FIGS. 53A-53C are exemplary flows for erase Stress and a delta erase loop count method.

An embodiment of a first method to detect shallow erase caused by LI-adjacent MH spacing issues is illustrated with respect to FIG. 53A begins with, at time 0, programming all cells to, for example, to a lower middle state or "C" or "2" state. This is followed by an erase operation: If the spacing is too close, then, as described above, there will electron-hole recombination and only a few holes will be able to reach vertical substrate leading to an upper tail of erase stated, or a shallow erase. Defective blocks having LI-adjacent MH with insufficient spacing will require more erase loops than non-defective blocks. The variation in the number of erase loops (delta) of this erase loop count will be used to detect these kinds of defective blocks. For marginal blocks, a pre-defined criteria for the number of bits that can be ignored during erase verify, which can then be corrected by ECC, can be set for each finger. If the number of fails exceeds this limit, then the loop count delta can be determined. The basis number of pulses for a typical, non-defective block used determining the delta value can be an average, or generalized average, erase loop based on calibration data from multiple wafers: for example, if almost all the dies on a wafer take 10 erase loops, then 10 can be used as the average number.

Figure 53B:
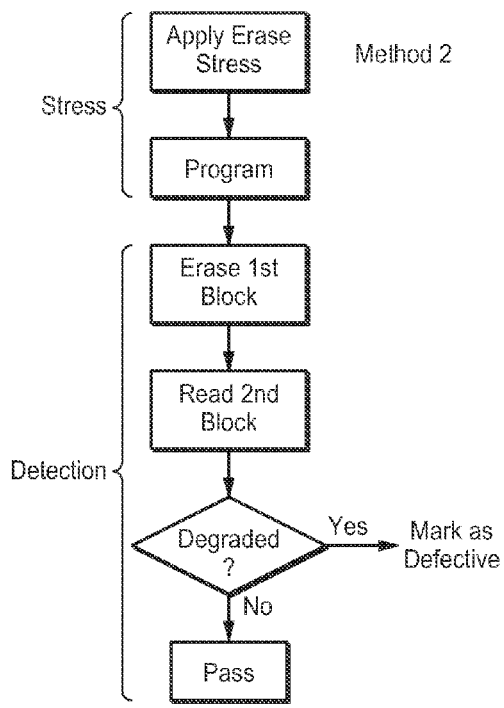

An embodiment for second method to stress and detect for erase disturb is illustrated with respect to claim FIG. 53B and can follow the first method or be used on its own. A erase voltage DC or AC stress with all blocks unselected (such as by having the word lines and select gates left floating, the bit lines floating and driven during erase stress) is performed, such as by applying a high voltage to the p-well or CP-well. The maximum voltage and time to use can be determined as part of device characterization. After the stress is applied, defective blocks' strings will become more resistive. A flash program operation or the programming of a random known multi-state data pattern can then be done on all blocks. For example, block 0 can be erased and block 1 can be read with the same or slightly reduced sense time: if block 1 is defective block then it will have erase disturb issues because of increased string resistance due to post erase stress. If defective, block 1 can then be marked as bad. Block 1 can then be erased and block 2 read and so on, repeating this cycle to find be blocks having LI-adjacent MH spacing issues.

Figure 53C:
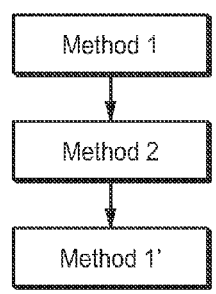

In an exemplary embodiment, the first and second methods can be used to effectively stress and detect various defects as illustrated schematically in FIG. 53C: Apply method 1 for initial abnormal erase loop delta detection; apply method 2 to stress and accelerate the defect; and, optionally, use the first method again (method 1') to further detect any degraded blocks for erase.

Figure 54:
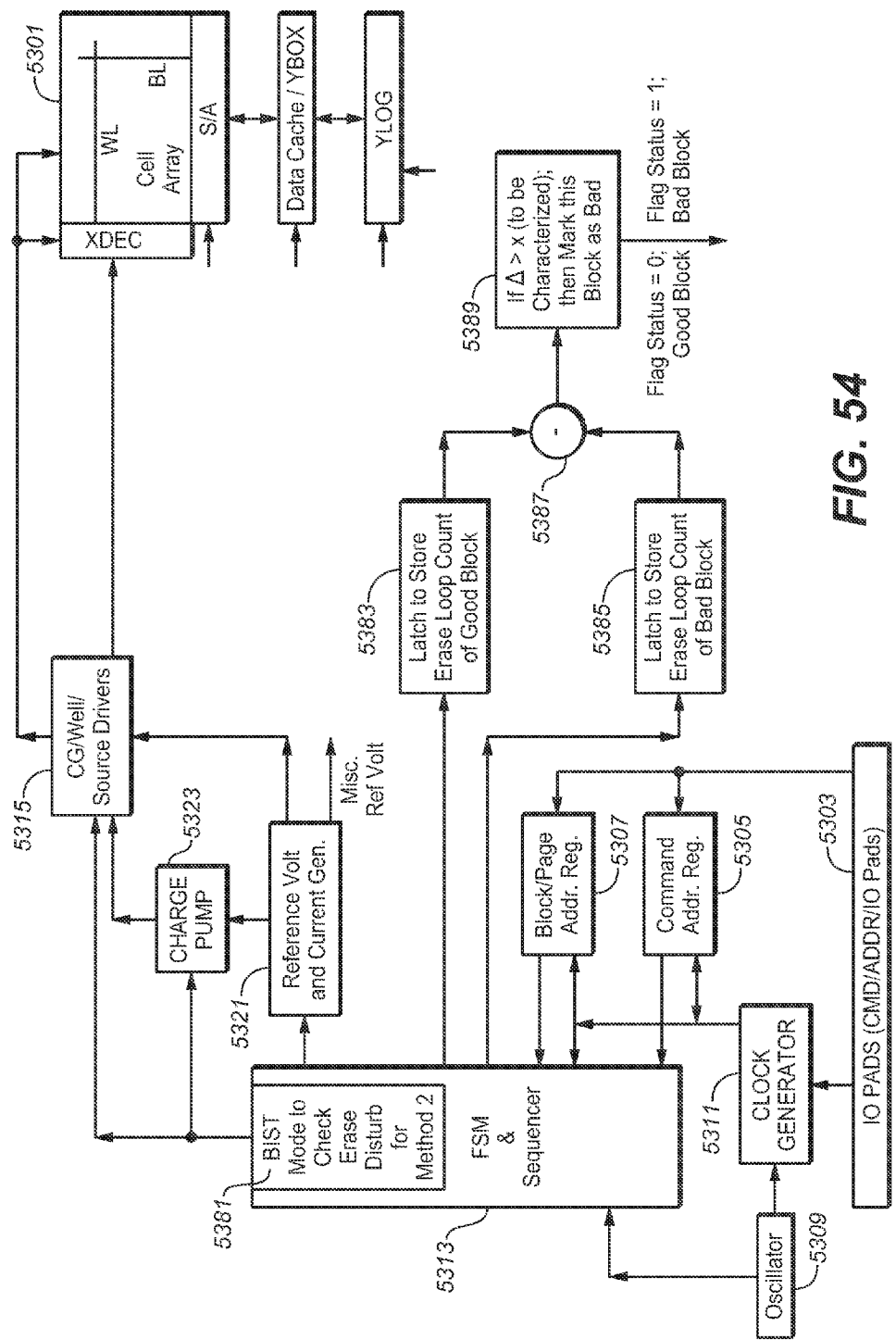
FIG. 54 is a block diagram that highlights some circuitry involved in a delta erase loop count method.

FIG. 54 is a block diagram that highlights some circuitry involved and is similar to, and similarly numbered as, FIG. 44 and other such figures above. The finite state machine (FSM) and Sequencer block 5313 includes a built in self-test mode to check for erase disturb according to the second method. A latch 5383 can store the erase loop count for good blocks and a latch 5385 can store the erase loop count of bad blocks. These latch values can then be compared using 5387 and if the resultant Δ value is greater than x, which can be obtained through device characterization, the block can be marked as bad and a flag set accordingly.

The erase loop delta method can be used to detect various fail modes. One mode is for LI to Adjacent (MH) spacing issues: As explained in above, a Δ erase loop count method can be used to detect bad blocks. Another mode is control gate to substrate shorts of the sort seen in 2D NAND structures: For defects with word line to substrate shorts, the delta erase loop count method will help to predetermine control gate-substrate type failed blocks. A further mode is LI to word line shorts in BiCS type structures: For defects with LI-WL shorts, the Δ erase loop count method will help to predetermine such type failed blocks. Additional modes related to memory hole open issues, such as defects where the memory hole contact with the bit line is resistive or open, as in this case it will take a higher than normal number of erase loops, which can be detected with this method. For slow to erase block detection, the Δ erase loop count method can be used to mark slow to erase blocks. Modes related to select gate defects can also be determined: During erase operation, select gates are typically left to float, but select gate decoder defects can cause select gate voltage discharge during erase pulses and degrade select gate threshold voltages, causing higher erase loops and the A erase loop count method will help to determine such blocks without degrading further.

CONCLUSION

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principles involved and its practical application, to thereby enable others to best utilize the various embodiments and with various modifications as are suited to the particular use contemplated. It is intended that the scope be defined by the claims appended hereto.

It is claimed:

1. A method of determining defects in a non-volatile flash memory circuit, comprising:
   programming memory cells of a first plurality of blocks of an array of the non-volatile flash memory circuit;
   subsequently performing an erase operation on the first plurality of blocks, wherein the erase operation includes an alternating series of erase pulses and erase verify operations;
   maintaining, for each the first plurality of blocks, a count of the number erase pulses required for the corresponding block to verify as erased in the erase operation;
   determining from the counts of a second plurality of blocks from the first plurality of blocks an average erase count;
   performing a first defect determination operation on a first block of the first plurality of blocks, including:
      comparing the count for first block to the average erase count; and
      in response to the count for the first block exceeding the average erase count by a first number of counts, marking the first block as defective; and
   subsequent to the first defect determination operation, performing a stress operation on a group of one or more blocks of the first plurality of blocks, comprising:
      with the group of blocks unselected, applying an erase stress voltage to the group of blocks; and
      subsequently programming the group of blocks; and
   subsequent to the stress operation, performing a second defect determination operation, comprising:
      performing an erase operation on a first block of the group;
      subsequently reading a second, distinct block of the group;
      determining whether the quality of the data as read from the second block is degraded; and
      in response to determining that the data as read from the second block is degraded, marking the second block as defective.

2. The method of claim 1, wherein the first defect determination operation further includes:
   in response to the count for the first block not exceeding the average erase count by the first number of counts, determining whether the count for the first block exceeds the average erase count by a second number of counts, the second number of counts being less than the first number of counts;
   in response to the count for the first block exceeding the average erase count by second number of counts, determining whether the first block had a number failed bits in the verify operation that exceeds a bound; and
   in response to the number of failed bits in the verify operation exceeding the bound, marking the first block as defective.

3. The method of claim 1, wherein the programming memory cells of the first plurality of blocks is performed on a fresh memory circuit.

4. The method of claim 1, wherein a level and duration of the applied erase voltage is determined as part of a device characterization process.

5. The method of claim 1, wherein the second block of the group is physically adjacent to the first block of the second group.

6. The method of claim 1, wherein the group of blocks are formed above a well structure and applying an erase stress voltage to the group of blocks with the group of blocks unselected includes applying an erase voltage to the well structure.

7. The method of claim 6, wherein the group of blocks being unselected includes floating word lines and select gate of the group blocks.

8. The method of claim 1, wherein programming the group of blocks includes writing a known data pattern to the blocks, and
   wherein determining whether the quality of the data as read from the second block is degraded includes comparing the data as read from the second block to the known data pattern.

9. The method of claim 1, wherein determining whether the quality of the data as read from the second block is degraded is based on an error checking and correction (ECC) result.

10. The method of claim 1, wherein the second defect determination operation further comprises:
    subsequently performing an erase operation on the second block of the group;
    subsequently reading a third, distinct block of the group;
    determining whether the quality of the data as read from the third block is degraded; and
    in response to determining that the data as read from the third block is degraded, marking the third block as defective.

11. The method of claim 1, further comprising:
    subsequent to performing the second defect determination operation, performing a further defect determination operation, comprising:
       performing a further programming operation on one or more blocks of the group, erasing the further programmed blocks, determining whether any of the further programmed blocks are defective based upon the number of erase pulses needed to erase.

12. The method of claim 1, wherein the non-volatile memory flash circuit is a monolithic three-dimensional semiconductor memory device where the memory cells are arranged in multiple physical levels above a silicon substrate and comprise a charge storage medium.

13. The method of claim 12, wherein the non-volatile memory flash circuit has a NAND type architecture where the NAND strings run in a vertical direction relative to the substrate, and word lines run in a horizontal direction relative to the substrate.

14. The method of claim 1, wherein the non-volatile memory circuit is a monolithic two-dimensional semiconductor memory device where the memory cells are arranged in a single physical level.

15. The method of claim 1, wherein the method is performed as part of a built in self-test (BIST) process.

16. A method of determining defects in a non-volatile flash memory circuit, comprising:
performing a stress operation on a group of one or more blocks of an array of the non-volatile flash memory circuit, comprising:
with the group of blocks unselected, applying an erase stress voltage to the group of blocks; and
subsequently programming the group of blocks; and
subsequent to the stress operation, performing a first defect determination operation, comprising:
performing an erase operation on a first block of the group;
subsequently reading a second, distinct block of the group;
determining whether the quality of the data as read from the second block is degraded; and
in response to determining that the data as read from the second block is degraded, marking the second block as defective; and
subsequent to the first defect determination operation, performing a second defect determination comprising:
subsequently performing an erase operation on the second block of the group;
subsequently reading a third, distinct block of the group;
determining whether the quality of the data as read from the third block is degraded; and
in response to determining that the data as read from the third block is degraded, marking the third block as defective.

17. The method of claim 16, wherein a level and duration of the applied erase voltage is determined as part of a device characterization process.

18. The method of claim 16, wherein the second block of the group is physically adjacent to the first block of the second group.

19. The method of claim 16, wherein the group of blocks are formed above a well structure and applying an erase stress voltage to the group of blocks with the group of blocks unselected includes applying an erase voltage to the well structure.

20. The method of claim 19, wherein the group of blocks being unselected includes floating word lines and select gate of the group blocks.

21. The method of claim 16, wherein programming the group of blocks includes writing a known data pattern to the blocks, and
wherein determining whether the quality of the data as read from the second block is degraded includes comparing the data as read from the second block to the known data pattern.

22. The method of claim 16, wherein determining whether the quality of the data as read from the second block is degraded is based on an error checking and correction (ECC) result.

23. The method of claim 16, wherein the non-volatile memory flash circuit is a monolithic three-dimensional semiconductor memory device where the memory cells are arranged in multiple physical levels above a silicon substrate and comprise a charge storage medium.

24. The method of claim 23, wherein the non-volatile memory flash circuit has a NAND type architecture where the NAND strings run in a vertical direction relative to the substrate, and word lines run in a horizontal direction relative to the substrate.

25. The method of claim 16, wherein the non-volatile memory circuit is a monolithic two-dimensional semiconductor memory device where the memory cells are arranged in a single physical level.

26. The method of claim 16, wherein the method is performed as part of a built in self-test (BIST) process.

* * * * *